US006542391B2

(12) United States Patent
Pereira et al.

(10) Patent No.: US 6,542,391 B2
(45) Date of Patent: Apr. 1, 2003

(54) CONTENT ADDRESSABLE MEMORY WITH CONFIGURABLE CLASS-BASED STORAGE PARTITION

(75) Inventors: Jose P. Pereira, Cupertino, CA (US); Varadarajan Srinivasan, Los Altos Hills, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/940,832

(22) Filed: Aug. 27, 2001

(65) Prior Publication Data

US 2002/0075714 A1 Jun. 20, 2002

Related U.S. Application Data

(63) Continuation-in-part of application No. 09/590,642, filed on Jun. 8, 2000, now Pat. No. 6,324,087, and a continuation-in-part of application No. 09/590,428, filed on Jun. 8, 2000, and a continuation-in-part of application No. 09/590,775, filed on Jun. 8, 2000, and a continuation-in-part of application No. 09/594,206, filed on Jun. 14, 2000, and a continuation-in-part of application No. 09/594,209, filed on Jun. 14, 2000, and a continuation-in-part of application No. 09/594,201, filed on Jun. 14, 2000, and a continuation-in-part of application No. 09/594,194, filed on Jun. 14, 2000, and a continuation-in-part of application No. 09/594,202, filed on Jun. 14, 2000.

(51) Int. Cl.[7] .............................................. G11C 15/00
(52) U.S. Cl. ................ 365/49; 365/189.07; 365/230.03
(58) Field of Search ............................... 365/49, 189.07, 365/230.01, 230.06, 230.03

(56) References Cited

U.S. PATENT DOCUMENTS 3,257,646 A  6/1966  Roth
3,353,159 A  11/1967  Lee, III (List continued on next page.)

FOREIGN PATENT DOCUMENTS

| EP | 0 381 249 A2 | 8/1990 |
|---|---|---|
| EP | 0 622 805 A1 | 11/1994 |
| EP | 0774758 A2 | 5/1997 |
| EP | 0858077 A2 | 8/1998 |
| EP | 0 872 802 A2 | 10/1998 |
| EP | 0918335 A2 | 5/1999 |
| EP | 1063827 A2 | 12/2000 |
| EP | 1096504 A1 | 5/2001 |
| JP | 07-021785 | 1/1995 |
| JP | 08-273376 | 10/1996 |
| JP | 11-102589 | 4/1999 |
| WO | WO 01/11630 A1 | 2/2001 |

OTHER PUBLICATIONS

Ken Schultz and Andrew Sorowka, "High–Performance CAMs for 10 GB/S and Beyond," Gibabit Ethernet Conference (GEC 2000), Mar. 27, 2000, pp. 147–154.

S. Deering and R. Hinden, "Internet Protocol, Version 6 (IPv6) Specification," Network Working Group, Request for Comments: 2460, Dec. 1998, pp. 1–39.

"LN17020 Search Engine, Version 2.0," Lara Networks, Inc., pp. 1–129 downloaded Apr. 5, 2001 from URL http://www.st.com.

"LN17040 Search Engine, Version 1.1," Lara Networks, Inc., pp. 1–142 downloaded Mar. 27, 2001 from URL http://www.laranetworks.com.

(List continued on next page.)

*Primary Examiner*—Huan Hoang
*Assistant Examiner*—Thong Le
(74) *Attorney, Agent, or Firm*—Shemwell Gregory & Courtney LLP

(57) ABSTRACT

A content addressable memory (CAM) device having a plurality of CAM blocks and a block selection circuit. Each of the CAM blocks includes an array of CAM cells to store data words having a width determined according to a configuration value. The block selection circuit includes an input to receive a class code and circuitry to output a plurality of select signals to the plurality of CAM blocks. Each of the select signals selectively disables a respective one of the plurality of CAM blocks from participating in a compare operation according to whether the class code matches a class assignment of the CAM block.

82 Claims, 57 Drawing Sheets

U.S. PATENT DOCUMENTS

| | | |
|---|---|---|
| 3,675,211 A | 7/1972 | Raviv |
| 4,159,538 A | 6/1979 | Motsch |
| 4,244,033 A | 1/1981 | Hattori |
| 4,575,818 A | 3/1986 | Almy et al. |
| 4,622,653 A | 11/1986 | McElroy |
| 4,656,626 A | 4/1987 | Yudichak et al. |
| 4,670,858 A | 6/1987 | Almy |
| 4,845,668 A | 7/1989 | Sano et al. |
| 4,928,260 A | 5/1990 | Chuang et al. |
| 4,958,377 A | 9/1990 | Takahashi |
| 4,996,666 A | 2/1991 | Duluk, Jr. |
| 5,053,991 A | 10/1991 | Burrows |
| 5,072,422 A | 12/1991 | Rachels |
| 5,123,105 A | 6/1992 | Wyland et al. |
| 5,319,589 A | 6/1994 | Yamagata et al. |
| 5,325,501 A | 6/1994 | Carlstedt |
| 5,383,146 A | 1/1995 | Threewitt |
| 5,394,353 A | 2/1995 | Nusinov et al. |
| 5,440,715 A | 8/1995 | Wyland |
| 5,444,649 A | 8/1995 | Nemirovsky |
| 5,483,480 A | 1/1996 | Yoneda |
| 5,485,418 A | 1/1996 | Hiraki et al. |
| 5,555,397 A | 9/1996 | Sasama et al. |
| 5,576,985 A | 11/1996 | Holtz |
| 5,642,322 A | 6/1997 | Yoneda |
| 5,649,149 A | 7/1997 | Stormon et al. |
| 5,706,224 A | 1/1998 | Srinivasan et al. |
| 5,787,458 A | 7/1998 | Miwa |
| 5,818,786 A | 10/1998 | Yoneda |
| 5,860,085 A | 1/1999 | Stormon et al. |
| 5,870,324 A | 2/1999 | Helwig et al. |
| 5,920,886 A | 7/1999 | Feldmeir |
| 5,930,790 A | 7/1999 | Law et al. |
| 5,943,252 A | 8/1999 | Schultz et al. |
| 5,946,704 A | 8/1999 | Yoneda et al. |
| 5,999,435 A * | 12/1999 | Henderson et al. .... 365/189.07 |
| 6,000,008 A | 12/1999 | Simcoe |
| 6,006,306 A | 12/1999 | Haywood et al. |
| 6,011,795 A | 1/2000 | Varghese et al. |
| 6,044,005 A | 3/2000 | Gibson et al. |
| 6,081,440 A | 6/2000 | Wasburn et al. |
| 6,081,441 A | 6/2000 | Ikeda |
| 6,081,442 A | 6/2000 | Igarashi et al. |
| 6,098,147 A | 8/2000 | Mizuhara |
| 6,144,574 A | 11/2000 | Kobayashi |
| 6,147,890 A | 11/2000 | Kawana et al. |
| 6,161,144 A | 12/2000 | Michels et al. |
| 6,166,938 A | 12/2000 | Wong |
| 6,175,514 B1 | 1/2001 | Henderson et al. |
| 6,181,698 B1 | 1/2001 | Hariguchi |
| 6,237,061 B1 | 3/2001 | Srinivasan et al. |
| 6,243,281 B1 * | 6/2001 | Pereira ............... 365/230.03 |
| 6,252,789 B1 | 6/2001 | Pereira et al. |
| 6,253,280 B1 | 6/2001 | Voelkel |
| 6,289,414 B1 | 9/2001 | Feldmeier et al. |

* cited by examiner

| CONFIG | CONFIG SIGNAL | ADDR | RA | SA | SDA |
|---|---|---|---|---|---|
| 4K x 72 | SZ1 | A11-A0 | A11-A2 | A1-A0 | A1-A0 |
| 2K x 144 | SZG1 | A10-A0 | A10-A1 | A0 | A0, SSEL0 |
| 1K x 288 | SZGZ | A9-A0 | A9-A0 | — | SSEL1-SSEL0 |

FIG. 16

| CONFIG | A1 | A0 | SSEL1 | SSEL0 | SEN4 | SEN3 | SEN2 | SEN1 |
|---|---|---|---|---|---|---|---|---|
| 4k x 72 | 0 | 0 | X | X | 0 | 0 | 0 | 1 |
| 4k x 72 | 0 | 1 | X | X | 0 | 0 | 1 | 0 |
| 4k x 72 | 1 | 0 | X | X | 0 | 1 | 0 | 0 |
| 4k x 72 | 1 | 1 | X | X | 1 | 0 | 0 | 0 |
| 2k x 144 | X | 0 | X | 0 | 0 | 0 | 0 | 1 |
| 2k x 144 | X | 0 | X | 1 | 0 | 0 | 1 | 0 |
| 2k x 144 | X | 1 | X | 0 | 0 | 1 | 0 | 0 |
| 2k x 144 | X | 1 | X | 1 | 1 | 0 | 0 | 0 |
| 1k x 288 | X | X | 0 | 0 | 0 | 0 | 0 | 1 |
| 1k x 288 | X | X | 0 | 1 | 0 | 0 | 1 | 0 |
| 1k x 288 | X | X | 1 | 0 | 0 | 1 | 0 | 0 |
| 1k x 288 | X | X | 1 | 1 | 1 | 0 | 0 | 0 |

FIG. 17

| CONFIG | CSSEL1 | CSSEL0 | CEN1 | CEN2 | CEN3 | CEN4 |
|---|---|---|---|---|---|---|
| 4k x 72 | X | X | 1 | 1 | 1 | 1 |
| 2k x 144 | X | 0 | 1 | 0 | 1 | 0 |
| 2k x 144 | X | 1 | 0 | 1 | 0 | 1 |
| 1k x 288 | 0 | 0 | 1 | 0 | 0 | 0 |
| 1k x 288 | 0 | 1 | 0 | 1 | 0 | 0 |
| 1k x 288 | 1 | 0 | 0 | 0 | 1 | 0 |
| 1k x 288 | 1 | 1 | 0 | 0 | 0 | 1 |

FIG. 23

| M1 | M2 | M3 | M4 | ADDR | PSAO(1) | PSAO(0) |
|---|---|---|---|---|---|---|
| 0 | 0 | 0 | 0 | X | X | X |
| 0 | 0 | 0 | 1 | 3 | 1 | 1 |
| 0 | 0 | 1 | 0 | 2 | 1 | 0 |
| 0 | 0 | 1 | 1 | 2 | 1 | 0 |
| 0 | 1 | 0 | 0 | 1 | 0 | 1 |
| 0 | 1 | 0 | 1 | 1 | 0 | 1 |
| 0 | 1 | 1 | 0 | 1 | 0 | 1 |
| 0 | 1 | 1 | 1 | 1 | 0 | 1 |
| 1 | 0 | 0 | 0 | 0 | 0 | 0 |
| 1 | 0 | 0 | 1 | 0 | 0 | 0 |
| 1 | 0 | 1 | 0 | 0 | 0 | 0 |
| 1 | 0 | 1 | 1 | 0 | 0 | 0 |
| 1 | 1 | 0 | 0 | 0 | 0 | 0 |
| 1 | 1 | 0 | 1 | 0 | 0 | 0 |
| 1 | 1 | 1 | 0 | 0 | 0 | 0 |
| 1 | 1 | 1 | 1 | 0 | 0 | 0 |

| M1 | M2 | M3 | M4 | ADDR | PSAO(1) | PSAO(0) |
|----|----|----|----|------|---------|---------|
| 0  | 0  | 0  | 0  | X    | X       | X       |
| 0  | 0  | 0  | 1  | 0    | X       | X       |
| 0  | 0  | 1  | 1  | 0    | X       | X       |
| 0  | 0  | 1  | 1  | 1    | 1       | X       |
| 0  | 1  | 0  | 0  | 0    | X       | X       |
| 0  | 1  | 1  | 1  | 0    | X       | X       |
| 0  | 1  | 1  | 1  | 0    | X       | X       |
| 0  | 1  | 1  | 1  | 1    | 1       | X       |
| 1  | 0  | 0  | 0  | 0    | X       | X       |
| 1  | 0  | 0  | 1  | 0    | X       | X       |
| 1  | 0  | 1  | 1  | 0    | X       | X       |
| 1  | 0  | 1  | 1  | 1    | 1       | 0       |
| 1  | 1  | 0  | 0  | 0    | 0       | X       |
| 1  | 1  | 0  | 1  | 0    | 0       | X       |
| 1  | 1  | 1  | 1  | 0    | 0       | X       |
| 1  | 1  | 1  | 1  | 0    | 0       | X       |
FIG. 49
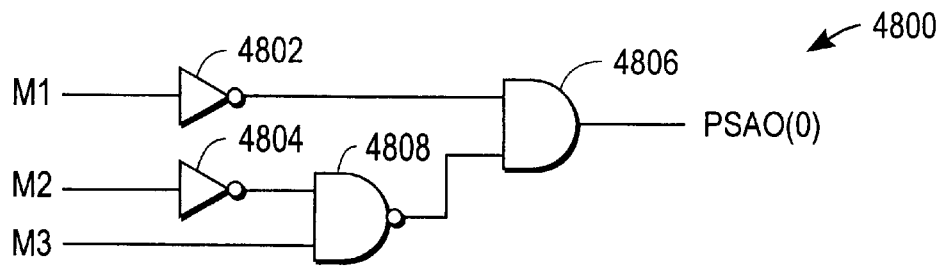
FIG. 50
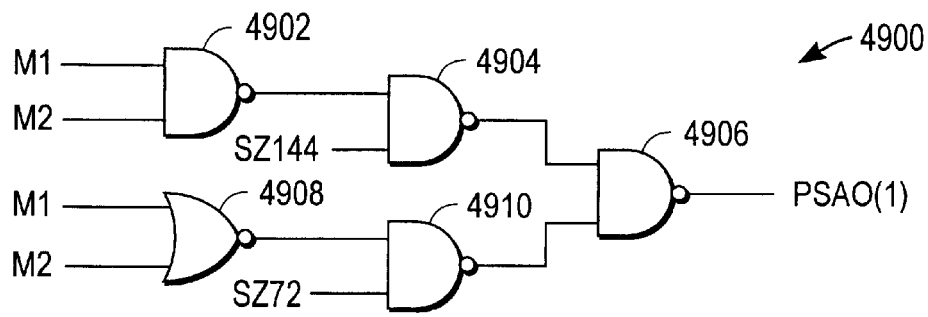
FIG. 51

| Configuration | PE Inputs |
|---|---|
| $ZY \times W$ | Set to M1-MZ for Corresponding Rows |
| $\frac{ZY}{2} \times 2W$ | Set Every 2nd PE Input to the Corresponding First Group Match Results; Set All Other PE Inputs to Mismatch |
| $\frac{ZY}{4} \times 4W$ | Set Every 4th PE Input to the Corresponding Second Group Match Results; Set All Other PE Inputs to Mismatch |
| ⋮ | ⋮ |
| $\frac{ZY}{(z-1)} \times (z-1)W$ | Set Every (z-1) PE Input to the Corresponding (z-1) Group Match Results; Set All Other PE Inputs to Mismatch |
| $Y \times ZW$ | Set Every Zth PE Input to the Corresponding Row Group Match Results; Set All Other PE Inputs to Mismatch |

FIG. 56

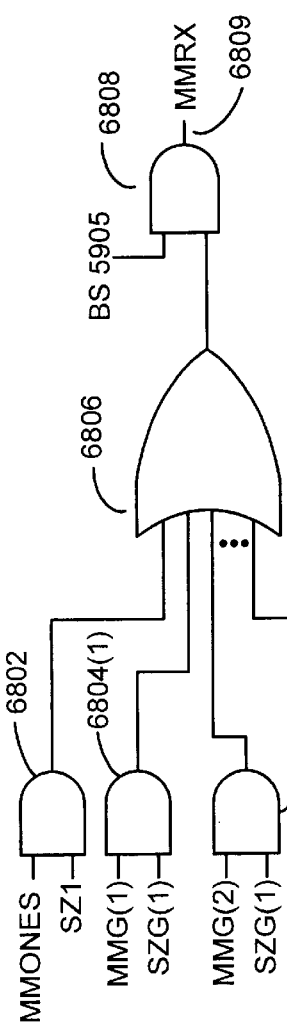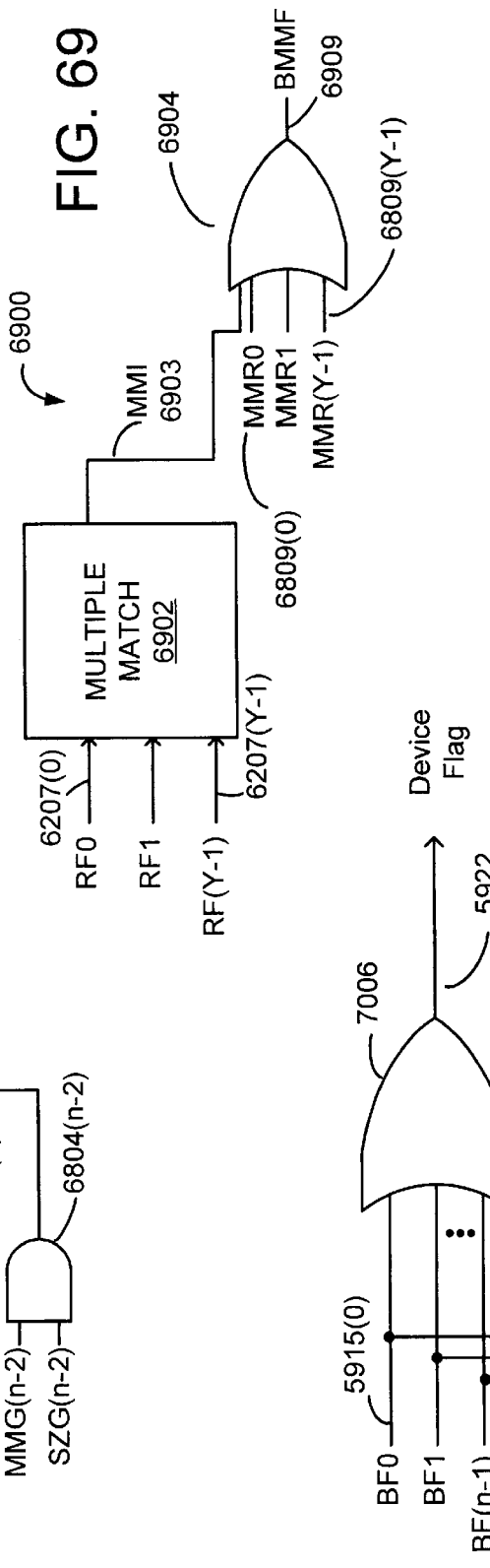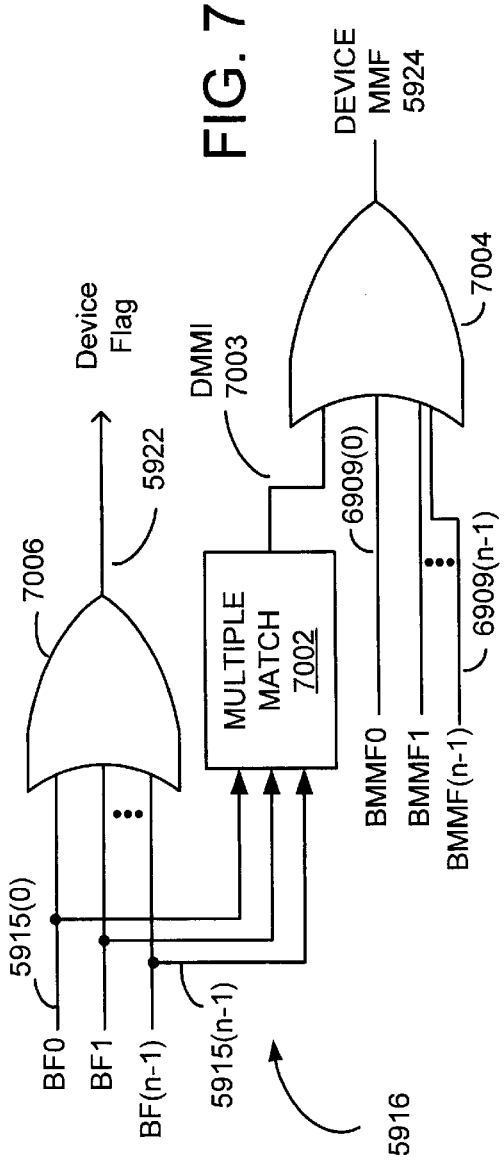
FIG. 68
FIG. 69
FIG. 70

CONTENT ADDRESSABLE MEMORY WITH CONFIGURABLE CLASS-BASED STORAGE PARTITION

CROSS-REFERENCE TO RELATED APPLICATIONS

This application is a continuation-in-part of each of the following U.S. patent applications: application Ser. No. 09/590,642, filed Jun. 8, 2000; now U.S. Pat. No. 6,324,087 application Ser. No. 09/590,428 filed Jun. 8, 2000; application Ser. No. 09/590,775 filed Jun. 8, 2000; application Ser. No. 09/594,206, filed Jun. 14, 2000; application Ser. No. 09/594,209, filed Jun. 14, 2000; application Ser. No. 09/594,201, filed Jun. 14, 2000; application Ser. No. 09/594,194, filed Jun. 14, 2000; and application Ser. No. 09/594,202, filed Jun. 14, 2000. Each of the above-identified applications are hereby incorporated by reference in their entirety.

FIELD OF INVENTION

This invention relates generally to semiconductor memories and more particularly to content addressable memories.

BACKGROUND

Content addressable memories (CAMs) are frequently used for address look-up functions in Internet data routing. For example, routers used by local Internet Service Providers (ISPs) typically include one or more CAMs for storing a plurality of Internet addresses and associated data such as, for instance, corresponding address routing information. When data is routed to a destination address, the destination address is compared with all CAM words, e.g., Internet addresses, stored in the CAM array. If there is a match, routing information corresponding to the matching CAM word is output and thereafter used to route the data.

A CAM device includes a CAM array having a plurality of memory cells arranged in an array of rows and columns. Each memory cell stores a single bit of digital information, i.e., either logic zero or logic one. The bits stored within a row of memory cells constitute a CAM word. During compare operations, a comparand word is received at appropriate input terminals of a CAM device and driven into the CAM array using comparand lines to be compared with all the CAM words in the device. For each CAM word that matches the comparand word, a corresponding match line signal is asserted to indicate a match condition. If the comparand word matches more than one of the CAM words, the match line corresponding to each of the matching CAM words is asserted, and a "multiple match" flag is also asserted to indicate the multiple match condition. The match line signals from each CAM block are combined in a priority encoder to determine the address of the highest-priority matching CAM word, i.e., the CAM index. Associative information corresponding to the CAM index stored in, for instance, an associated RAM, may also be provided.

A single CAM device can be used to store multiple tables each storing and maintaining different classes of data. All entries, however, typically participate in a compare operation. This can cause an undesirable amount of power to be drawn during the compare operation. It would be desirable to limit a search to only those entries associated with a particular class of data to reduce power consumption during the operation.

In a typical CAM device, the width of the data word is fixed according to the number of memory cells per row of the CAM array. U.S. Pat. No. 5,440,715 describes a technique for expanding the width of the data words beyond that of a single row of CAM cells. This inter-row configurability provides flexibility in the use of the single CAM array to store data words larger than that available in a single addressable row of CAM cells.

It would be desirable to have a CAM system that includes intra-row configurability to provide additional flexibility in the use of a single CAM array to be used in multiple array configurations. Intra-row configurability is the ability to access and operate upon one or more segments of rows of CAM cells.

SUMMARY

A method and apparatus are disclosed that may be used to partition a CAM device having a plurality of CAM blocks into a number of individually searchable partitions, where each partition may include one or more CAM blocks of the CAM device. In accordance with one embodiment of the present invention, each CAM block is connected to a block select circuit that stores a class code indicating what class or type of data is stored in the block. The same class code may be stored in any number of the block select circuits to define a partition as including the corresponding number of CAM blocks. During compare operations between a comparand word and data stored in the CAM device, a search code is provided to the block select circuits. Each block select circuit compares the search code with its class code and, in response thereto, selectively enables or disables the corresponding CAM block for the compare operation. In some embodiments, the block select circuit enables the corresponding CAM block if the search class matches the class code and, conversely, disables the corresponding CAM block if the search code does not match the class code.

In one embodiment, the block select circuit disables a corresponding CAM block by driving the comparand lines of the CAM block to a predetermined state to preclude the comparand word from being driven onto the comparand lines during the compare operation. By driving the comparand word only on the comparand lines of the selected (i.e., enabled) CAM blocks during the compare operation, present embodiments not only allow for selective searching across CAM blocks according to class codes, but also reduce power consumption in un-selected (i.e., disabled) CAM blocks during such selective compare operations.

A CAM system having intra-row configurability is also disclosed. For one embodiment, the CAM system includes a CAM array having a number of rows of CAM cells each segmented into row segments. Each row segment includes a number of CAM cells coupled to a corresponding match line segment. Individual row segments or groups of row segments are uniquely addressable by address logic in response to configuration information that indicates a width and depth configuration of the CAM array. The configuration information may be stored in a configuration register. Data may be communicated with an addressed row segment or group of row segments using data access circuitry. Priority encoding circuitry may be included to generate the address of a row segment or group of row segments that stores data matching comparand data in response to the configuration information. Match flag logic may also be included to determine when comparand data matches data stored in one of the row segments or one of the groups of row segments in response to the configuration information. Additionally, multiple match flag logic may be included to determine when comparand data matches data stored in each of a plurality of row segments and to determine when comparand data matches data stored in each of a plurality of groups of row segments in response to the configuration information.

In one embodiment, a CAM system includes multiple CAM blocks each having an associated block select circuit. Each of the CAM blocks is configurable to store data words having a width determined according to a configuration value and is responsive to a block select signal from the associated block select circuit to either participate or not participate in a compare operation. Each select block select circuit compares an input class code with a stored value and either asserts or deasserts the block select signal for the associated CAM block according to the comparison result.

These and other embodiments, features and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which:

FIG. 16 is one embodiment of a truth table for the select logic of FIG. 15;

FIG. 17 is one embodiment of a truth table for the segment decoder of FIG. 15;

FIG. 23 is one embodiment of a truth table for the select logic of FIG. 22;

FIG. 49 is another embodiment of a truth table for another operating configuration for the row priority encoder circuit of FIG. 47;

FIG. 50 is a logic diagram of one embodiment of the row priority encoder circuit of FIG. 47 for generating one segment address bit;

FIG. 51 is a logic diagram of one embodiment of the row priority encoder circuit of FIG. 47 for generating another segment address bit;

FIG. 56 is a table summarizing the function of the priority encoder interface circuits of FIG. 54;

FIG. 68 shows an alternative implementation of the row multiple match configuration logic of FIG. 39;

FIG. 69 illustrates an embodiment of a block multiple match circuit;

FIG. 70 illustrates an embodiment of a global flag circuit of FIG. 59;

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. In addition, the logic levels assigned to various signals in the description below are arbitrary, and therefore may be modified (e.g., reversed polarity) as desired.

Embodiments of the present invention are discussed below in the context of a CAM device 100 for simplicity only. It is to be understood that embodiments of the present invention are equally applicable to CAM structures having other configurations of any suitable type of CAM cells. Further, architectural configurations of the present invention may be implemented in other types of memory blocks such as, for instance, RAM, Flash, and EEPROM. Accordingly, the present invention is not to be construed as limited to specific examples described herein but rather includes within its scope all embodiments defined by the appended claims.

CAM Device with Class-Based Partition

Figure 1:
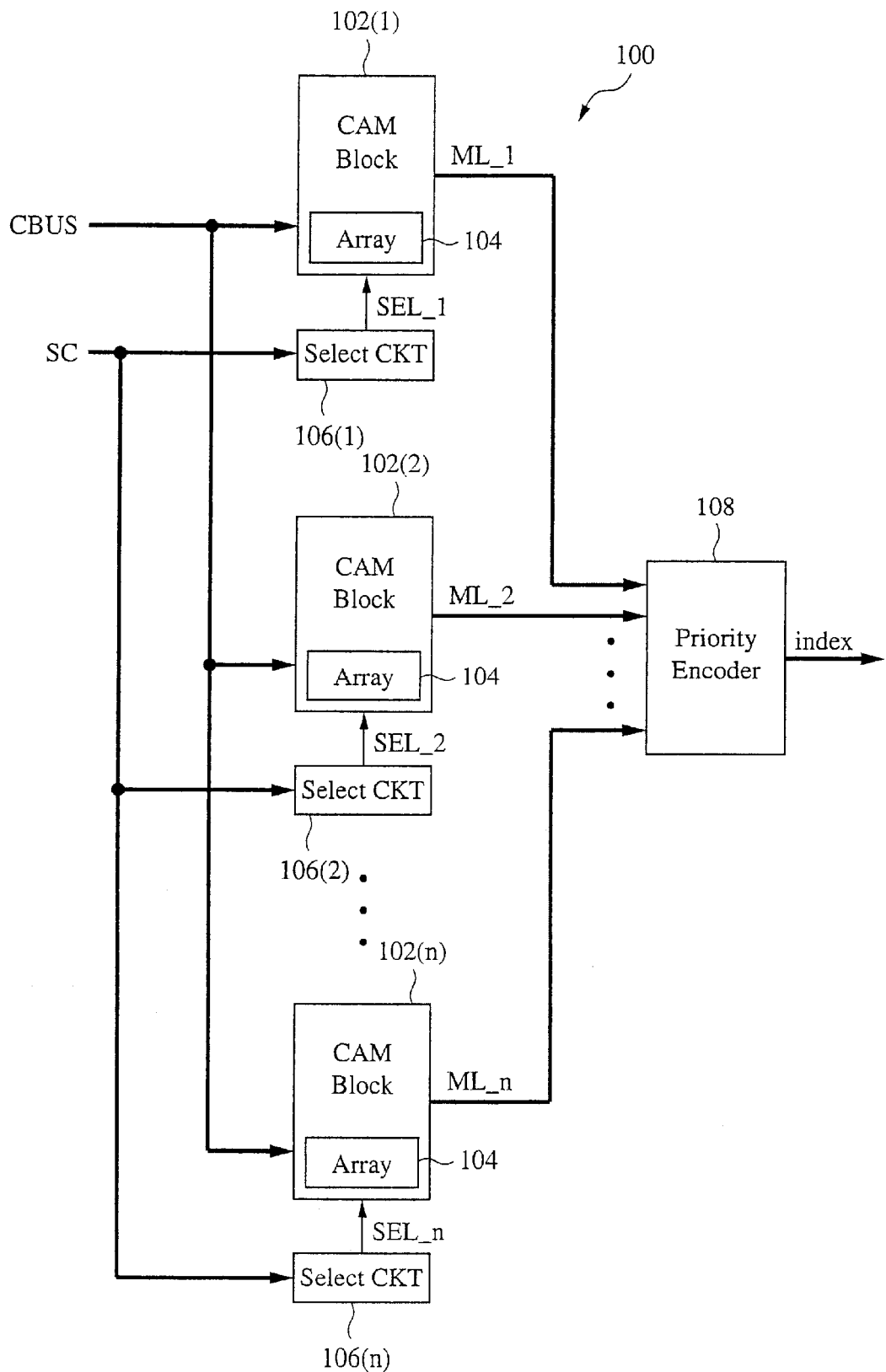
FIG. 1 is a block diagram of a CAM device including a plurality of CAM blocks in accordance with one embodiment of the present invention.

FIG. 1 shows a CAM device 100 in accordance with one embodiment of the present invention as having a number n of CAM blocks 102(1)-102(n), a corresponding number n of block select circuits 106(1)-106(n), and a priority encoder 108. Each CAM block 102 includes a CAM array 104 having a plurality of rows of CAM cells for storing a plurality of CAM words therein, and is connected to a corresponding block select circuit 106. Each row may also include one or more valid bits indicative of whether a valid CAM word is stored in the row. The valid bits may be used in a well-known manner to generate a full flag for the CAM block 102. CAM blocks 102 may be any suitable type of CAM block, including for example, synchronous, asynchronous, binary, and ternary CAMs. Further, each CAM block 102 may be any suitable size, and in some embodiments may be of different sizes. In one embodiment, each CAM block 102 includes 1k (1024) rows of CAM cells.

During a compare operation, each CAM block 102 receives comparand data from a comparand bus CBUS. Other signals provided to the CAM device 100 during the compare operation may be a clock signal CLK, one or more instructions from an instruction decoder (not shown for simplicity), and other control signals. In some embodiments, instructions and comparand data may be provided to the CAM blocks 102(1)-102(n) via the same bus. Other well-known signals which may be provided to the CAM blocks 102, such as word enable signals, reset signals, and enable signals, are not shown for simplicity.

Each CAM block 102 provides a plurality of match line signals to the priority encoder 108 via corresponding match lines ML. The match lines carry match signals indicative of match conditions in the CAM arrays 104. For simplicity, the plurality of match lines ML from each CAM block 102 are represented collectively in FIG. 1. The priority encoder 108 generates an index corresponding to one of the matching CAM words in the device 100. In one embodiment, the priority encoder 108 outputs the index of the highest priority match. The highest priority match may be the lowest numbered address, the highest numbered address, or any other selected address.

For purposes of discussion herein, the first CAM block 102(1) in the device 100 is designated as the highest priority block, the second CAM block 102(2) is designated as the next highest priority block, and so on, and the last CAM block 102(n) is designated as the lowest priority block, although in actual embodiments priority may be reversed or otherwise modified. Thus, the highest priority CAM block 102(1) may include the lowest CAM addresses (i.e., CAM addresses 0 to k−1), the next highest priority block 102(2) may include the next lowest CAM addresses (i.e., CAM addresses k to 2k−1), and so on, and the lowest priority CAM block 102(n) may include the highest CAM addresses (i.e., CAM addresses (n−1)k to nk−1).

The block select circuits 106(1)-106(n) control whether corresponding CAM blocks 102(1)-102(n), respectively, participate in compare operations. Each block select circuit 106 stores a class code for the corresponding CAM block 102 which may be used to selectively disable the CAM block from participating in, and therefore from affecting the results of, one or more compare operations. During a compare operation, a comparand word is provided to the CAM blocks 102 via CBUS, and a search code is provided to the block select circuits 106(1)-106(n) via bus SC. In alternate embodiments, the search code may be provided as part of the comparand word, in which case the CBUS is connected to the block select circuits 106, or may be provided as part of a compare instruction. Each block select circuit 106 compares the received search code with its stored class code, and in response thereto, selectively disables the corresponding CAM block 102 from participating in the compare operation via a select signal SEL. In one embodiment, the block select circuit 106 enables its corresponding CAM block 102 to participate in the compare operation if the class code matches the search code and, conversely, disables the corresponding CAM block 102 if the class code does not match the search code. In alternate embodiments, more than one CAM block 102 may share the same block select circuit 106.

The class codes assigned to the CAM blocks 102 may be used to partition the device 100 into individually selectable partitions of one or more CAM blocks 102. For example, in one embodiment, data stored in the first CAM block 102(1) may be assigned to a first class by storing a first class code in block select circuit 106(1), data stored in the second CAM block 102(2) may be assigned to a second class by storing a second class code in block select circuit 106(2), and data stored in the remaining CAM blocks 102(3)-102(n) may be assigned to a third class by storing a third class code in block select circuits 106(3)-106(n). Then, for example, data stored in the first CAM block 102(1) may be selected for searching by setting the search code to match the first class code stored in the block select circuit 106(1).

When the search code matches the first class code, the block select circuit 106(1) enables the first CAM block 102(1) to compare the comparand word with its stored data corresponding to the first class code. If the search code does not match the second and third class codes, the remaining block select circuits 106(2)-106(n) disable the corresponding, unselected CAM blocks 102(2)-102(n). When disabled, the unselected CAM blocks 102(2)-102(n) do not drive the comparand word into their respective CAM arrays 104 for the compare operation, thereby precluding comparison with unselected data corresponding to the second and third class codes.

In this manner, the CAM blocks 102(1)-102(n) may be selectively searched according to class assignments, thereby allowing for a dynamically partition-able CAM device 100.

Since the comparand word is not compared with data stored in the disabled CAM blocks 102(2)-102(n), the disabled CAM blocks 102(2)-102(n) consume much less power during the compare operation than does the selected, enabled CAM block 102(1). In this manner, the class codes of present embodiments not only restrict compare operations to data in the selected CAM block(s), but also minimize power consumption of the unselected CAM block(s) during compare operations. The advantage of reduced power consumption in unselected CAM blocks during compare operations achieved by present embodiments may be particularly useful in applications where power consumption is a concern.

The ability to selectively enable or disable one or more CAM blocks from participating in compare operations may be especially useful for combining routing look-up functions for different classes of networks in a single device 100. For example, in one embodiment, routing information for a first virtual private network (VPN) may be stored in a first CAM block 102(1), routing information for a second VPN may be stored in a second CAM block 102(2), routing information for a web search may be stored in a third block 102(3), and routing information for a local area network (LAN) may be stored in a fourth CAM block 102(4). Four unique class codes may be stored in corresponding block select circuits 106. Of course, more than one CAM block may be assigned to a particular network by storing the appropriate class code in more than block select circuit 106. During compare operations, comparand data corresponding to routing functions of one of these four networks may be exclusively compared with data stored in the corresponding CAM block(s) by simply setting the search code to match the appropriate class code. In some embodiments, an associative RAM may be partitioned into four partitions corresponding with the four class-defined partitions in the CAM device 100.

Figure 2:
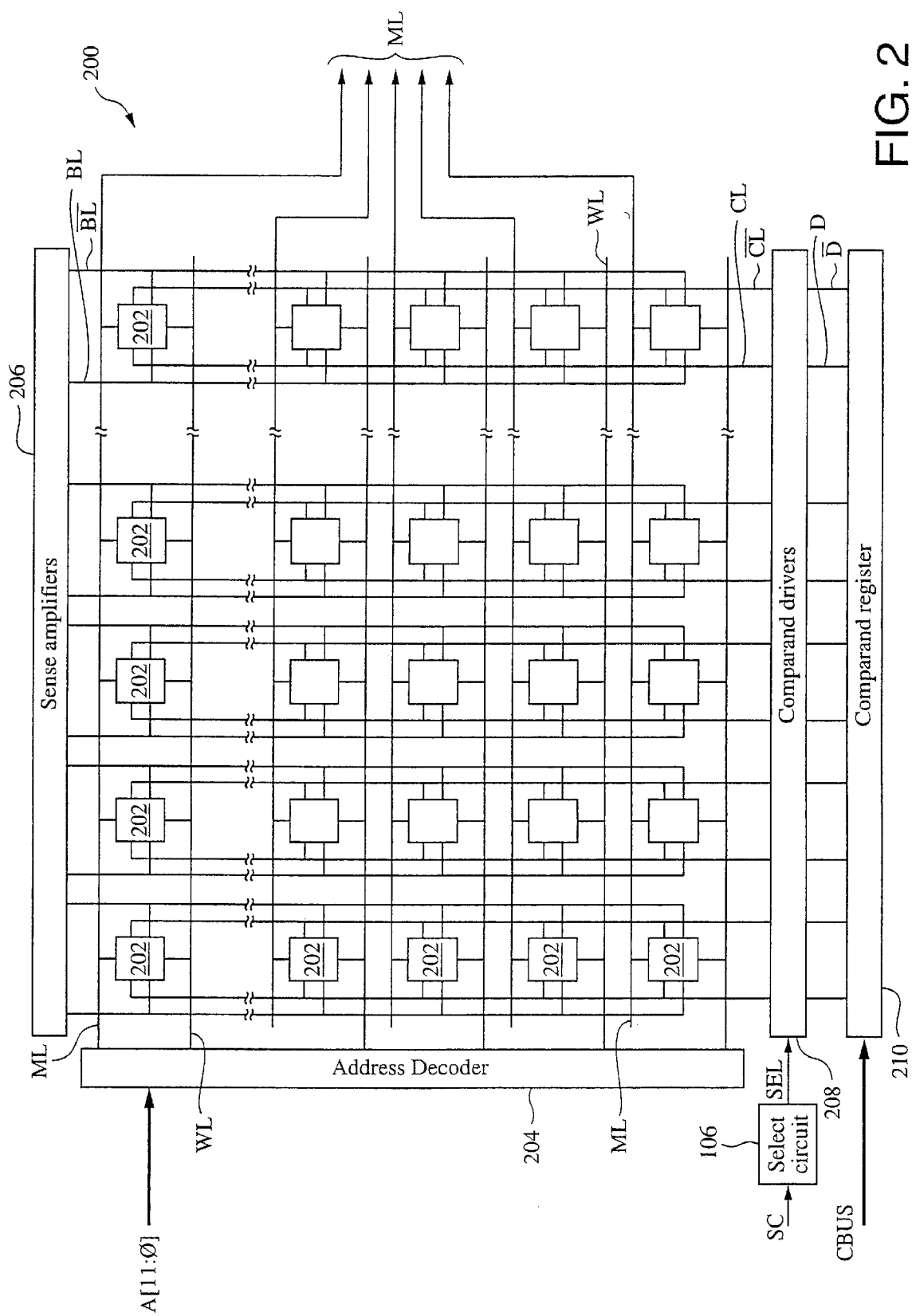
FIG. 2 is a block diagram of a CAM block in one embodiment of the array of FIG. 1.

FIG. 2 shows a CAM array 200 that is one embodiment of a CAM array 104 of FIG. 1. The array 200 includes a plurality of CAM cells 202 organized in any number of rows and columns. Each row of CAM cells 202 is coupled to a match line ML and a word line WL. Each word line WL is driven by an address decoder 204 to select one or more of CAM cells 202 for writing or reading. For alternative embodiments, multiple CAM blocks may share a decoder. Each match line ML provides the match results of a compare operation to the priority encoder 108 (see also FIG. 1). A match line ML indicates a match condition for the row only if all CAM cells 202 in that row match the comparand data. Each CAM cell 202 may be a binary, ternary, SRAM-based or DRAM-based CAM cell. In some embodiments, the match line ML is pre-charged for the compare operation. If any CAM cell 202 in the row does not match the comparand data, the CAM cell(s) 202 discharges the match line ML toward ground potential (e.g., logic low). Conversely, if all CAM cells 202 match the comparand data, the match line ML remains in a charged state (e.g., logic high). When the CAM block 102 is disabled in response to the select signal SEL, the comparand word is not driven into the array 200, and the match lines ML may remain in their charged state during the compare operation, regardless of whether Each column of CAM cells 202 is coupled to a bit line BL, a complementary bit line $\overline{BL}$, a comparand line CL, and a complementary comparand line $\overline{CL}$. The bit lines BL and $\overline{BL}$ are coupled to sense amplifiers 206 that may enable data to be written to or read from a row of CAM cells 202. The comparand lines CL and $\overline{CL}$ are coupled to comparand drivers 208, which in turn are coupled to a comparand register 210 via complementary data lines D and $\overline{D}$. The comparand drivers 208 selectively drive a comparand word received from the comparand register 210 via complementary data lines D and $\overline{D}$ onto complementary comparand lines CL and $\overline{CL}$ for comparison with data in CAM cells 202 in response the select signal SEL provided by the block select circuit 106. The comparand register 210 may be shared by all CAM blocks 102(1)-102(n). As discussed above with respect to FIG. 1, the block select circuit 106 generates the select signal SEL in response to the search code and its stored class code.

In alternate embodiments, other CAM array architectures may be used. For example, in some embodiments, CAM array 200 may not include complementary comparand lines CL and $\overline{CL}$, in which case the complementary bit lines BL and $\overline{BL}$ may be coupled to the comparand drivers 208 and be used to perform a compare operation as is generally known in the art. For example, in the first part of a compare cycle, compare data may be selectively driven onto BL and $\overline{BL}$, and during the second part of the compare cycle, BL and $\overline{BL}$ may be driven with data to be output from CAM array 200. For other embodiments, only one of comparand lines CL and $\overline{CL}$ or bit lines BL and $\overline{BL}$ may be needed.

Figure 3:
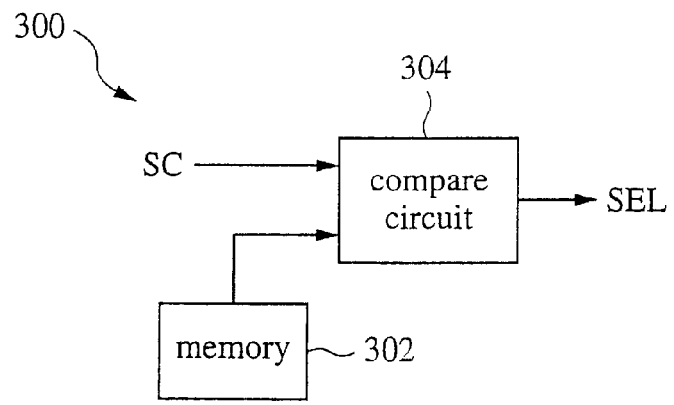
FIG. 3 is a block diagram of a block select circuit in one embodiment of the CAM block of FIG. 2.

FIG. 3 shows a block select circuit 300 that is one embodiment of the block select circuit 106. The block select circuit 300 includes a memory 302 and a compare circuit 304. The memory 302 stores the class code for the corresponding CAM block 102 of device 100, and may be any suitable programmable memory element such as, for instance, a register, flip-flop, EEPROM, EPROM, SRAM, and so on. The compare circuit 304 compares the class code received from the memory 302 with a search code received from bus SC and, in response thereto, generates the select signal SEL which selectively enables or disables the corresponding CAM block 102. The compare circuit 304 may be any suitable circuit which compares the search code and the class code, including for example an exclusive-OR type logic gate or a CAM cell.

Figure 4:
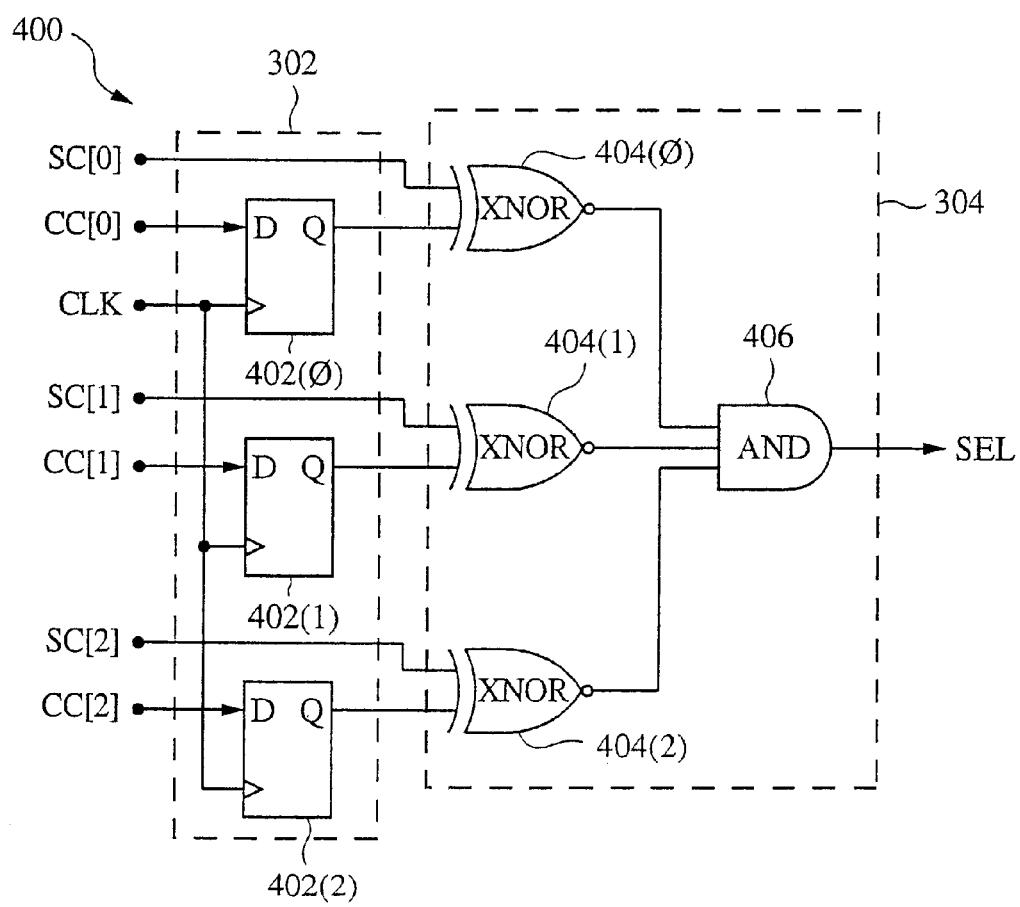
FIG. 4 is a logic diagram of one embodiment of the block select circuit of FIG. 3.

FIG. 4 shows a block select circuit 400 that is one embodiment of the block select circuit 300. The block select circuit 400 is shown to include a 3-bit memory 302 and a 3-bit compare circuit 304, although in other embodiments more or less bits may be used. The memory 302 includes three data flip-flops 402(0)–402(2), and the compare circuit 304 includes three exclusive-NOR (XNOR) gates 404(0)–404(2) and an AND gate 406. Each XNOR gate 404(0)–404(2) includes a first input terminal to receive a corresponding search code bit SC, a second input terminal to receive a corresponding class code bit CC from the corresponding flip-flop 402, and an output terminal connected to the AND gate 406. A 3-bit class code CC[0:2] may be clocked into respective flip-flops 402(0)–402(2) using the clock signal CLK, where flip-flop 402(0) stores the first class code bit CC[0], flip-flop 402(1) stores the second class bit code CC[1], and flip-flop 402(2) stores the third class code bit CC[2].

During compare operations, the XNOR gates 404(0)–404(2) compare search code bits SC[0:2] with respective class code bits CC[0:2] and, if there is match, drive their output terminals to logic high. Conversely, if there is a mismatch, the XNOR gate 404 drives its output terminal to logic low. If all search code bits SC[0:2] match corresponding class code bits CC[0:2], then AND gate 406 asserts the select signal SEL to logic high, thereby enabling the corresponding CAM block 102 to participate in the compare operation. Otherwise, if any of the search code bits SC[0:2] mismatch corresponding class code bits CC[0:2], the AND gate 406 de-asserts the select signal to logic low, thereby disabling the corresponding CAM block 102 from participating in the compare operation. Since class code bits may be loaded into flip-flops 402(0)–402(2) before a compare operation, the gate delay associated with generating the select signal during the compare operation is only 2 gate delays, one for XNOR gates 404 and one for AND gate 406, and therefore has a negligible effect upon device performance.

Figure 5:
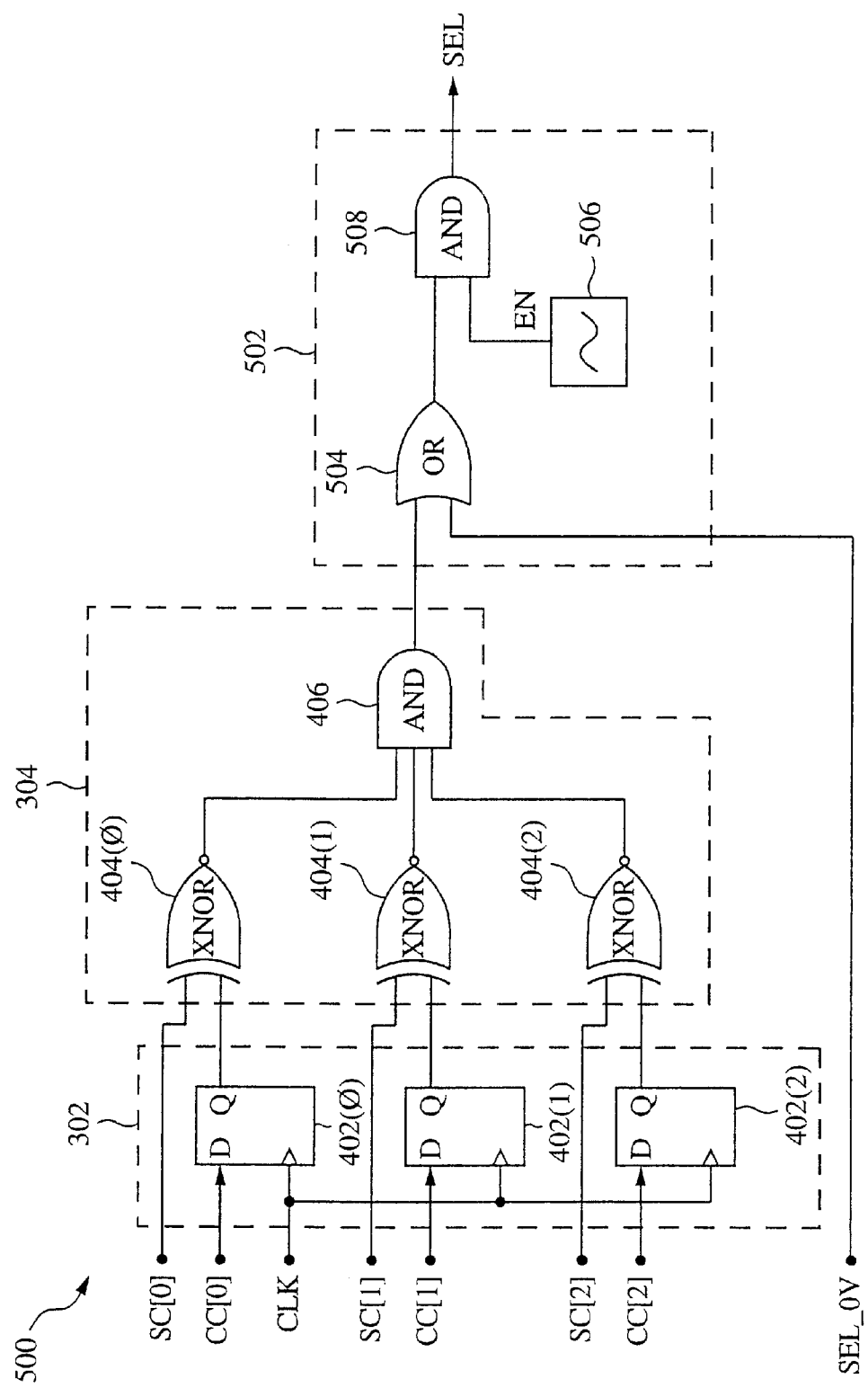
FIG. 5 is a logic diagram of another embodiment of the block select circuit of FIG. 3.

FIG. 5 shows a block select circuit 500 that is another embodiment of the block select circuit 300. Here, a logic circuit 502 is coupled to the output terminal of the AND gate 406 to allow for direct control of the select signal SEL using control signals EN and SEL_OV. The logic circuit 502 includes an OR gate 504 having a first terminal coupled to the output terminal of the AND gate 406, a second terminal to receive EN, and an output terminal coupled to a first input terminal of an AND gate 508. The AND gate 508 includes a second input terminal to receive SEL_OV, and an output terminal to provide the select signal SEL. The signal EN enables the corresponding CAM block 102 to participate in the compare operation when the output of AND gate 406 is logic high. When asserted to logic high, EN enables the corresponding CAM block 102 for the compare operation and, conversely, when de-asserted to logic low, EN disables the corresponding CAM block 102 for the compare operation regardless if there is a match condition. The EN signal may be used to selectively disable CAM blocks 102, for instance, when defective. The signal EN is shown in FIG. 5 as being provided by a fuse 506, although in other embodiments EN may be provided by other means such as a programmable memory element, e.g., a register, flip-flop, EPROM, EEPROM, SRAM, etc. The signal SEL_OV is a select override signal that, when asserted to logic high, may be used to force the select signal SEL to logic high to enable the corresponding CAM block 102 to participate in compare operations, irrespective of whether there is a class match. For an alternative embodiment, the relative locations of OR gate 504 and AND gate 508 may be reversed such that when SEL_OV is set to a logic high state, then SEL will be set to a logic high state irrespective of whether there is a class match or the logic state of EN.

Figure 6:
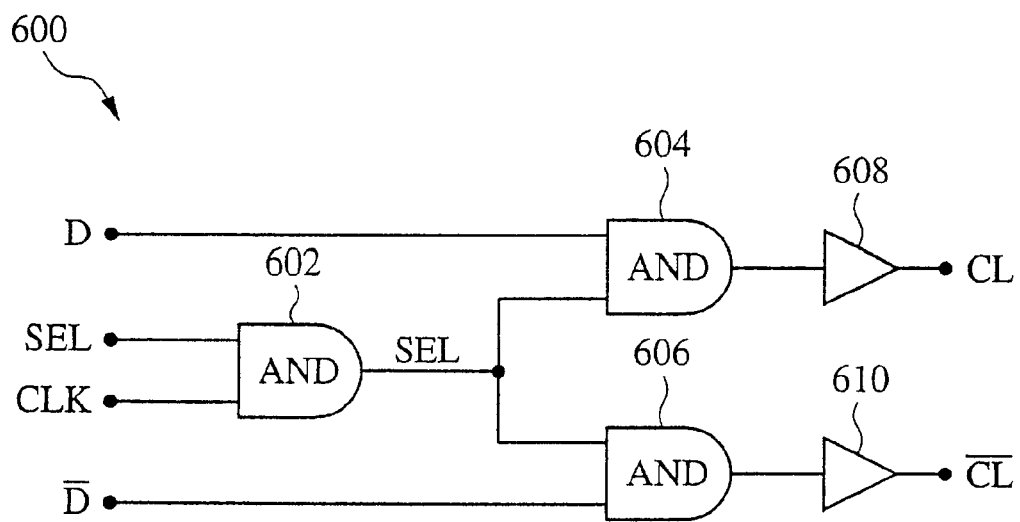
FIG. 6 is a logic diagram of one embodiment of a comparand driver of the CAM block of FIG. 2.

FIG. 6 shows a 1-bit comparand driver 600 that is used in one embodiment of the comparand drivers 208. Driver 600 includes AND gates 602, 604, and 606, and also includes buffers 608 and 610. AND gate 602 includes input terminals to receive the clock signal CLK and the select signal SEL, and an output terminal coupled to first input terminals of AND gates 604 and 606. AND gate 604 includes a second input terminal coupled to the data line D, and an output terminal coupled to the buffer 608, which in turn drives the comparand line CL. AND gate 606 includes a second input terminal coupled to the complementary data line $\overline{D}$, and an output terminal coupled to the buffer 610, which in turn drives the complementary comparand line $\overline{CL}$. Buffers 608 and 610 may be any suitable buffers to drive comparand data onto the comparand lines CL and $\overline{CL}$. A plurality of drivers 600 may share the AND gate 602.

During a compare operation, a comparand bit is provided to AND gate 604 via data line D, and a complementary comparand bit is provided to AND gate 606 via complementary data line $\overline{D}$. When CLK is logic high, the select signal SEL propagates through AND gate 602 to AND gates 604 and 606. If the select signal is asserted to logic high, AND gate 606 passes the comparand bit to the buffer 608, which in turn drives the comparand bit onto the comparand line CL. Similarly, AND gate 608 passes the complementary comparand bit to the buffer 610, which in turn drives the complementary comparand bit onto the complementary comparand line $\overline{CL}$. Thus, when the select signal SEL is asserted, the comparand driver 600 drives the comparand lines CL and $\overline{CL}$ with the comparand data received from the comparand register 210 via data lines D and $\overline{D}$.

Conversely, if the select signal SEL is de-asserted to logic low to indicate that the corresponding CAM block 102 is not to participate in the compare operation, AND gates 606 and 608 force their respective output terminals to logic low. In response thereto, buffers 608 and 610 force the comparand line CL and the complementary comparand line $\overline{CL}$, respectively, to logic low. In this manner, when the select signal SEL is de-asserted, the comparand driver 600 does not drive complementary comparand data onto the comparand lines CL and $\overline{CL}$, thereby precluding the corresponding CAM block 102 from participating in the compare operation while minimizing power consumption in the CAM block.

The present invention is also particularly useful in increasing manufacturing yield of a CAM device by disabling defective CAM blocks in the device. Thus, for instance, during manufacture of a CAM device having n CAM blocks, if one or more of the CAM blocks are found to be defective or otherwise inoperable after manufacturing, rather than discarding the entire device, the defective blocks may be disabled using the block select circuits as described above, and the remaining non-defective CAM blocks may then be used for compare operations. For example, in one embodiment where the CAM device includes 8 CAM blocks each having 1k rows of CAM cells, if one of the CAM blocks is defective, that CAM block is disabled, and the remaining 7 CAM blocks may be used as a 7k CAM device. Accordingly, the ability to use the CAM device when one or more of its CAM blocks are defective advantageously increases manufacturing yield of the CAM device.

Figure 7:
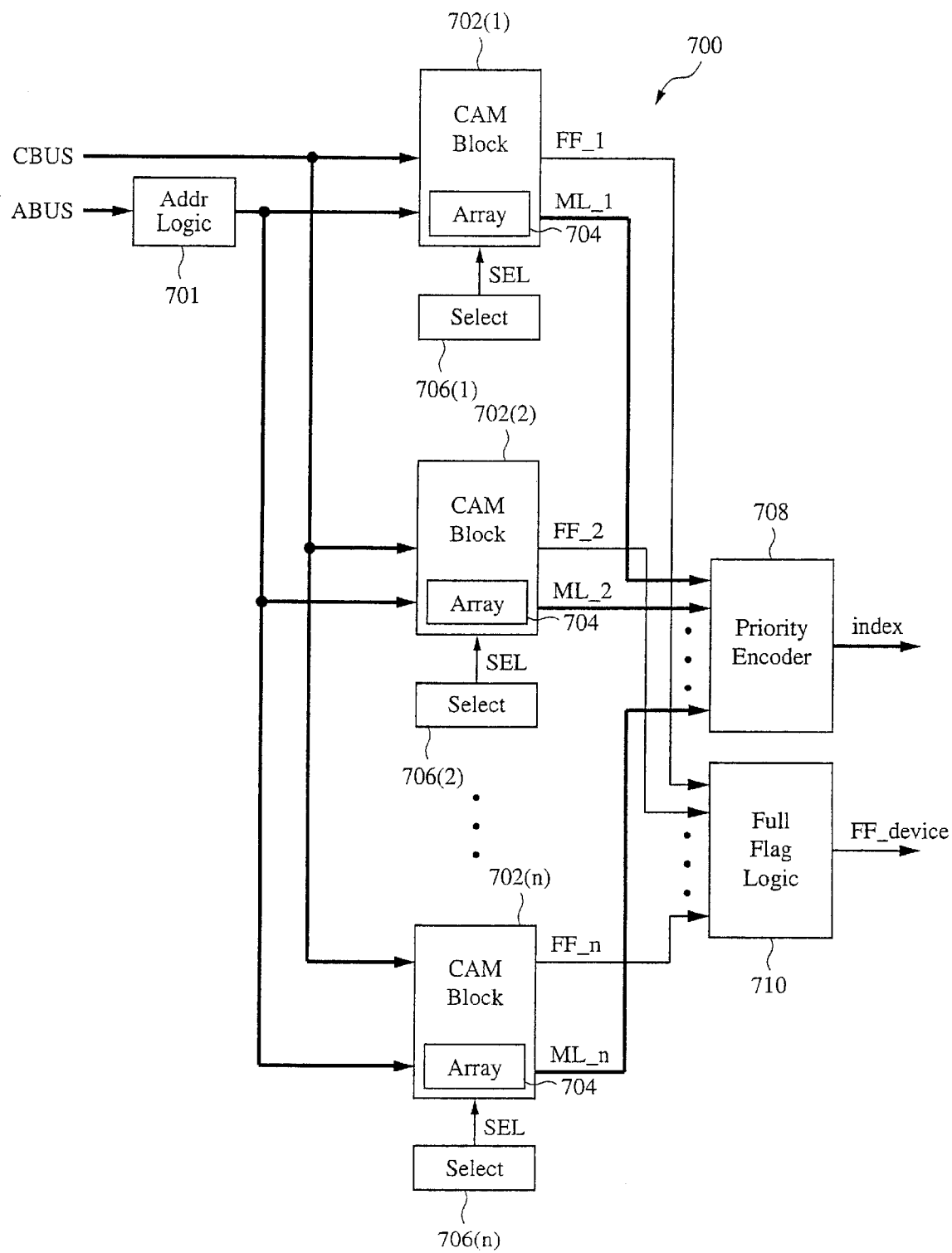
FIG. 7 is a block diagram of a CAM device including a plurality of CAM blocks in accordance with another embodiment of the present invention configured to translate addresses of one or more defective CAM blocks.

FIG. 7 shows a CAM device 700 that is a modified embodiment of the device 100 of FIG. 1 which allows for one or more defective CAM blocks to be disabled for CAM operations, and also includes circuitry which translates or re-assigns address locations in defective CAM blocks to address locations in non-defective CAM blocks. The device 700 includes address logic 701, a plurality of CAM blocks 702(1)-702(n), a plurality of block select circuits 706(1)-706(n) corresponding to CAM blocks 702(1)-702(n), respectively, a priority encoder 708, and full flag logic 710. Each of the block select circuits 706(1)-706(n) provides to the corresponding CAM block 702 a select signal which may be used as described above to disable the CAM block 702 if, for example, the CAM block 702 is defective.

The block select circuit 706 may be any suitable circuit to provide either a logic high (enabling) or a logic low (disabling) select signal SEL to the corresponding CAM block 702. In some embodiments, the block select circuit 706 includes a memory (not shown in FIG. 7) for storing a binary value indicative of SEL. In some embodiments, the block select circuit 706 provides a logic high SEL signal if the corresponding CAM block 702 is not defective, and provides a logic low SEL signal if the corresponding CAM block 702 is defective. In one embodiment, the block select circuit 706 may include the block select circuit 500 (FIG. 5), in which case the signal EN may be set to a low logic state by blowing fuse 506 to disable a defective CAM block 702 via signal SEL. In other embodiments, the block select circuit 706 may be a fuse (or a memory element) connected between the CAM block 702 and a voltage supply, in which case the fuse may be blown to provide a logic low SEL signal to disable the corresponding CAM block 702.

After fabricating the device 700, each of the CAM blocks 702(1)-702(n) is tested in a suitable manner. For each CAM block 702 that is found to be defective, the corresponding block select circuit 706 is configured to provide a logic low select signal SEL to the CAM block 702 to disable the CAM block. Conversely, for each CAM block 702 that is not defective, the corresponding block select circuit 706 is configured to provide a logic high select signal to the CAM block to enable its participation in CAM operations.

Figure 8:
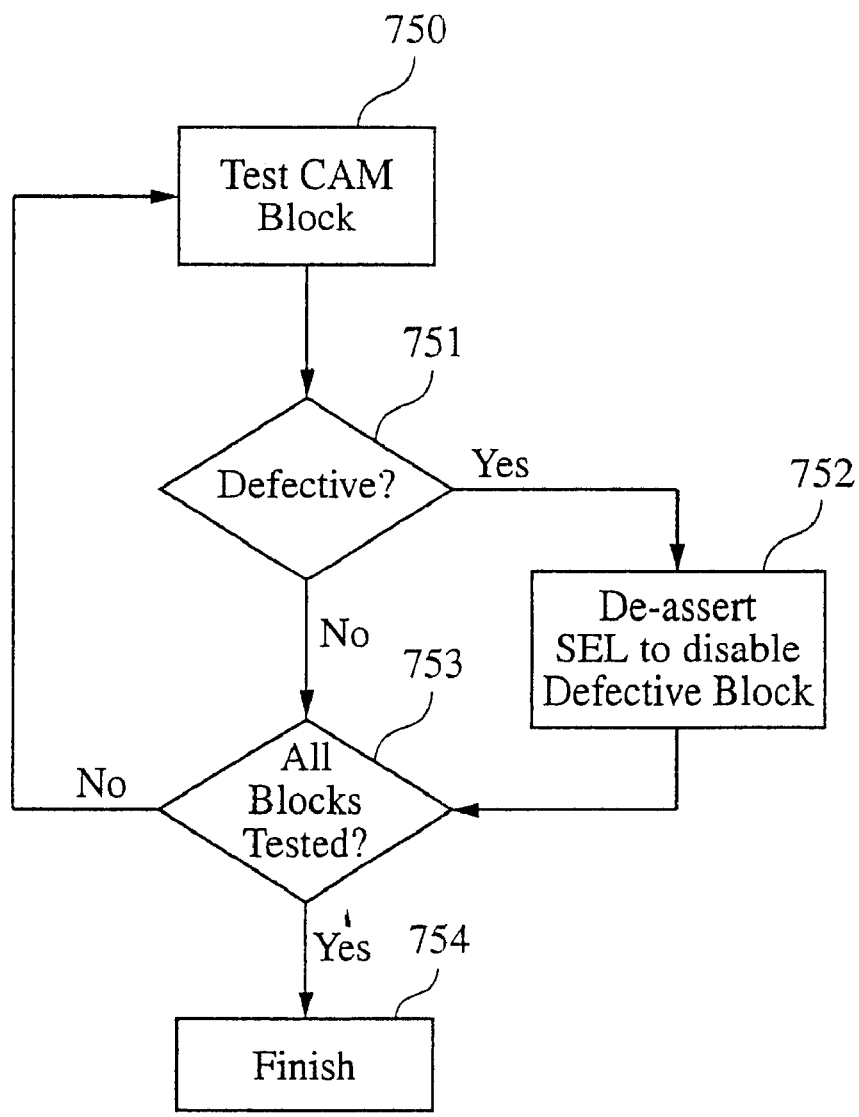
FIG. 8 is a flow chart illustrating the disabling of defective CAM blocks in one embodiment.

Testing the CAM blocks of a CAM device and then selectively disabling the defective CAM blocks in an embodiment using a fuse to provide SEL is illustrated with reference to the flow chart of FIG. 8. Here, a fuse (not shown for simplicity) in each block select circuit 706 is coupled to a voltage supply and thus initially provides an asserted (e.g., logic high) SEL to enable the corresponding CAM block 702. Each CAM block 702 is tested in a suitable manner to determine whether it is defective (step 750). If the CAM block is defective, as tested at step 751, SEL is de-asserted (e.g., to logic low) to disable the defective CAM block by blowing the fuse. Otherwise, if the CAM block is not defective, the corresponding fuse is not blown, and the corresponding CAM block remains enabled. If all CAM blocks have been tested, as determined at step 753, processing is finished (step 754). Otherwise, the next CAM block is tested and thereafter disabled if found to be defective (steps 750–752).

During a compare operation, each CAM block 702 receives comparand data from the comparand bus CBUS in a manner similar to that of CAM blocks 102 of device 100 of FIG. 1. Other signals provided to device 700 during the compare operation may be a clock signal CLK, one or more instructions from an instruction decoder (not shown for simplicity), and other control signals. Each CAM block 702 provides a plurality of match line signals to the priority encoder 708 via corresponding match lines ML. The match lines carry match signals indicative of match conditions in the CAM arrays 704. For simplicity, the plurality of match lines ML from each CAM block 702 are represented collectively in FIG. 7. The priority encoder 708 generates an index corresponding to one of the matching CAM words in the device 700, which as described above may be the index of the highest-priority matching CAM row.

Each CAM block 702 provides a full flag signal FF indicative of whether the CAM block is full, i.e., whether there are any available row in the CAM block 702 to store data, to full flag logic 710. The full flag signal FF may be generated for each CAM block 702 in a well-known manner using one or more valid bits in each row of the CAM block. The full flag signals FF_1 to FF_n provided by CAM blocks 702(1)-702(n), respectively, are combined in a well-known manner in full flag logic 710 to generate a device full flag signal, FF_device, indicative of whether there are any available rows in the device 700. When a CAM block 702 is found to be defective or otherwise inoperable for its intended purpose, the CAM block 702 is configured to maintain an asserted full flag signal FF to indicate that the defective CAM block 702 does not include any available memory locations. In one embodiment, the full flag signal FF for the defective CAM block may be maintained in the asserted state by forcing the valid bits in its array 704 to an asserted state. In other embodiments, a fuse may be provided within or associated with each CAM block 702 that, when blown, forces the corresponding full flag signal FF to be asserted.

Address logic 701 is shown in FIG. 7 as coupled to an address bus ABUS and each of the CAM blocks 702(1)-702(n). During read and write operations, an address provided to the device 700 may be received into address logic 701 via address bus ABUS, and thereafter used to select a row in one of the CAM blocks 702(1)-702(n) for the read or write operation. In accordance with the present invention, if a CAM block 702 to which the address refers is defective, and is thus disabled for the operation using the corresponding block select circuit 706 as describe above, address logic 701 translates the address from the defective or disabled CAM block to a non-defective CAM block. Conversely, if the CAM block 702 to which the address refers is non-defective, and is thus enabled for operation, address logic 701 forwards the address to the appropriate CAM block 702. As explained more fully below, address logic 701 ensures a contiguous addressing scheme in the CAM blocks 702 when one or more CAM blocks 702 are defective and disabled, even when the non-defective CAM block(s) 702 are not adjacent to each other.

For alternate embodiments, address logic 701 may be omitted. For one example, contiguous non-defective blocks starting from block 702(1) may still be used. For other embodiments, any non-defective block may be used.

Figure 9:
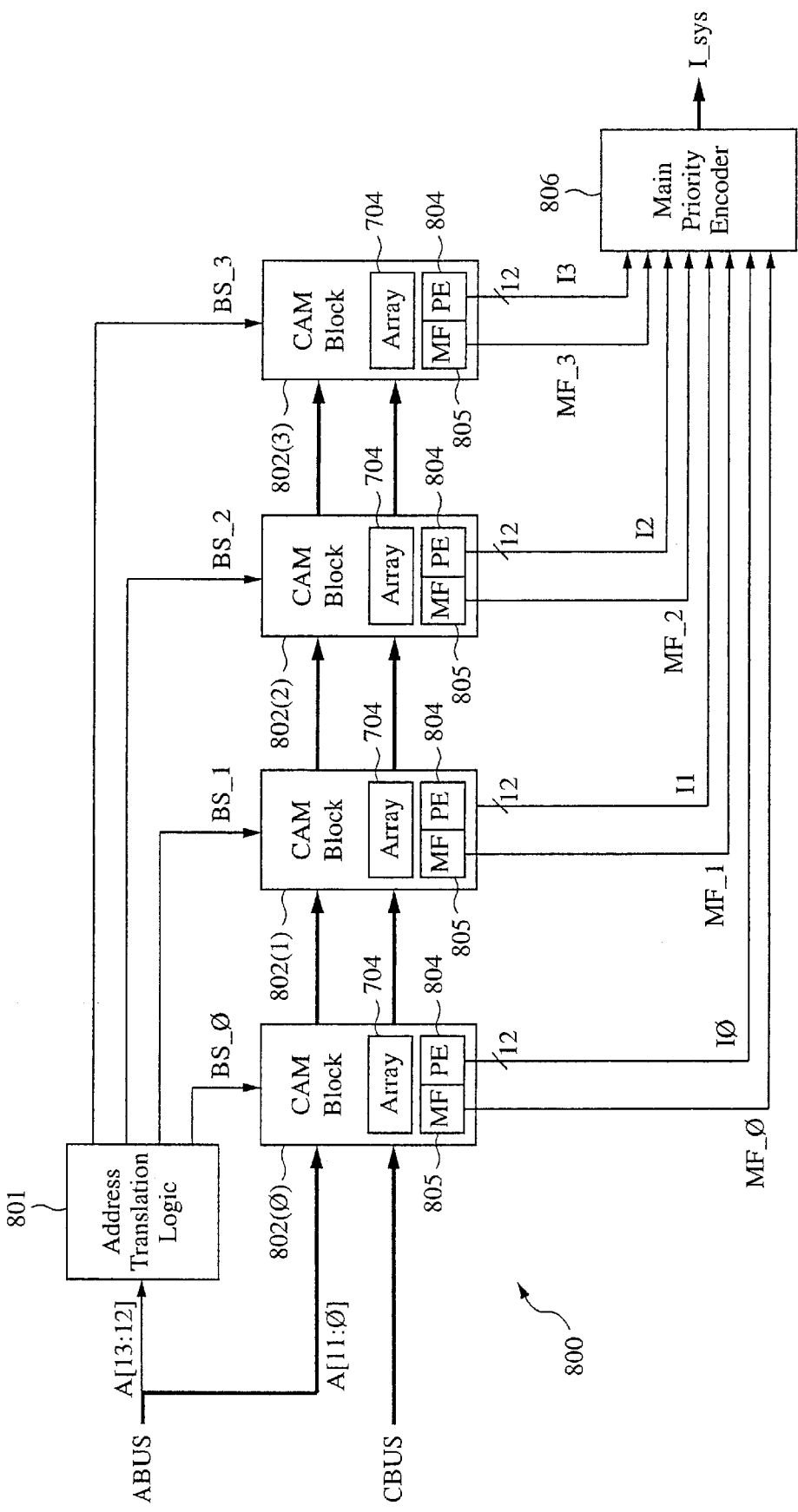
FIG. 9 is a block diagram of one embodiment of the CAM device of FIG. 7.

FIG. 9 shows a CAM device 800 that is one embodiment of the CAM device 700. CAM device 800 is shown to include address translation logic 801, four CAM blocks 802(0)–802(3), and a main priority encoder 806. Each CAM block 802 includes a CAM array 704 (e.g., a 1k CAM array), a block priority encoder 804, and match flag logic 805. Of course, in other embodiments, there may be any number of CAM blocks 802, and each CAM block array 704 may include any number of rows of CAM cells. The address A may include any suitable number of bits. In the embodiment of FIG. 9, the function of the priority encoder 708 of FIG. 7 is distributed between the individual block priority encoders 804 within the CAM blocks 802(0)–802(3) and the main priority encoder 806. During a read or write operation, a 14-bit address A[13:0] may be provided to the device 800 via the address bus ABUS. The first two address bits A[13:12] are the block address bits and are provided to address translation logic 801, which in turn selects one of the CAM blocks 802(0)–802(3) for the read or write operation via block select signals BS_0 to BS_3, respectively. The remaining twelve address bits, A[11:0], select a row in the CAM array 704 selected by address translation logic 801 for the operation, and may be provided to each CAM block 802. During read or write operations, data may be read from or written to the row identified by row address bits A[11:0] in the CAM block 802 selected by address translation logic 801.

Information indicative of which CAM blocks 802 are found to be defective during testing may be used to configure address translation logic 801 to re-address the non-defective CAM blocks 802 so as to occupy, for instance, the contiguous highest-priority address space (e.g., the lowest numbered addresses). During a read or write operation, address translation logic 801 receives block address bits A[13:12]. If a CAM block 802 selected by block address bits A[13:12] is non-defective or otherwise enabled, address translation logic 801 asserts the corresponding block select signal BS to enable the selected CAM block 802 for the operation. For example, if an address [13:0] selects the first row in the first CAM block 802(0) for reading, and CAM block 802(0) is non-defective, address translation logic 801 asserts BS_0 to logic high while maintaining BS_1, BS_2, and BS_3 in a logic low, de-asserted state. The asserted BS_0 signal causes row address bits A[11:0] to be latched into the first CAM block 802(0), thereby facilitating a read from the first CAM block 802(0).

Conversely, if a CAM block 802 selected by block address bits A[13:12] is defective or otherwise disabled, address translation logic 801 selects another CAM block for the operation by asserting its corresponding block select signal BS. For example, if the address [13:0] selects the first row in the first CAM block 802(0) for reading, and CAM block 802(0) is defective and the second CAM block 802(1) is non-defective, address translation logic 801 may assert BS_1 to logic high while maintaining BS_0, BS_2, and BS_3 in a logic low, de-asserted state. The asserted BS_1 signal causes row address bits A[11:0] to be latched into the second CAM block 802(1), thereby facilitating a read from the second CAM block 802(1). In this manner, address translation logic 801 may re-address read or write operations from defective CAM blocks to non-defective CAM blocks.

Figure 10:
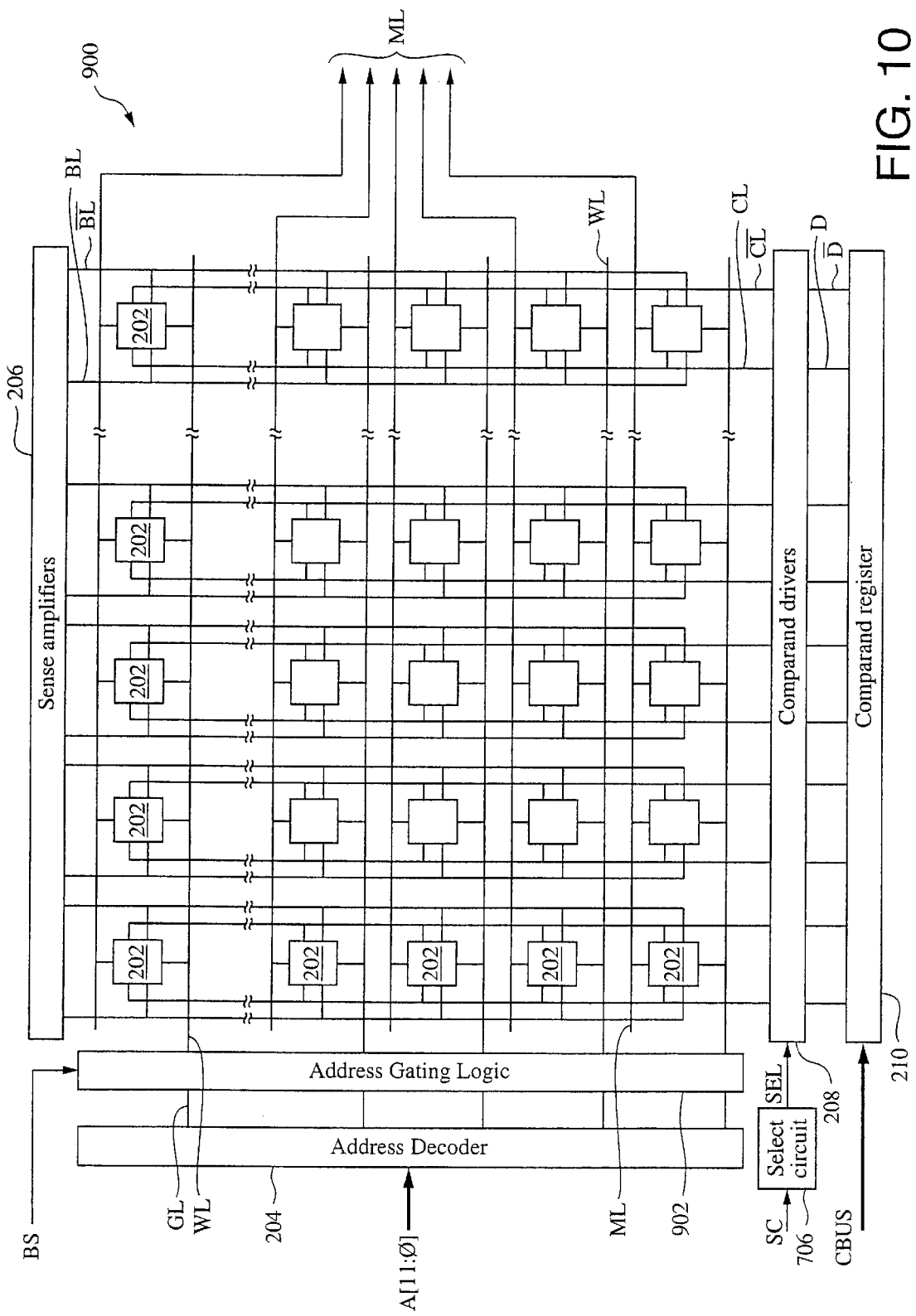
FIG. 10 is a block diagram of a CAM block in one embodiment of the device of FIG. 9.

In some embodiments, the block select signal BS provided to the CAM block 802 may be used as an address gating signal to facilitate address translation in accordance with present embodiments. For example, FIG. 10 shows a CAM array 900 that is one embodiment of the array 704 of FIG. 7. The array 900 includes a plurality of CAM cells 202 organized in any number of rows and columns, and operates in a manner similar to the CAM array 200 described above with respect to FIG. 2. That is, during compare operations, comparand data provided by the comparand register 210 is selectively driven onto the complementary comparand lines CL and $\overline{CL}$ in response to the select signal SEL provided by the block select circuit 706. If the array 900 is non-defective, the select signal SEL is asserted to logic high to allow the comparand word to be driven into the array 900 for comparison with CAM words stored therein. Conversely, if the array 900 is found to be defective during testing, the block select circuit 706 is configured to provide a de-asserted select signal SEL to the comparand drivers 208 to prevent comparand data from being driven onto the comparand lines CL and $\overline{CL}$, thereby disabling the array 900.

Address bits A[11:0] are provided from address bus ABUS to the address decoder 204. Address gating logic 902 is connected between the address decoder 204 and corresponding word lines WL of the array 900 via gated lines GL, and selectively drives a word line WL identified by A[11:0] in response to the block select signal BS. For example, during a read or write operation, address decoder 204 decodes A[11:0] to select a row of CAM cells 202 for the operation, and drives a corresponding gated line GL to logic high. If BS is asserted to logic high, address gating logic 902 drives the corresponding word line WL to select the row of CAM cells 202 for the operation. Conversely, if BS is de-asserted to logic low, address logic 902 does not drive any of the word lines WL to logic high, regardless of A[11:0], thereby preventing CAM cells 202 in the array from being addressed for the operation. In one embodiment, address gating logic 902 may include for each word line WL in the array 900 an AND gate (not shown) having an output terminal coupled to the word line, a first input terminal coupled to the corresponding gated line GL, and a second input terminal to receive the block select signal BS. In this manner, the AND gates may be used to selectively gate the addressing of CAM cells in the block in response to BS. Of course, in other embodiments other suitable logic may be used.

Figure 11:
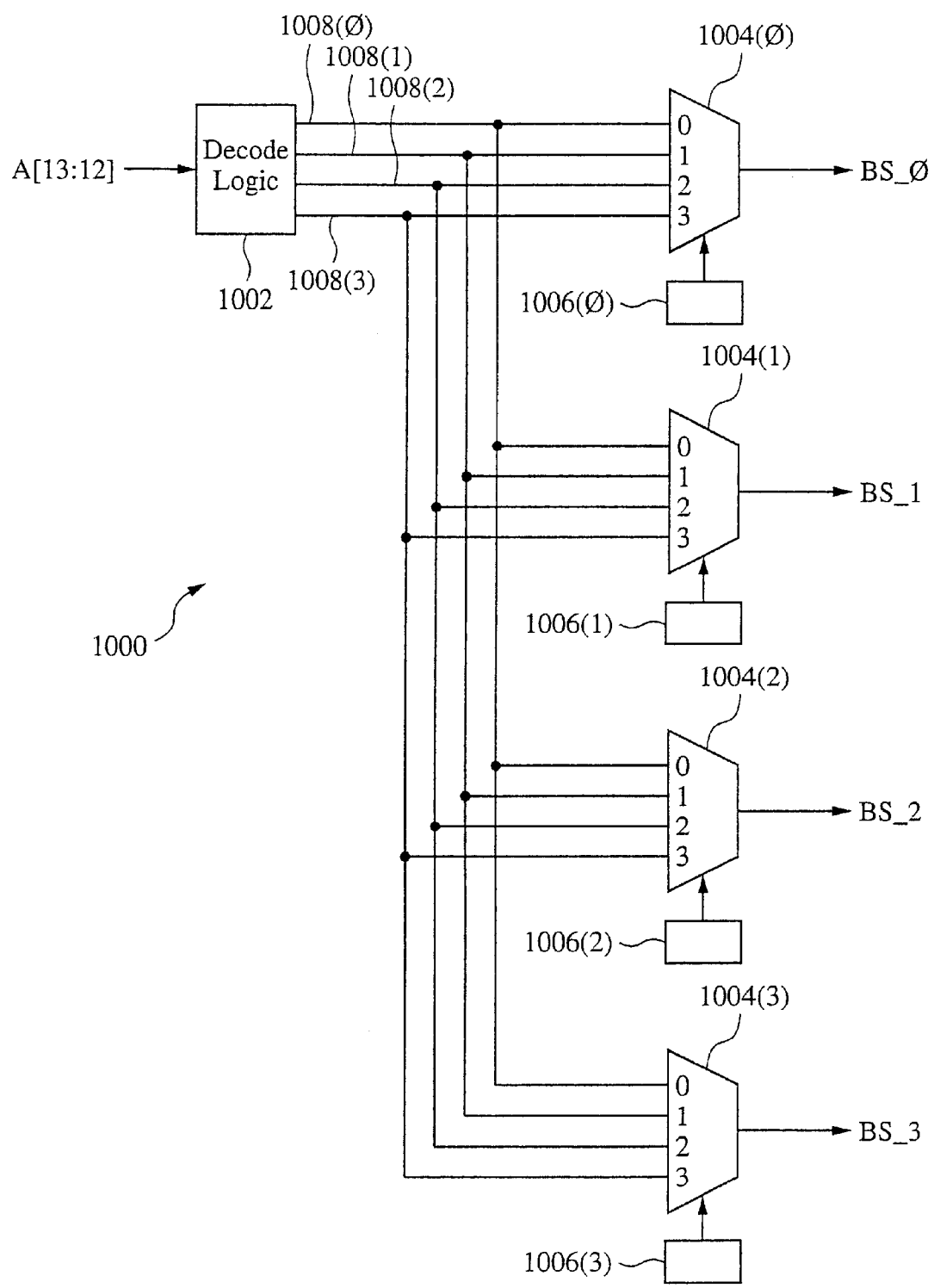
FIG. 11 is a block diagram of address translation logic in one embodiment of the CAM block of FIG. 10.

FIG. 11 shows address translation logic 1000 that is one embodiment of the address translation logic 801 of FIG. 9. Logic 1000 includes decode logic 1002, four 4-input multiplexers 1004(0)–1004(3), and four corresponding memory elements 1006(0)–1006(3), respectively. Decode logic 1002 has an input terminal to receive block address bits A[13:12], and has four output terminals coupled to corresponding input terminals of the multiplexers 1004(0)–1004(3) via lines 1008(0)–1008(3), respectively. Decode logic 1002 decodes block address bits A[13:12], and in response thereto, asserts one of output lines 1008(0)–1008(3) to logic high. For example, if address bits A[13:12] are "00", which is equivalent to the decimal value "0", decode logic asserts line 1008(0); if address bits A[13:12] are "01", which is equivalent to the decimal value "1", decode logic 1002 asserts line 1008(1); if address bits A[13:12] are "10", which is equivalent to the decimal value "2", decode logic 1002 asserts line 1008(2); and if address bits A[13:12] are "11", which is equivalent to the decimal value "3", decode logic 1002 asserts line 1008(3).

The multiplexers 1004(0)–1004(3) each include an output terminal coupled to a corresponding one of the CAM blocks 802(0)–802(3), respectively, and a control terminal coupled to a corresponding one of the memory elements 1006(0)–1006(3), respectively. Each memory element 1006 stores address translation information that when provided to the corresponding multiplexer 1004 selects one of the signals provided by decode logic 1002 to be output as the block select signal BS. In this manner, multiplexers 1004(0)–1004(3) may dynamically assign block address values to CAM blocks 802(0)–802(3), respectively.

In accordance with present embodiments, a read or write operation to a defective CAM block may be re-addressed to a non-defective CAM block by manipulating the address translation information stored in the memory elements 1006(0)–1006(3). In some embodiments, where all CAM blocks 802(0)–802(3) are non-defective, the memory elements 1006(0)–1006(3) store default block address values so as to not alter CAM addressing during the read or write operation. That is, the default block address values cause respective multiplexers 1004(0)–1004(3) to select corresponding signals on lines 1008(0)–1008(3) as block select signals BS_0 to BS_3, respectively. For example, memory element 1006(0) may store a default block address value of "0" to cause multiplexer 1004(0) to select the signal on line 1008(0) as BS_0, memory element 1006(1) may store a default block address value of "1" to cause multiplexer 1004(1) to select the signal on line 1008(1) as BS_1, memory element 1006(2) may store a default block address value of "2" to cause multiplexer 1004(2) to select the signal on line 1008(2) as BS_2, and memory element 1006(3) may store a default block address value of "3" to cause multiplexer 1004(3) to select the signal on line 1008(3) as BS_3. In this manner, address translation logic 1000 selects for the read or write operation the CAM block identified by address bits A[13:12]. Table 1 summarizes the four default block address/multiplexer select values (MUX) and corresponding address space when all CAM blocks are non-defective.

TABLE 1

| Block | Status | MUX | address space |
|---|---|---|---|
| CAM 802(0) | non-defective | 0 | 0 to k−1 |
| CAM 802(1) | non-defective | 1 | k to 2k−1 |
| CAM 802(2) | non-defective | 2 | 2k to 3k−1 |
| CAM 802(3) | non-defective | 3 | 3k to 4k−1 |

The CAM device 800 is then tested to determine if any CAM blocks are defective. Where it is determined that one or more CAM blocks are defective, the select values stored in memory elements 1006(0)–1006(3) may be modified to re-address the non-defective CAM blocks. For example, if after testing it is determined that CAM block 802(0) is defective, and is thereafter disabled using the corresponding block select circuit 706 as described above (see also FIG. 7), the 1k CAM rows in the defective CAM block 802(0) are no longer available, and therefore the device 800 now has only 3k available CAM rows available, i.e., 1k rows in each of the 3 non-defective CAM blocks 802(1)–802(3). Since the first CAM block 802(0) is not available, it is desirable for the second CAM block 802(1) to be the highest-priority CAM block (e.g., having address space 0 to k−1), for the third CAM block 802(2) to be the second highest-priority CAM block (e.g., having address space k to 2k−1), and for the fourth CAM block 802(3) to be the third highest-priority CAM block (e.g., having address space 2k to 3k−1).

The block address values stored in corresponding memory elements 1006(0)–1006(3) may be modified to implement a new addressing scheme for the non-defective CAM blocks 802(1)–802(3). For example, in one embodiment, the block address value stored in the memory element 1006(1) is set to "0" so that multiplexer 1004(1) selects the signal on line 1008(0) as BS_1 to be provided to CAM block 802(1). When A[13:12] equals "00", decode logic 1002 asserts line 1008(0) to logic high, which in turn now passes through multiplexer 1006(1) to select the second CAM block 802(1) for the operation. In this manner, address translation logic 1000 translates address space 0 to k−1 from CAM block 802(0) to CAM block 802(1).

Similarly, the block address value stored in the memory element 1006(2) is set to "1" so that multiplexer 1004(2) selects the signal on line 1008(1) as BS_2 to provide to CAM block 802(2). When A[13:12] equals "01", decode logic 1002 asserts line 1008(1) to logic high, which in turn now passes through multiplexer 1004(2) to select the third CAM block 802(2) for the operation, thereby translating address space k to 2k−1 from CAM block 802(1) to CAM block 802(2). Similarly, the block address value stored in the memory element 1006(3) is set to "2" so that multiplexer 1004(3) selects the signal on line 1008(2) as BS_3 to provide to CAM block 802(3). When A[13:12] equals "10", decode logic 1002 asserts line 1008(2) to logic high, which in turn now passes through multiplexer 1004(3) to select the fourth CAM block 802(3) for the operation, thereby translating address space 2k to 3k−1 from CAM block 802(2) to CAM block 802(3). Table 2 summarizes the select values when CAM block 802(0) is defective and CAM blocks 802(1)–802(3) are non-defective.

TABLE 2

| Block | Status | MUX | address space |
|---|---|---|---|
| CAM 802(0) | defective | 3 | 3k to 4k−1* |
| CAM 802(1) | non-defective | 0 | 0 to k−1 |
| CAM 802(2) | non-defective | 1 | k to 2k−1 |
| CAM 802(3) | non-defective | 2 | 2k to 3k−1 |

*not used

By translating address space in CAM blocks 802(1)–802(3), respectively, present embodiments may re-address rows in non-defective CAM blocks 802(1)–802(3) with the highest-priority CAM addresses, e.g., row addresses 0 to 3k−1. In this manner, the three non-defective CAM blocks 802(1)–802(3) of device 800 may be sold and operated as a 3k CAM array. This is in contrast to prior art CAM devices, which are typically discarded if any of the CAM blocks therein are found to be defective. The ability to re-address the defective CAM block 802(0) and use the non-defective CAM blocks 802(1)–802(3) of device 800 as a 3k CAM array, rather than discarding the device 800, may significantly increase manufacturing yield.

In the example above, address space in the defective CAM block 802(0) is translated from row assignments 0 to k−1 to row assignments 3k to 4k−1 by changing the select value stored in the memory element 1006(0) from "0" to "3". This ensures that the defective CAM block 802(0) will not be addressed during read or write operations. That is, since the 3 non-defective CAM blocks are used as a 3k CAM array having address space 0 to 3k−1, address space higher than 3k−1 is not used, and therefore the defective CAM block 802(0) will not be addressed. For an alternate embodiment, the block select signal BS_0 can be set to a low logic state to disable block 802(0). For one example, the output of each MUX can be coupled to a logic circuit (e.g., one or more AND, OR, XOR, NOT circuits) and memory 1006 configured to disable BS and its corresponding block when a particular value is programmed into memory 1006 (or the value is changed in memory 1006).

In other embodiments, the block address values stored in memory elements 1006(0)–1006(3) may be modified to translate address space in any number n of non-defective CAM blocks into a contiguous address space of 0 to (k)n−1, irrespective of whether the non-defective CAM blocks are adjacent to one another. Thus, for example, if in one embodiment the CAM blocks 802(0) and 802(2) are defective and CAM blocks 802(1) and 802(3) are non-defective, the non-defective CAM blocks 802(1) and 802(3) may be configured for operation as a 2k CAM array by setting the block address values for memory elements 1006(1) and 1006(3) to "0" and "1", respectively. In this manner, the first 1k address space corresponding A[13:12] equal to "00" selects CAM block 802(1), and the second 1k address space corresponding to A[13:12] equal to "01" selects CAM block 802(3). The block address values stored in memory elements 1006(0) and 1006(2) each may be either "2" or "3" to preclude their selection during operation, since addresses above 2k−1, i.e., the third or fourth 1k address spaces corresponding to A[13:12] equal to "10" or "11", respectively, are not used. Table 3 summarizes the block address values and corresponding address space when CAM blocks 802(0) and 802(2) are defective and CAM blocks 802(1) and 802(3) are non-defective.

TABLE 3

| Block | Status | MUX | Address Space |
|---|---|---|---|
| CAM 802(0) | defective | 2 or 3 | >2k* |
| CAM 802(1) | non-defective | 0 | 0 to k−1 |
| CAM 802(2) | defective | 2 or 3 | >2k* |
| CAM 802(3) | non-defective | 1 | k to 2k−1 |

*not used

Each memory element 1006 may be any suitable structure to provide a block address value to the corresponding multiplexer 1004 to select one of lines 1008(0)–1008(3) to pass as the block select signal BS. In some embodiments, the memory element may be a flip-flop, register, look-up table, or non-volatile memory such EPROM or Flash memory. In other embodiments, the memory element 1006 may include one or more fuses to provide the block address value to the corresponding multiplexer 1004.

For one example, in one embodiment of the CAM device 800, each memory element 1006 includes two fuses coupled to a voltage supply to initially provide the binary value "11" to corresponding multiplexers 1004. In this example, since each multiplexer 1004 initially selects the signal line connected to its "3" input in response to the binary block address value "11", the "3" input of each multiplexer 1004 is connected to a corresponding numbered signal line 1008 from decode logic 1002. That is, input 3 of multiplexer 1004(0) is connected to the line 1008(0), input number 3 of multiplexer 1004(1) is connected to the line 1008(1), input number 3 of multiplexer 1004(2) is connected to the line 1008(2), and input number 3 of multiplexer 1004(3) is connected to the line 1008(3). The remaining multiplexer inputs 0, 1, and 2 may be connected to lines 1008 in any suitable configuration. In this manner, multiplexer 1004(0) asserts BS_0 when A[13:12] equals "00", multiplexer 1004(1) asserts BS_1 when A[13:12] equals "01", multiplexer 1004(2) asserts BS_2 when A[13:12] equals "10", and multiplexer 1004(3) asserts BS_3 when A[13:12] equals "11". Then, if after testing one or more of the CAM blocks 802 are found to be defective, the fuses of each memory element 1008 may be selectively blown to translate address space from defective CAM blocks to non-defective CAM blocks 802 to facilitate contiguous addressing in the manner described above. Additionally, the two logic ones may be ANDed together and provided as one input to an AND gate, and the other input to the AND gate coupled to a respective BS signal output by each MUX. When a defective row is programmed to a value other than "11", then the respective BS signal and corresponding block will be disabled.

In order to maintain address consistency between read or write operations and compare operations when address space in a defective CAM block is translated to a non-defective CAM block, address translation information used during the read or write operation is also used to calculate the address or index of a matching CAM row during compare operations. Thus, for example, if address space 0 to k−1 is translated from CAM block 802(0) to 802(1), and there is a match in CAM block 802(1) during a subsequent compare operation, the priority encoder 806 ensures that the matching index from CAM block 802(1) lies within address space 0 to k−1, rather than within address space k to 2k−1. In this manner, address translations facilitated during a read or write operation are reflected during subsequent compare operations.

Referring again to FIG. 9, during compare operations, a comparand word provided on CBUS is compared to data stored in all enabled (e.g., non-defective) CAM blocks 802. For each enabled CAM block 802, if there is a match condition in response to the compare operation, match flag logic 805 asserts a match flag (MF_0 to MF_3) to a logic high state, and the priority encoder 804 within the CAM block 802 outputs the 12-bit row index I (or address) of the highest priority matching CAM row in the block. If there is not a match, the match flags are not asserted (i.e., match flag logic 805 sets MF to low logic state). For one embodiment, each match flag logic includes a programmable element (e.g., a fuse or other memory element) that is programmed when the CAM block is disabled. The match flags MF_0 to MF_3 and row indexes I0-I3 from CAM blocks 802(0)–802(3), respectively, are provided to the main priority encoder 806. The main priority encoder 806 adds a unique block index to each row index I provided by CAM blocks 802(0)–802(3) to form a corresponding device index. The main priority encoder 806 uses the match flag signals MF_0 to MF_3 to select the highest-priority device index from CAM blocks 802(0)–802(3) to output as the system index, I_sys.

The main priority encoder 806 is programmable and stores the block indexes for CAM blocks 802(0)–802(3) in memory (not shown in FIG. 9). The block indexes are dynamic values that may be modified or programmed to reflect and thus maintain consistency with address translations as described above in a read or write operation. Initially, the main priority encoder stores a block index of "00" for CAM block 802(0), a block index of "01" for CAM block 802(1), a block index of "10" for CAM block 802(2), and a block index of "11" for CAM block 802(3). These initial block indexes, which are used when all CAM blocks 802(0)–802(3) are enabled, mirror the block address values stored in memory elements 1006(0)–1006(3) of address translation logic 1000 of FIG. 11. If one or more CAM blocks 802 are found to be defective or are otherwise disabled, the block indexes stored in main priority encoder 806 are modified to reflect address translations during the read or write operation. For example, if CAM blocks 802(0) and 802(2) are disabled and address spaces in non-defective CAM blocks 802(1) and 802(3) are translated to address space 0 to k−1 and address space k to 2k−1, respectively, main priority encoder 806 adds a block index of "00" to row index I1 to generate the device index for CAM block 802(1) and adds a block index of "01" to row index I3 to generate the device index for CAM block 802(3). In this manner, address consistency between read/write operations and compare operations is maintained.

Figure 12:
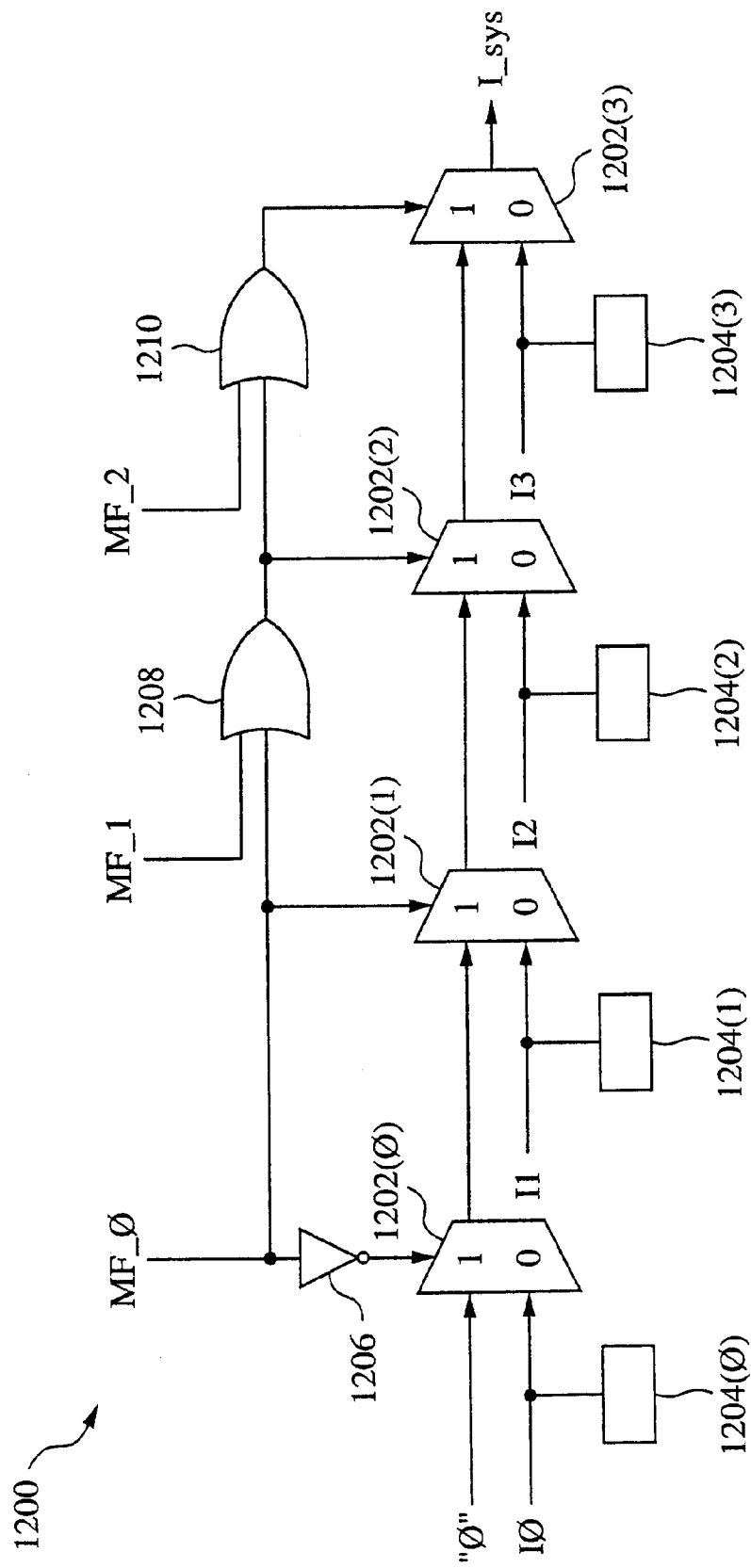
FIG. 12 is a logic diagram of a main priority encoder in one embodiment of the device of FIG. 9.

FIG. 12 shows a priority encoder 1200 that is one embodiment of the main priority encoder 806 of FIG. 9. The priority encoder 1200 includes a chain of four multiplexers 1202(0)–1202(3), four corresponding memory elements 1204(0)–1204(3), and select logic including an inverter 1206 and OR gates 1208 and 1210. Each memory element 1204 stores a 2-bit block index for a corresponding CAM block 802. The memory elements 1204 may be the same as memory elements 1006 of FIG. 11, or they may be separate memory elements. Each multiplexer 1202 includes a first input (i.e., the "1" input) coupled to the output of a preceding multiplexer 1202 in the chain, a second input (i.e., the "0" input) to receive a concatenation of a 12-bit index I of the highest priority match (if any) from a corresponding CAM block 802 and a 2-bit block index from the corresponding memory element 1204, an output coupled to input "1" of a next multiplexer 1202, and a select terminal to receive match information from the CAM blocks 802.

The concatenation of a 12-bit row index I and the 2-bit block index forms a 14-bit device index of the highest-priority match, if any, from a corresponding CAM block 802. The 1 input of the first multiplexer 1202(0) receives a default binary "0" value. MF_0 is inverted by inverter 1206 and provided as the select signal to multiplexer 1202(0), and provided directly as the select signal to multiplexer 1202(1). MF_0 and MF_1 are combined in OR gate 1208 and provided as the select signal for multiplexer 1202(2). MF_2 and the result from OR gate 1208 (i.e., MF_0+MF_1, where + is the logic OR function) are combined in OR gate 1210 and provided as the select signal for multiplexer 1202(3). As explained below, the match flags MF control whether each multiplexer 1202 passes a concatenated device index from a previous CAM block or the concatenated device index of the corresponding CAM block.

In this example, CAM block 802(0) is the highest-priority block, CAM block 802(1) is the next highest-priority block, and so on. For each multiplexer stage, if there is a match in the corresponding CAM block 802, the row index I and block index are forwarded to the next stage if there is not a match condition in a previous or higher-priority CAM block 802. If there is a match condition in a higher-priority CAM block 802, the row index I plus the block index from the higher-priority CAM block are forwarded to the next stage.

For example, if there is a match condition in the first CAM block 802(0), priority encoder 804 of CAM block 802(0) provides the 12-bit row index I0 of its highest-priority match to input 0 of multiplexer 1202(0), where it is concatenated with the block index from memory element 1204(0) to generate the device index for CAM block 802(0). The match flag MF_0 is asserted to logic high to indicate the match condition. In response thereto, inverter 106 provides a logic low or "0" select signal to multiplexer 1202(0), which in turn forwards the device index from CAM block 802(0) to the next multiplexer 1204(1). The logic high MF_0 signal causes multiplexer 1204(1) to select input 1, and thus forwards the device index from CAM block 802(0) to the next multiplexer 1202(2). MF_0 ripples through OR gates 1208 and 1210 and causes multiplexers 1202(2) and 1202(3) to output the device index from CAM block 802(0) as I_sys.

Maintaining equivalent values in corresponding memory elements 1006(0)–1006(3) and 1204(0)–1204(3) ensures addressing consistency between read or write operations and compare operations. For instance, in one embodiment where all CAM blocks 802(0)–802(3) are non-defective or otherwise enabled, memory elements 1204(0)–1204(3) store values of "00", "01", "10" and "11", respectively. In this manner, "00" is added to row index I0 so that the first 1k addresses are mapped to the first block 802(0), "01" is added to row index I1 so that the second 1k addresses are mapped to the second block 802(1), "10" is added to row index I2 so that the third 1k addresses are mapped to the third block 802(2), and "11" is added to row index I3 from block 802(3) so that the fourth 1k addresses are mapped to the fourth block 802(3).

The block indexes stored in memory elements 1204(0)–1204(3) may be changed when address space in one or more CAM blocks 802 is translated to maintain addressing consistency. For example, in one embodiment where CAM block 802(0) is defective, CAM blocks 802(1)–802(3) may be configured to operate as a 3k CAM array as described above with respect to address translation logic 1000 (FIG.

11) by setting block address values or their binary equivalents of "0", "1" and "2" into memory elements 1006(1), 1006(2), and 1006(3), respectively. This configures CAM block 802(1) to have the highest-priority address space, i.e., addresses 0 to k−1, CAM block 802(2) to have the next highest-priority address space, i.e., k to 2k−1, and CAM block 802(3) to have the lowest-priority address space, i.e., addresses 2k to 2k−1.

In accordance with present embodiments, the block indexes stored in memory elements 1204(0)–1204(3) are modified to reflect address translations facilitated in address translation logic 1000. Since CAM block 802(0) is disabled (and thus does not require address space), the block indexes of the remaining enabled CAM blocks 802(1)–802(3) may be modified to re-assign block priority in the CAM device 800. For example, the block index stored in memory element 1204(1) may be set to "00" so that when concatenated with row index I1 from the highest-priority CAM block 802(1), the resultant device index corresponds to the highest-priority address space, i.e., addresses 0 to k−1. Similarly, the block indexes stored in memory elements 1204(2) and 1204(3) may be modified to "01" and "10", respectively, to reflect address spaces k to 2k−1 and 2k to 3k−1, respectively. Since in this embodiment addresses larger than 3k are not used, the block index stored in memory element 1204(0), which corresponds to the defective CAM block 802(0), may be set to "11" so that disabled CAM block 802(0) is not addressed. Note that the match flag signal for a disabled CAM block will be set to a low logic state.

CAM Device Having Intra-Row Configurability

A CAM system having intra-row configurability is disclosed in reference to FIGS. 13–58. The intra-row configurability enables a single CAM array to be configured to operate in one of many different width and depth configurations. For example, a CAM array having Y rows of CAM cells each having Z row segments of W CAM cells can be configured into n different ZY/n depth by nW width configurations, where n is an integer from 1 to Z. For example, the CAM array can be configured as ZY rows of W cells when n=1, as ZY/2 rows of 2W cells when n=2, and so on up to Y rows of ZW cells when n=Z. A user can select or program one of the configurations by loading specific configuration information into the CAM system. This single CAM system can be configured to store and maintain many different desired table configurations. The CAM system may also be used to store and maintain multiple tables of different sizes. For example, a first section of the CAM array may be configured such that each row in the section has a first number of row segments, while a second section of the CAM array may be configured such that each row in that section has a different number of row segments.

Figure 13:
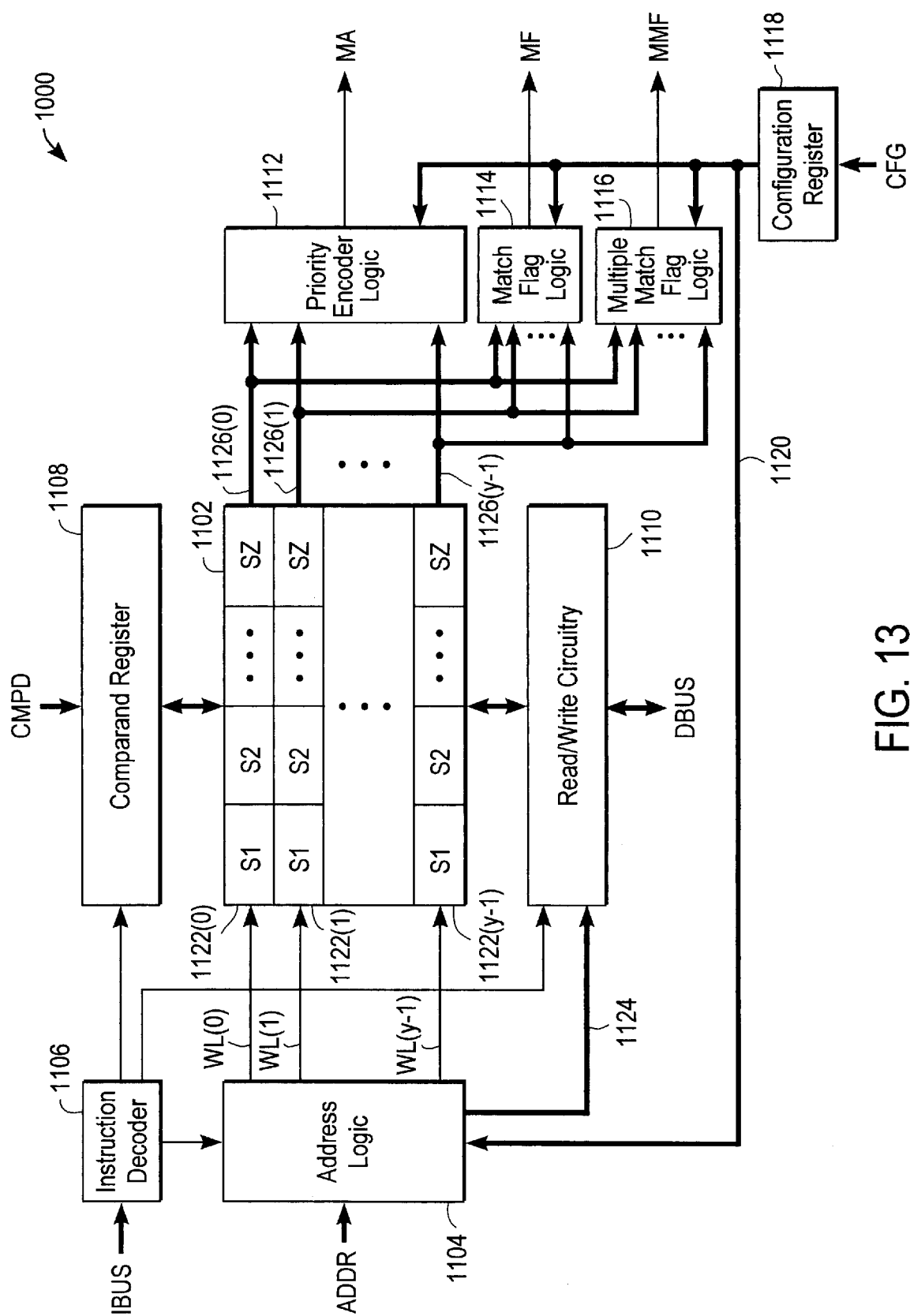
FIG. 13 is a block diagram of one embodiment of a configurable CAM system according to the present invention including a CAM array, comparand register, configuration register, address logic, read/write circuitry, an instruction decoder, priority encoder logic, match flag logic, and multiple match flag logic.

FIG. 13 is one embodiment of a CAM system 1100 according to the present invention. CAM system 1100 includes a CAM array 1102 that includes Y rows 1122(0)-1122(Y−1) of CAM cells each segmented into Z row segments S1-SZ of W CAM cells each, where W, Y, and Z are any integer numbers. The W CAM cells that may be any type of CAM cells including binary and ternary CAM cells. One or more of the row segments may also include a different number of CAM cells.

CAM array 1102 can be configured into n different ZY/n width by nW depth configurations, where n is an integer from 1 to Z. For one embodiment, Y=1024 (1k) rows, Z−4 segments, and W−72 cells per segment. These values for W, Y, and Z will be used throughout this application for example purposes only. For one example, the CAM array can be configured to operate in three different configurations: (1) 1k×288, (2) 2k×144, and (3) 4k×72 thus enabling a single CAM array to store and maintain a different table size in each different mode of operation.

For other embodiments, the CAM array can be configured on a row-by-row or section-by-section basis to store data words of ×72, ×144 or ×288 bits that span one or more rows of the CAM array. For example, a first half of the CAM array may be configured as 512×288, the next quarter configured as 512×144 and the final quarter configured as 1k×72. This flexibility allows the CAM system to store and maintain multiple tables of different sizes.

Configuration information CFG is used to program CAM system 1100 to operate CAM array 1102 in one of the multiple array configurations. The configuration information includes one or more signals that indicate the operating configuration of the CAM array and the CAM system. For example, a separate configuration or control signal may be associated with each configuration of the system. The configuration information may be stored in configuration register 1118 and subsequently provided over bus 1120 to address logic 1104, priority encoder logic 1112, match flag logic 1114 and/or multiple match flag logic 1116. Alternatively, configuration register 1118 may be omitted and the configuration information provided directly to one or more of the various circuit blocks. For another embodiment, the configuration information may be provided as part of read, write or compare instructions on the instruction bus IBUS to instruction decoder 1106.

Instruction decoder 1106 decodes various instructions provided on instruction bus IBUS. The instructions may include instructions to write data to one or more row segments of the CAM array, read data from one or more row segments of the CAM array, and to compare comparand data with one or more row segments of the CAM array. The comparand data may be provided on the comparand bus CBUS and stored in comparand register 1108 or directly provided to CAM array 1102. The CAM system may also include one or more global mask registers (not shown) for the comparand data provided to the CAM array 1102.

The instruction decoder provides various control signals to the address logic, read/write circuitry, and comparand register to control when the CAM system performs one of the operations. Additionally, the instruction decoder may provide one or more control signals to CAM array 1102, priority encoder logic 1112, match flag logic 1114, multiple match flag logic 1116, and configuration register 1118 to enable these circuits to perform their associated functions at an appropriate time. For an alternative embodiment, instruction decoder 1106 may be omitted and various read, write and compare control signals may be provided directly to one or more of the circuit blocks.

Reading and Writing Data

Data can be communicated with the various row segments using address logic 1104 and read/write (data access) circuitry 1110. Address logic 1104 uniquely addresses one row segment or a group of row segments in response to the configuration information and an input address provided on address bus ADDR. The address logic decodes the input address and outputs a decoded row address and a decoded segment address. The decoded row address enables one of the rows of CAM cells via word lines WL(0)-WL(Y−1), and the decoded segment address is provided on bus 1124 to the read/write circuitry to selectively enable one or more of the row segments to communicate data with the data bus DBUS. The configuration information provided to address logic 1104 determines whether the decoded segment address provided to the read/write circuitry enables one row segment to communicate with the data bus, or enables a group of row segments to communicate with the data bus. For example, when the CAM array is configured in ZY (rows)×W (cells) mode (e.g., 4k×72), each decoded segment address uniquely addresses one row segment of a selected row such that data can be written to or read from a particular row segment by asserting the corresponding word line and enabling the row segment to communicate with DBUS through read/write circuitry 1110. When the CAM array is configured in other configurations, each decoded segment address uniquely addresses a group of row segments. Data may be simultaneously communicated with the entire group of row segments, or data may be communicated on a segment-by-segment basis within the addressed group.

Figure 14:
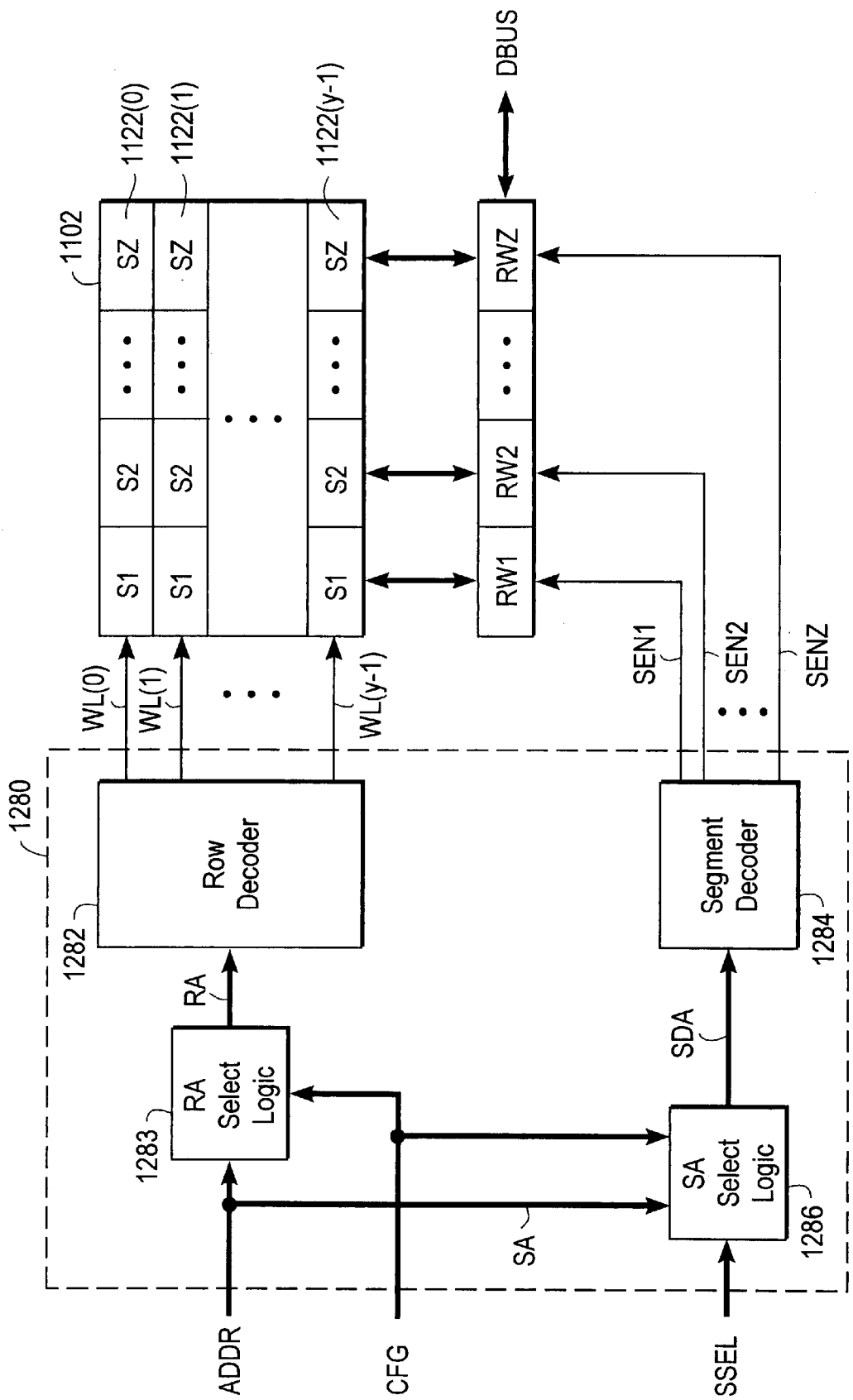
FIG. 14 is a block diagram of one embodiment of the address logic of FIG. 13 including a row decoder, row address select logic, segment address select logic, and a segment decoder.

FIG. 14 shows address logic 1280 that is one embodiment of address logic 1104 of FIG. 13. Address logic 1280 includes row decoder 1282, row address (RA) select logic 1283, segment decoder 1284, and segment address (SA) select logic 1286. Row decoder 1282 receives and decodes row address RA to select and enable one of the word lines WL(0)-WL(Y-1). The word lines are each connected to all of the row segments of one of the corresponding rows 1122(0)-1122(Y-1). When a word line is enabled, data may be written to or read from a CAM cell in a conventional manner. For an alternative embodiment, each row segment may be connected to its own word line. In response to the configuration information, RA select logic 1283 determines which address signals of an input address on ADDR are provided as RA to the row decoder.

Segment decoder 1284 receives and decodes the segment decoder input address SDA to select and enable one of segment enable lines SEN1-SENZ. Each segment enable line selectively enables a corresponding read/write circuit RW1-RWZ to communicate data between the DBUS and a corresponding row segment S1-SZ, respectively, of the selected row of CAM cells. Each read/write circuit includes conventional read and write circuits such as sense amplifiers and data drivers.

Segment decoder 1284 receives SDA from SA select logic 1286. In response to the configuration information on bus 1120, SA select logic 1286 determines SDA from the segment address SA provided on address bus ADDR, the segment select signals SSEL, or from a combination of both. The segment address uniquely identifies the address of a row segment or a group of row segments for a selected row of CAM cells. The segment select signals may be used to uniquely address and access one of the row segments within an addressed group of row segments.

Figure 15:
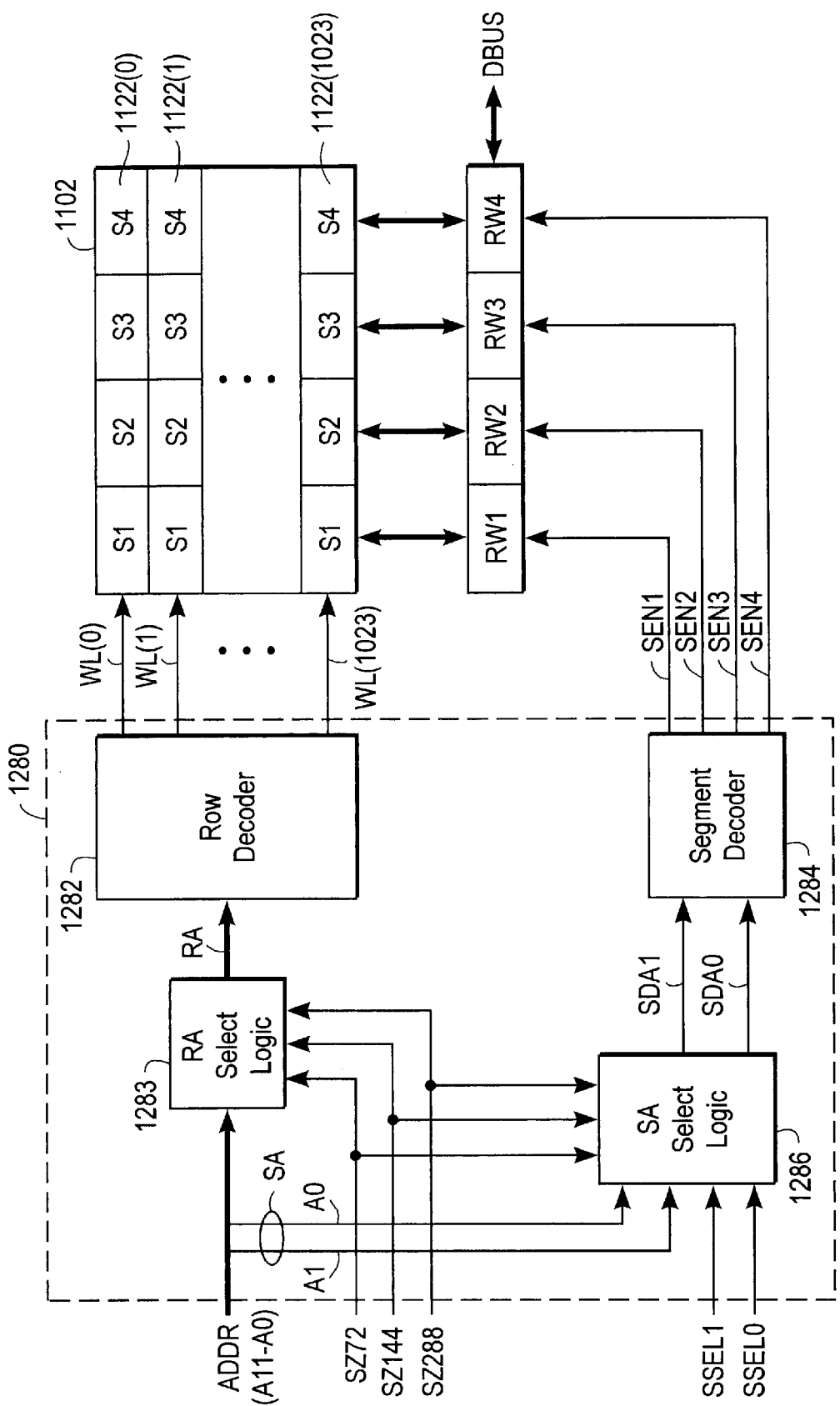
FIG. 15 is one example of the address logic of FIG. 14 for particular configurations of the CAM system.

The operation of address logic 1280 is further illustrated in FIG. 15 in which CAM array has Y=1024 rows 1122(0)-1122(1023), Z=4 row segments S1-S4 per row, and each row segment having W=72 CAM cells. Other configurations may be used. The CAM array may be configured to operate in three different modes in response to the configuration signals SZ72, SZ144 and SZ288. When SZ72 is enabled, the CAM array operates in a 4k×72 mode; when SZ144 is enabled, the CAM array operates in a 2k×144 mode; and when SZ288 is enabled, the CAM array operates in a 1k×288 mode. A summary of the inputs address signals, RA, SA, SDA and SEN1–SEN4 used and generated for this example is shown in the truth tables of FIGS. 16 and 17.

The input address on the address bus has twelve bits A11-A0. In the 4k×72 mode, all twelve bits A11-A0 are used to uniquely address each of the 4k row segments in CAM array 1102. Bits A11-A2 are selected by RA select logic 1283 and are used as the row address for row decoder 1282 to select one of the CAM rows; and bits A1-A0 are provided to SA select logic 1286 and used to select one of the row segments for a selected row of cells. In this mode, SZ72 is enabled and SA select logic 1286 provides A1 and A0 as SD1 and SD0, respectively, to segment decoder 1284. A1 and A0 are decoded by segment decoder 1284 to generate SEN1-SEN4 and select a particular row segment in a selected row of cells for communication.

In the 2k×144 mode, eleven bits A10-A0 are used to uniquely address each of the 2k groups of row segments in CAM array 1102. Each group of row segments includes two row segments. The most significant bit A11 does not participate in addressing a group of row segments. Bits A10-A1 are selected by RA select logic 1283 as the row address and are used by row decoder 1282 to select one of the CAM rows; and bit A0 is provided to SA select logic 1286 and used to select one of the groups of row segments for a selected row of cells. In this mode, SZ144 is enabled and SA select logic 1286 provides A0 as SD1 to segment decoder 1284, and provides SSEL0 as SD0 to segment decoder 1284. A0 and SSEL0 are decoded by segment decoder 1284 to generate SEN1–SEN4 and select for communication a particular group of row segments in a selected row of cells in response to A0, and to select for communication a particular row segment in the selected group in response to SSEL0. Thus, if an input address of 0000000000001 is provided as A11-A0, respectively, to address the group of row segments S3–S4 of row 1122(0), A10-A1 will address row 1122(0), A0 will address row segment S3, and SSEL0 can be used select row segment S4.

In the 1k×288 mode, ten bits A9-A0 are used to uniquely address each of the 1k groups of row segments in CAM array 1102. Each group of row segments includes four row segments (i.e., an entire row). The most significant bits A11-A10 do not participate in addressing a group of row segments. Bits A9-A0 are selected by RA select logic 1283 as the row address and are used by row decoder 1282 to select one of the CAM rows. In this mode, SZ288 is enabled and SA select logic 1286 provides SSEL1 and SSEL0 as SD1 and SD0, respectively, to segment decoder 1284. SSEL1 and SSEL0 are decoded by segment decoder 1284 to generate SEN1–SEN4 and select a particular row segment in a selected row of cells for communication. Thus, if an input address of 0000000000001 is provided as A11-A0, respectively, to address the group of row segments S1-S4 of row 1122(1), A9-A0 will address row 1122(1), and SSEL1 and SSEL0 can be used to select each of row segments S1-S4.

Figure 18A:
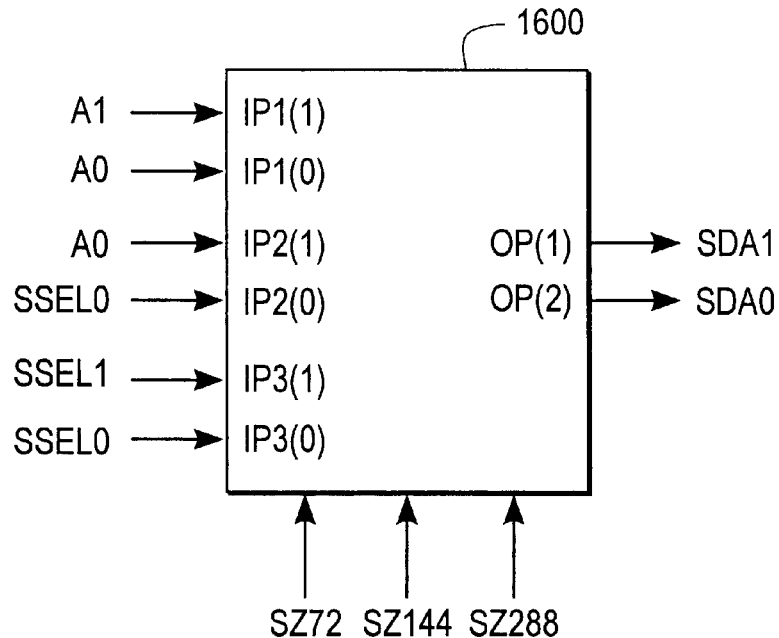
FIG. 18A is a logic diagram of one embodiment of the segment address select logic of FIG. 15.

FIG. 18A shows multiplexer 1600 that is one embodiment of SA select logic 1286 of FIG. 15. Other embodiments may be used for SA select logic 1286. Multiplexer 1600 includes three input ports IP1, IP2, and IP3 for receiving A1 and A0, A0 and SSEL0, and SSEL1 and SSEL0, respectively. When SZ72 is enabled, A1 and A0 are provided to the output port as SDA1 and SDA0. When SZ144 is enabled, A0 and SSEL0 are provided to the output port as SDA1 and SDA0. Finally, when SZ288 is enabled, SSEL1 and SSEL0 are provided to the output port as SDA1 and SDA0. For other embodiments, SA select logic 1286 may be implemented such that A1 and A0 are logically ANDed with SZ72, A0 and SSEL0 are logically ANDed with SZ144, SSEL1 and SSEL0 are logically ANDed with SZ288, and the results of the AND functions are logically ORed together to provide SEN1–SEN4.

Figure 18B:
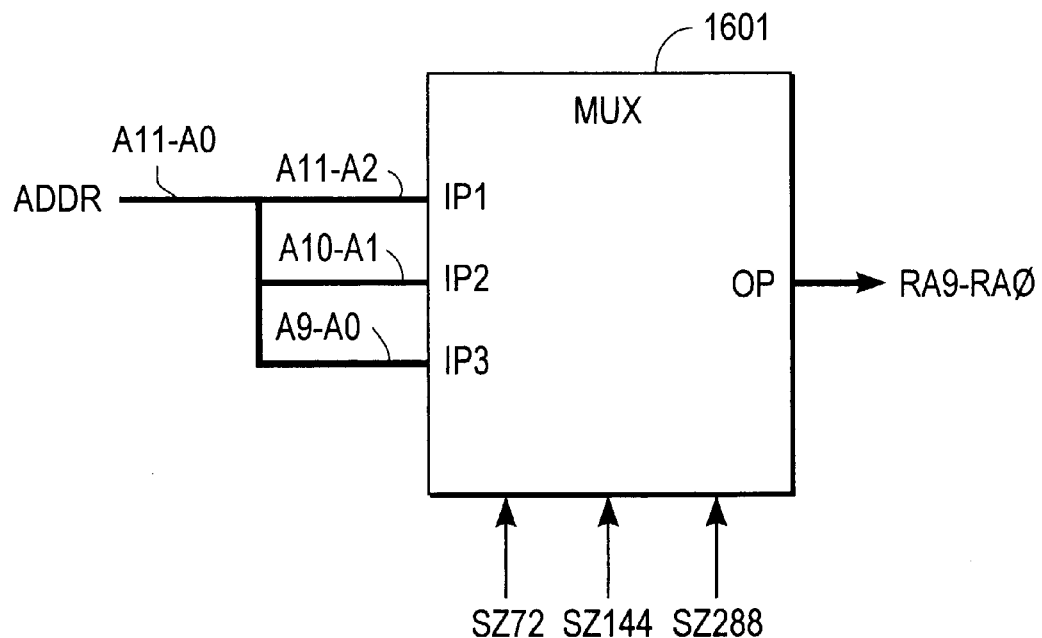
FIG. 18B is a logic diagram of one embodiment of the row address select logic of FIG. 15.

FIG. 18B shows multiplexer 1601 that is one embodiment of RA select logic 1283 of FIG. 15. Other embodiments may be used for RA select logic 1286. Multiplexer 1601 includes three input ports IP1, IP2, and IP3 for receiving A11-A2, A10-A1 and A9-A0, respectively. When SZ72 is enabled, A11-A2 are provided to the output port as RA9-RA0. When SZ144 is enabled, A10-A1 are provided to the output port as RA9-RA0. Finally, when SZ288 is enabled, A9-A0 are provided to the output port as RA9-RA0. For other embodiments, RA select logic 1283 may be implemented such that each of A11-A2 is logically ANDed with SZ72, each of A10-A1 is logically ANDed with SZ144, each of A9-A0 is logically ANDed with SZ288, and the results of the AND functions are logically ORed together to provide RA9-RA0.

FIG. 15 illustrates a particular example of the operation of decoder 1280 for a particular number of possible CAM array configurations. The method used in the example of FIG. 15 can be readily extended to accommodate any number of configurations of any size CAM array having any number of row segments each having any number of CAM cells. For example, a CAM array having more row segments can be accommodated by supplying more address bits (SA), select signals, and configuration signals to SA select logic 1286 (and/or RA select logic 1283), and increasing the number of SDA bits, the size of segment decoder 1284 and the number of segment enable signals. In general, the row address will have $\log_2 Y$ bits to select one of the Y word lines, and the SA address, SSEL and SDA will each have up to $\log_2 Z$ bits to address one of the Z segment enable lines.

Figure 19:
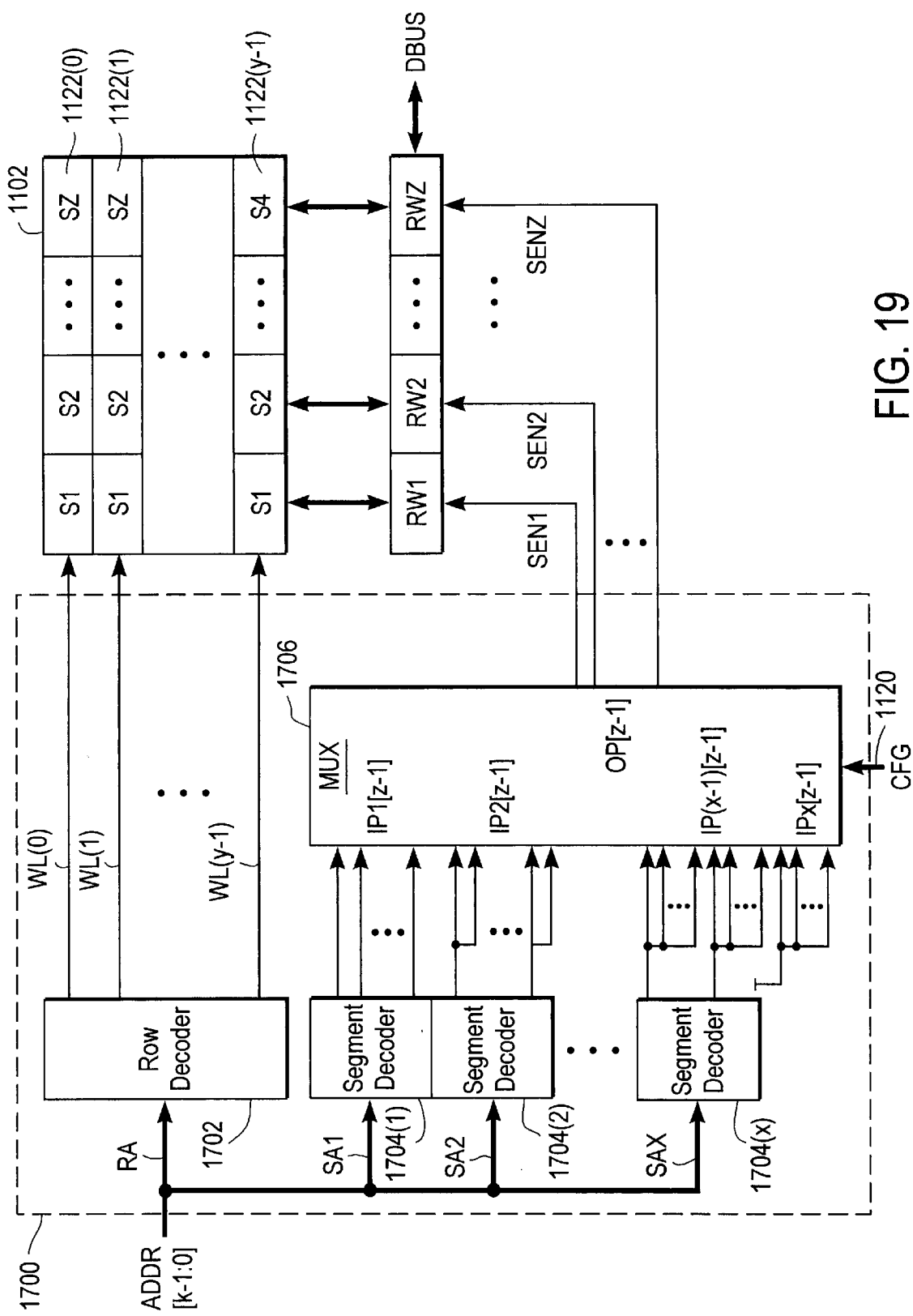
FIG. 19 is block diagram of another embodiment of the address logic of FIG. 13 including a row decoder, segment decoders, and a multiplexer.

FIG. 19 shows address logic 1700 that is another embodiment of address logic 1104 of FIG. 13. Address logic 1700 includes a row decoder 1702, segment decoders 1704(1)-1704(x), and multiplexer 1706. Row decoder 1702 receives and decodes row address RA to select and enable one of the word lines WL(0)-WL(Y−1). Segment decoders 1704(1)-1704(x) each receive and decode a corresponding segment address SA1-SAx to select and enable one or more of the segment enable lines SEN1-SENZ. The decoded segment addresses are provided to input ports IP1-IP(x−1) of multiplexer 1706 and selectively provided to SEN1-SENZ in response to the configuration information on bus 1120. The last input port IPx has all of its inputs connected to a logic one state.

Each segment address SA1-SAx has a different number of address bits of the input address on address bus ADDR. For example, in ZY×W mode, row address RA uses $\log_2 Y$ of the most significant address bits to address one of the rows of CAM cells, and SA1 includes $\log_2 Z$ of the least significant address bits such that segment decoder 1704(1) generates Z signals. Multiplexer 1706 provides the Z signals as SEN1-SENZ in response to the configuration information indicating the ZY×W mode. Note that the total number of address bits of the input address on ADDR equals the sum of $\log_2 Y$ and $\log_2 Z$.

In ZY/2×2W mode, each pair of row segments is uniquely addressable. In this mode, row address RA uses $\log_2 Y$ of the most significant address bits to address one of the rows of CAM cells. Input address bit 0 is ignored (e.g., set to a zero logic state) and the balance of the least significant address bits are used for SA2 (i.e., $\log_2(Z/2)$ bits) such that segment decoder 1704(2) generates Z/2 signals. The Z/2 signals are used for every other input of input port IP2. Each decoded signal is duplicated to provide the other inputs for input port IP2 as shown in FIG. 19. The signals are duplicated to simultaneously enable a pair of segment enable signals and simultaneously communicate data with a pair of uniquely addressable row segments. Multiplexer 1706 provides the Z signals as SEN1-SENZ in response to the configuration information indicating the ZY/2×2W mode.

Each successive SA, associated with additional configurations, has one fewer address bit until SAx provides a single address bit to the last segment decoder 1704(x) associated with mode ZY/(Z−1)×(Z−1)W. In this mode, segment decoder outputs two decoded signals. The first decoded signal is duplicated for the first Z/2 inputs to input port IP(x−1) to simultaneously enable SEN1-SEN(Z/2) for a selected row, and the second decoded signal is duplicated for the second Z/2 inputs to input port IP(x−1) to simultaneously enable SEN(Z/2)-SENZ for a selected row. The last input port IPx is associated with Y×ZW mode, and has all inputs tied to a high logic state to enable all of the segment enable signals and address an entire row of row segments with in this mode.

Figure 20:
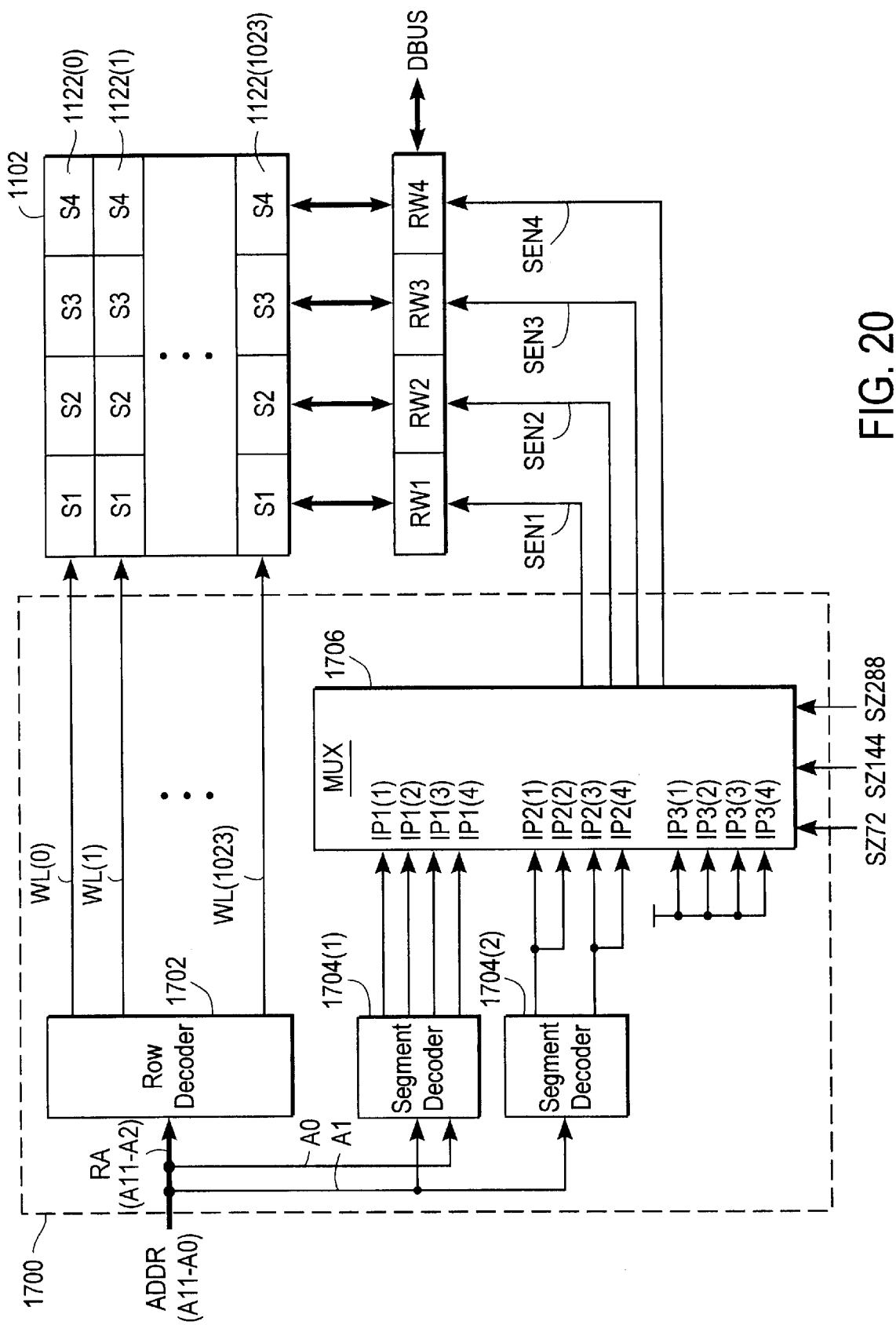
FIG. 20 is one example of the address logic of FIG. 19 for particular configurations of the CAM system.

The operation of address logic 1700 is further illustrated in FIG. 20 in which CAM array has Y=1024 rows 1122(0)-1122(1023), Z=4 row segments S1-S4 per row, and each row segment having W=72 CAM cells. Other configurations may be used. The CAM array may be configured to operate in three different modes in response to the configuration signals SZ72, SZ144 and SZ288.

In the 4k×72 mode, all twelve bits A11-A0 on address bus ADDR are used to uniquely address each of the 4k row segments in CAM array 1102. The most significant ten bits A11-A2 are used as the row address for row decoder 1702 to select one of the CAM rows, and bits A1-A0 are decoded by 2-to-4 segment decoder 1704(1) to select one of the row segments for a selected row of cells. In this mode, SZ72 is enabled and multiplexer 1706 provides the output of segment decoder 1704(1) to segment enables lines SEN1–SEN4.

In the 2k×144 mode, eleven bits A11-A1 are used to uniquely address each of the 2k groups of row segments in CAM array 1102. Each group of row segments includes two row segments. The most significant ten bits A11-A2 are used as the row address for row decoder 1702 to select one of the CAM rows, and bit A1 is decoded by 1-to-2 segment decoder 1704(1) to select one pair of the row segments for a selected row of cells. The least significant bit A0 does not participate in addressing a group of row segments. In this mode, SZ144 is enabled and multiplexer 1706 provides the input signals on input port IP2 to segment enables lines SEN1-SEN4. Thus, if an input address of 000000000001 is provided as A11-A0, respectively, to address the group of row segments S3-S4 of row 1122(0), A11-A2 will address row 1122(0), and SEN3 and SEN4 will enable simultaneous communication with row segments S3 and S4.

In the 1k×288 mode, ten bits A11-A2 are used to uniquely address each of the 1k groups of row segments in CAM array 1102. Each group of row segments includes four row segments (i.e., an entire row). The most significant ten bits A11-A2 are used as the row address for row decoder 1702 to select one of the CAM rows. In response to SZ288, multiplexer 1706 provides the logic one states of input port IP3 to SEN1–SEN4. This enables an entire selected row to simultaneously communicate with the data bus. The least significant bits A1 and A0 do not participate in addressing a group of row segments.

Loading the Comparand Data

With reference again to FIG. 13, comparand data may be compared with the data stored in one or more of the row segments in array 1102. The comparand data may be provided on comparand bus CBUS and stored in comparand register 1108, or provided directly to array 1102 for comparison.

For one embodiment, the width of the CBUS is the same as the total number of CAM cells in a row of CAM cells (i.e., ZW bits). When the system is configured in ZY×W mode, Z copies of the comparand data can be loaded into the comparand register for comparison with each of the Z segments in each row 1122. Similarly, in the ZY/2×2W mode, Z/2 copies of the comparand data can be loaded into the comparand register. This methodology can be used until in the Y×ZW mode, the comparand data is as wide (has as many bits) as an entire row 1122.

Figure 21:
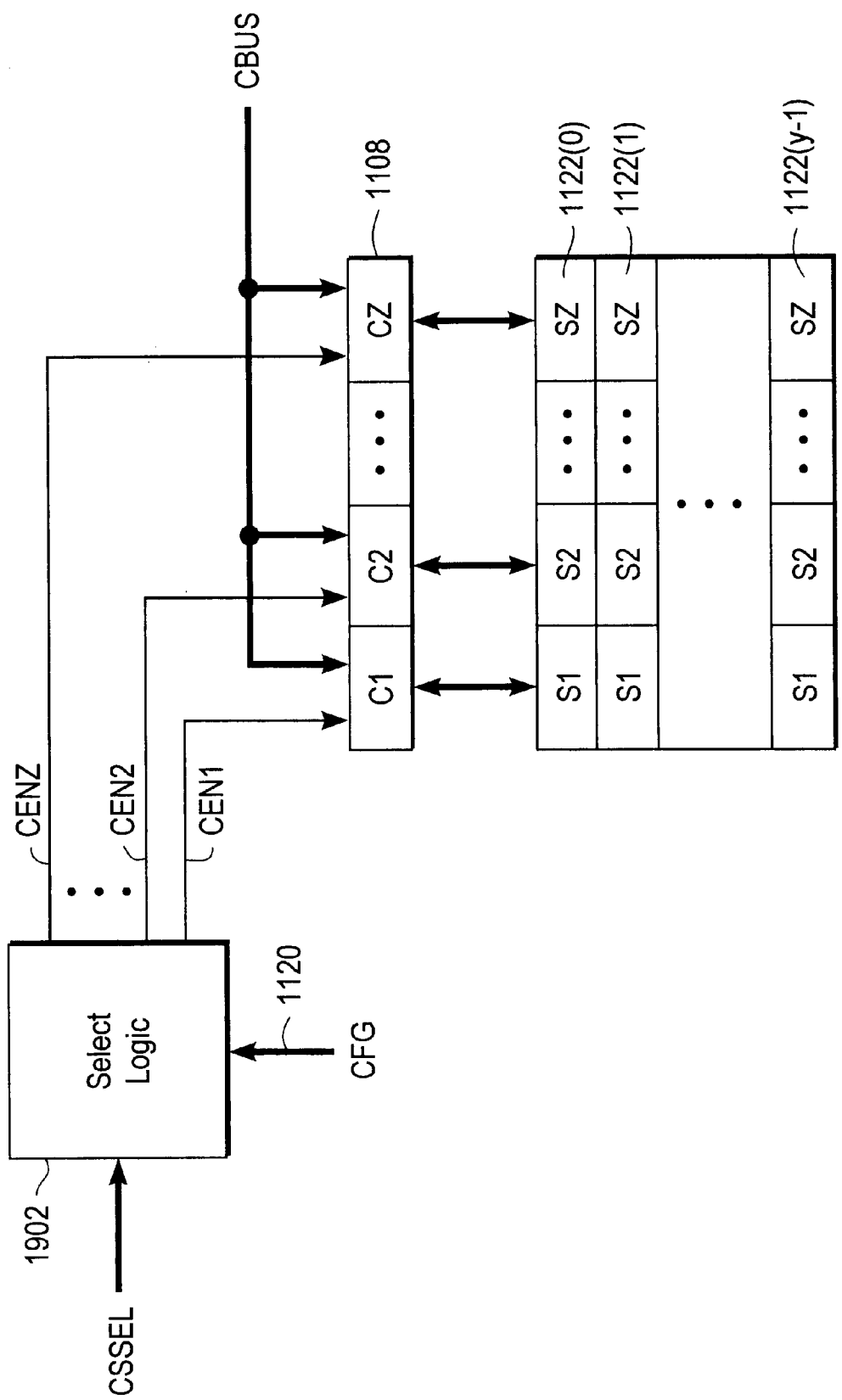
FIG. 21 is a block diagram of one embodiment of circuitry to load comparand data into the comparand register.

For other embodiments, the CBUS may have a smaller number of bits than the total number of bits for the rows 1122. For one example, the width of the CBUS may be the same as the number of CAM cells in a row segment (i.e., W bits) and the comparand data sequentially and successively provided to each of the row segments S1-SZ for comparison. The comparand register may be segmented into Z segments each corresponding to one of the Z row segments in each of rows 1122 as shown in FIG. 21. Comparand data can be separately loaded into each of the segments C1-CZ of the comparand register by enabling signals CEN1-CENZ, respectively. Select logic 1902 generates the enable signals in response to the comparand segment select signals CSSEL and the configuration information. The CSSEL signals may be generated by the instruction decoder 1106 in response to a compare instruction, or may be separately generated by the user. When the system is configured in ZY×W mode, the CSSEL signals cause select logic 1902 to enable all CEN signals such that the same comparand data is simultaneously written into all of C1-CZ. In the ZY/2×2W mode (i.e., two row segments per group), the CSSEL signals cause select logic 1902 to enable the odd CEN signals CEN1, CEN3, etc. such that the same first portion of comparand data is written into the first comparand segments associated with the first row segments S1, S3, etc. In a subsequent cycle, the CSSEL signals cause select logic 1902 to enable the even CEN signals CEN2, CEN4, etc. such that the same second portion of comparand data is written into the second comparand segments associated with the second row segments S2, S4, etc. The first and second portions of comparand data together form the entire (2W) comparand data. This methodology continues until in the Y×ZW mode, the 1122 CEN signals are sequentially enabled to consecutively load each portion (W) of the ZW comparand data into one of the Z comparand segments. The operation of this embodiment is further illustrated by the example of FIG. 22.

Figure 22:
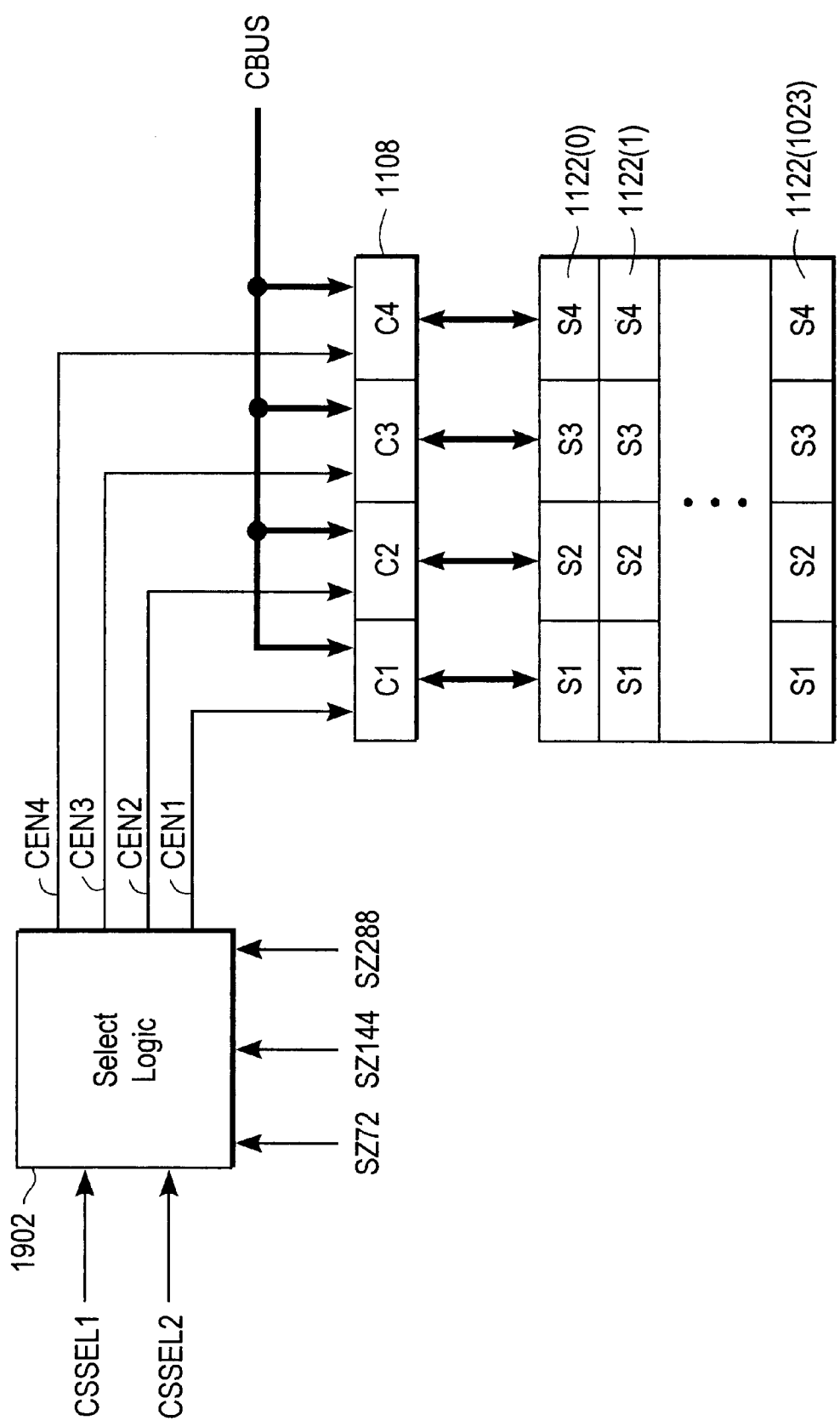
FIG. 22 is one example of the logic of FIG. 21 for particular configurations of the CAM system.

FIG. 22 shows an example in which the CAM array has Y=1024 rows 1122(0)-1122(1023), Z=4 row segments S1-S4 per row, and each row segment has W=72 CAM cells. The CBUS is also 72 bits wide and provides 72-bit comparand data to each of comparand segments C1-C4 under the control of enable signals CEN1-CEN4, respectively. Select logic 1902 generates the enable signals in response to CSSEL1 and CSSEL0 and the configuration signals SZ72, SZ144 and SZ288. The truth table for the operation of select logic 1902 for this embodiment is shown in FIG. 23. When SZ72 is enabled, the CAM array operates in a 4k×72 mode, and CEN1-CEN4 are all enabled to simultaneously load the same 72-bit comparand data from the CBUS. When SZ144 is enabled, the CAM array operates in a 2k×144 mode and CSSEL0 determines which CEN signals are enabled. First, C1 and C3 are enabled to receive a first portion of the comparand data when CSSEL is in a logic zero state. Subsequently, C2 and C4 are enabled to receive a second portion of the comparand data when CSSEL0 is in a logic one state. When SZ288 is enabled, the CAM array operates in a 1k×288 mode and both CSSEL1 and CSSEL0 determine when each of the CEN signals are enabled to receive comparand data. In this mode, select logic 1902 operates as a 2-to-4 decoder.

Figure 24:
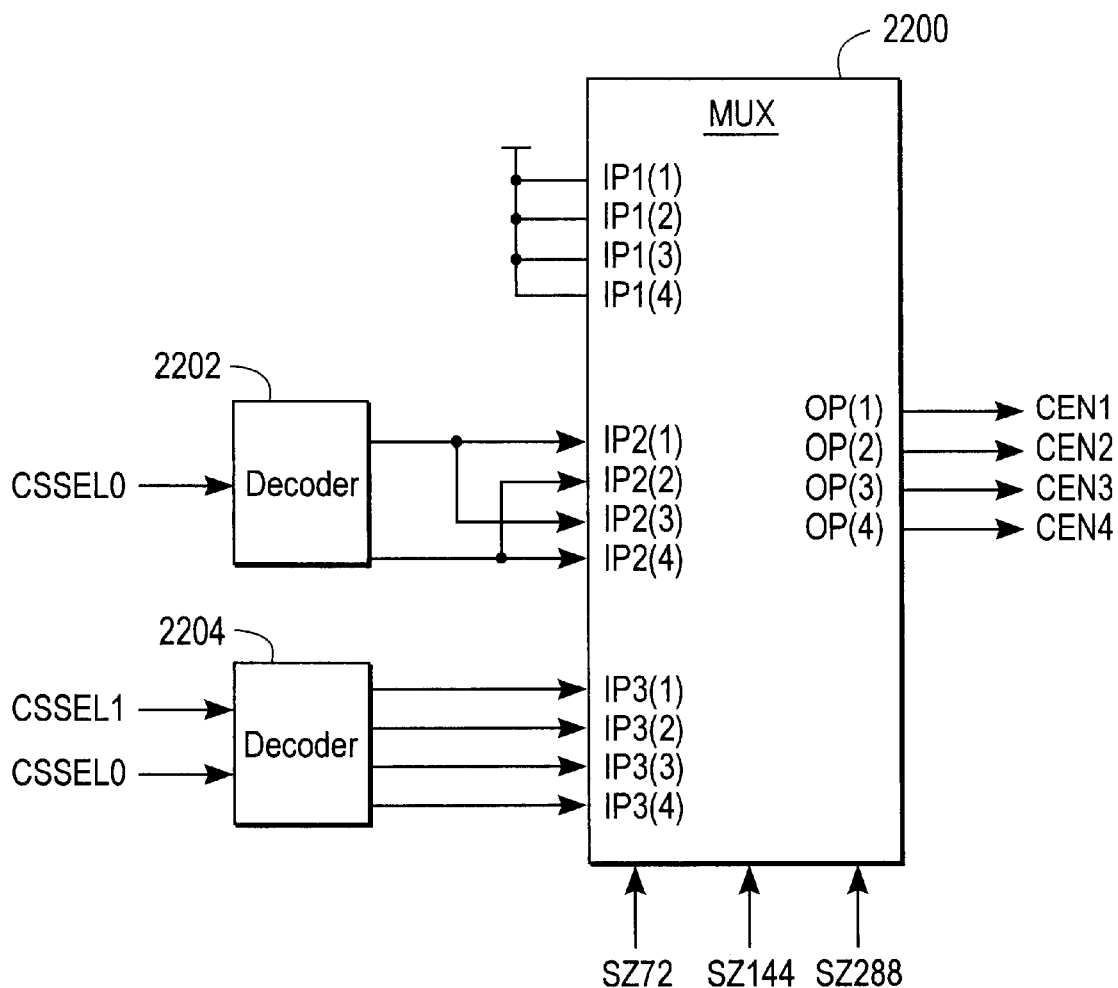
FIG. 24 is a logic diagram of one embodiment of the select logic for the truth table of FIG. 23.

FIG. 24 shows multiplexer 2200 that is one embodiment of select logic 1902 of FIG. 22 for implementing the truth table of FIG. 23. Other embodiments may be used. Multiplexer 2200 includes three input ports IP1, IP2, and IP3, an output port OP, and receives the configurations signals as select signals. Input port IP1 has all its inputs connected to a logic one state. Input port IP2 has its inputs coupled to 1-to-2 decoder 2202. Decoder 2202 decodes CSSEL0 and has its first decoded output connected to IP2(1) and IP2(3), and has its second decoded output connected to IP2(2) and IP2(4). Input port 3 has its inputs coupled to the outputs of 2-to-4 decoder 2204. Decoder 2204 decodes CSSEL1 and CSSEL0. When SZ72 is enabled, IP1 provides all logic one states to the output port to enable CEN1-CEN4. When SZ144 is enabled, the inputs of IP2 are provided to the output port. When SZ288 is enabled, the inputs of IP3 are provided to the output port.

Figure 25:
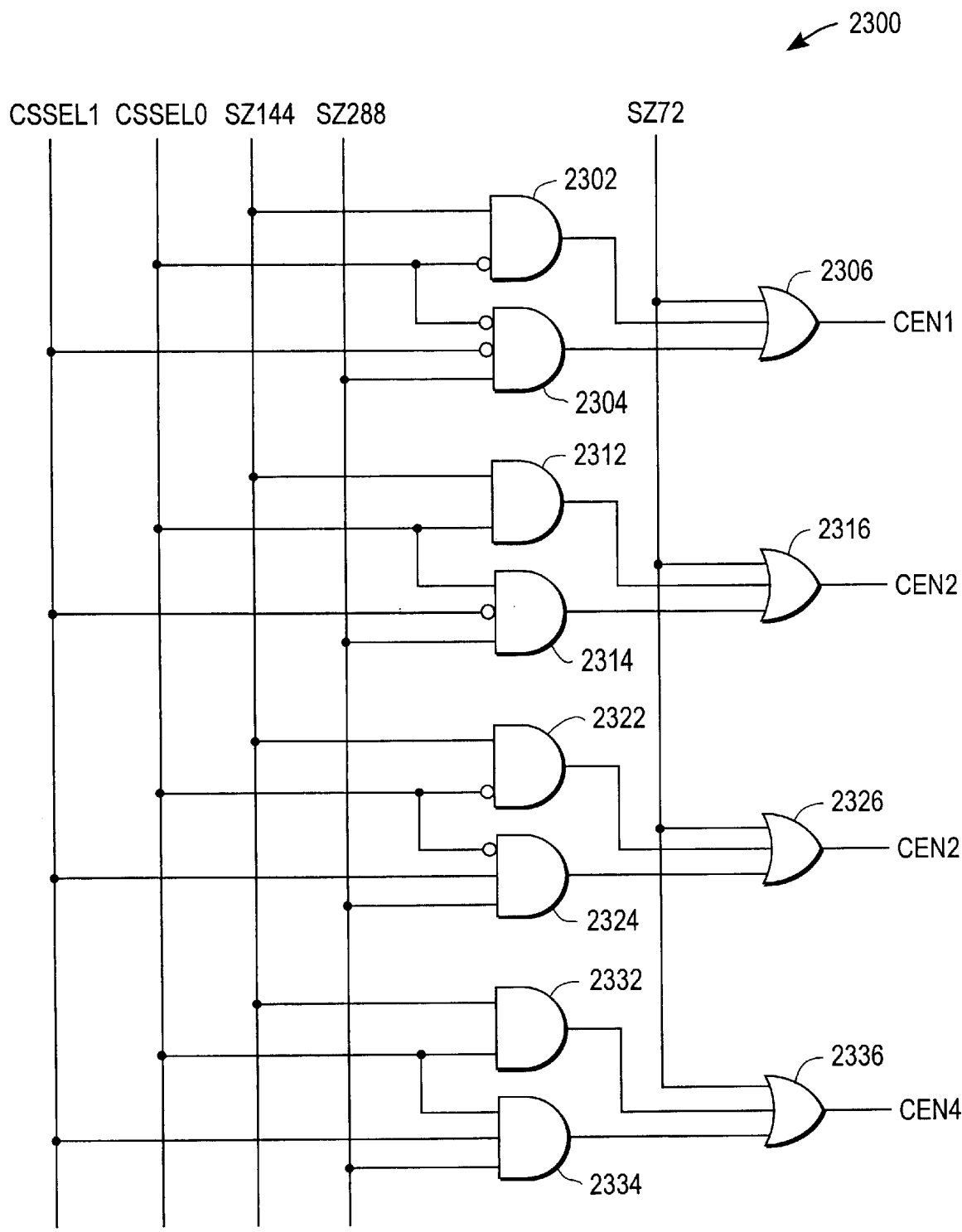
FIG. 25 is a logic diagram of another embodiment of the select logic for the truth table of FIG. 23.

FIG. 25 shows another embodiment of select logic 1902 of FIG. 22 using AND/OR logic. Other embodiments may be used. Select logic 2300 includes a separate AND/OR circuit to generate the CEN signals in response to CSSEL1, CSSEL0, SZ72, SZ144 and SZ288 in accordance with the truth table of FIG. 23. For example, AND gates 2302 and 2304, and OR gate 2306 generate CEN1. AND gate 2302 has a first input coupled to SZ144, a second input coupled to the logical complement of CSSEL0, and an output coupled to an input of OR gate 2306. AND gate 2304 has a first input coupled to SZ288, a second input coupled to the logical complement of CSSEL0, a third input coupled to the logical complement of CSSEL1, and an output coupled to another input of OR gate 2306. OR gate 2306 also receives SZ72 and outputs CEN1. AND gates 2312 and 2314, and OR gate 2316 generate CEN2. AND gate 2312 has a first input coupled to SZ144, a second input coupled to CSSEL0, and an output coupled to an input of OR gate 2316. AND gate 2314 has a first input coupled to SZ288, a second input coupled to CSSEL0, a third input coupled to the logical complement of CSSEL1, and an output coupled to another input of OR gate 2316. OR gate 2316 also receives SZ72 and outputs CEN2. AND gates 2322 and 2324, and OR gate 2326 generate CEN3. AND gate 2322 has a first input coupled to SZ144, a second input coupled to the logical complement of CSSEL0, and an output coupled to an input of OR gate 2326. AND gate 2324 has a first input coupled to SZ288, a second input coupled to the logical complement of CSSEL0, a third input coupled to CSSEL1, and an output coupled to another input of OR gate 2326. OR gate 2326 also receives SZ72 and outputs CEN3. Similarly, AND gates 2332 and 2334, and OR gate 2336 generate CEN4. AND gate 2332 has a first input coupled to SZ144, a second input coupled to CSSEL0, and an output coupled to an input of OR gate 2336. AND gate 2334 has a first input coupled to SZ288, a second input coupled to CSSEL0, a third input coupled to CSSEL1, and an output coupled to another input of OR gate 2336. OR gate 2336 also receives SZ72 and outputs CEN4.

Match Flag

With reference again to FIG. 13, the comparand data may be compared with the data stored in one or more of the row segments in array 1102. Match results for comparison with each row segment are indicated on a corresponding match line segment. Each of the Z match line segments 1126(0)-1126(Y−1) for a row of CAM cells are provided to match flag logic 1114. The match flag logic generates a match flag signal MF indicative of when there is at least one match condition in array 1120 with the comparand data. Match flag logic 1114 is also responsive to the configuration information on bus 1120 such that MF is appropriately enabled for the corresponding configuration of system 1100. For example, when array 1102 is in ZY×W mode, match flag logic 1114 determines if the comparand data matches valid data stored in at least one row segment of array 1102. When array 1102 is configured in another mode utilizing groups of row segments (i.e., n greater than one for ZY/n×nW), match flag logic 1114 determines if the comparand data matches valid data stored in at least one group of row segments of array 1102.

Figure 26:
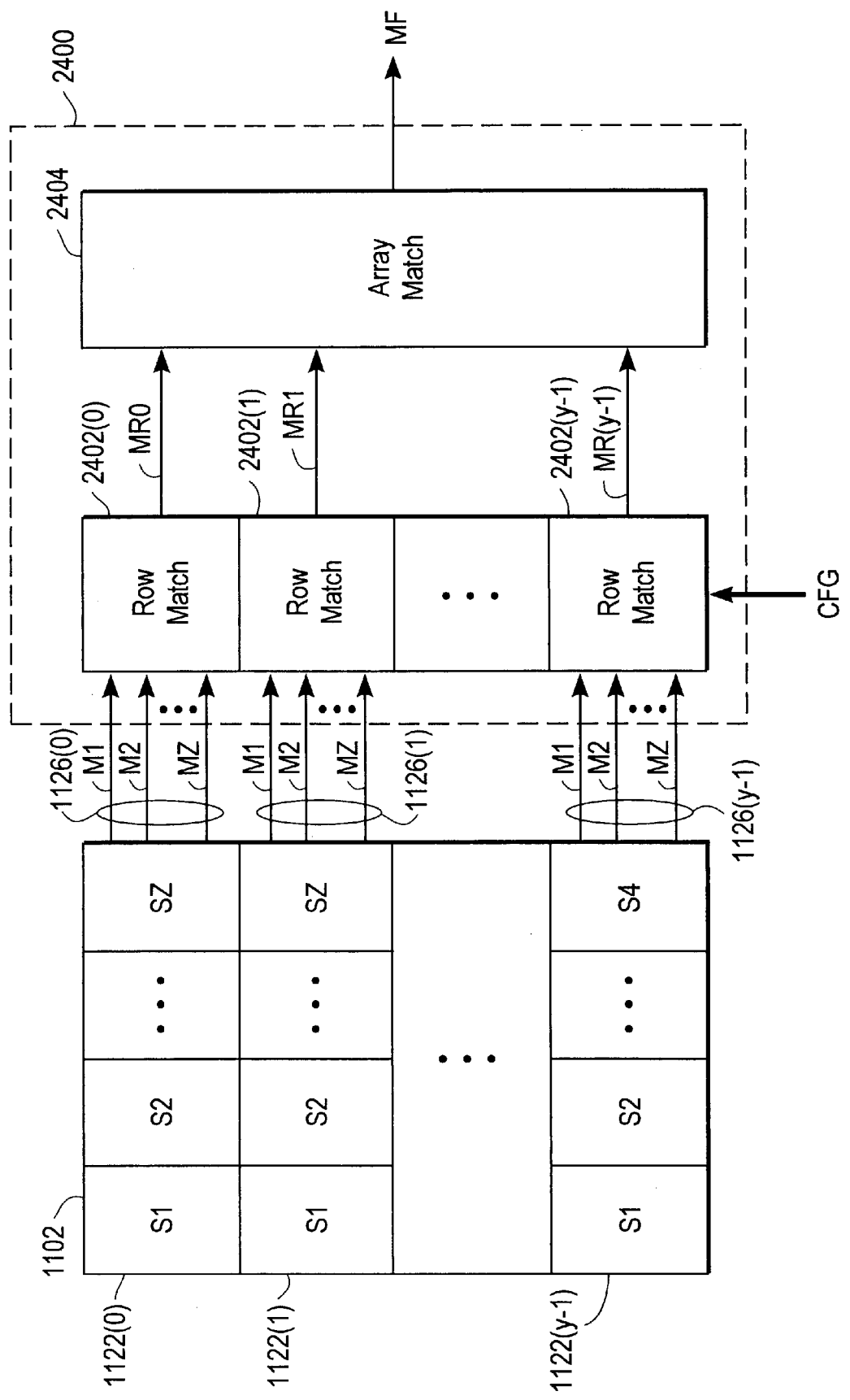
FIG. 26 is a block diagram of one embodiment of the match flag logic of FIG. 13 including row match circuits and an array match circuit.

FIG. 26 shows match flag logic 2400 that is one embodiment of match flag logic 1114 of FIG. 13. Match flag logic 2400 includes row match circuits 2402(0)-2402(Y−1) each associated with corresponding rows of CAM cells 1122(0)-1122(Y−1), respectively. Each row match circuit receives the match results from each of the match line segments M1-MZ of the corresponding row of CAM cells. In response to the match results on the match line segments and the configuration information, each row match circuit generates a row match signal MR. Each row match signal is indicative of whether one or more row segments (i.e., for ZY×W mode), or one or more groups of row segments (i.e., for ZY/n×nW mode, where n is greater than 1), for a corresponding row stores data that matches the comparand data for a particular configuration. The row match signals MR(0)-MR(Y−1) are then logically combined by array match circuit 2404 to generate MF for the entire array 1102. For one embodiment, array match circuit 2404 includes OR logic that logically ORs the states of the row match signals MR0-MR(Y−1).

Figure 27:
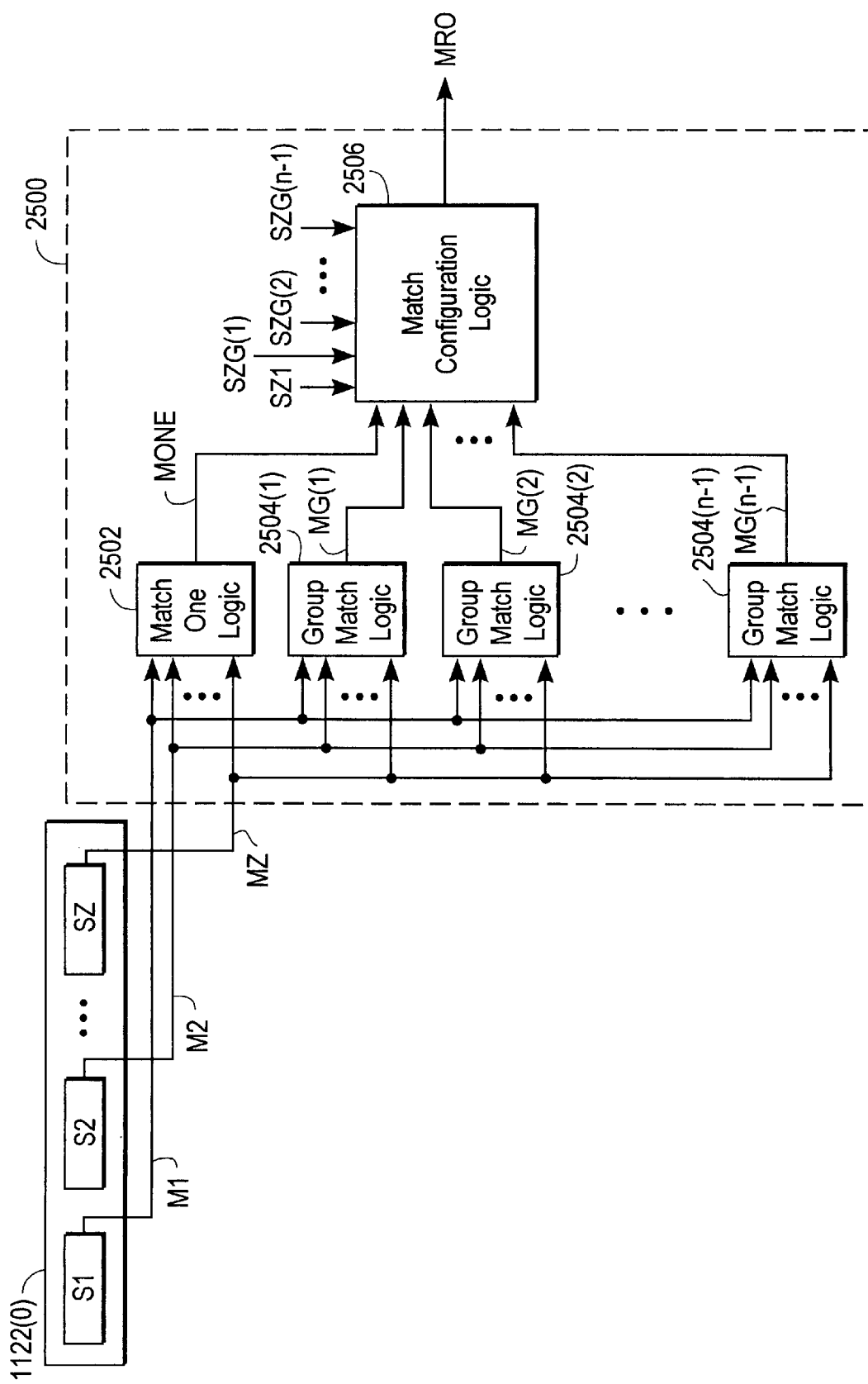
FIG. 27 is a block diagram of one embodiment of the row match circuits of FIG. 26 including match one logic, group match circuits, and match configuration logic.
Figure 28:
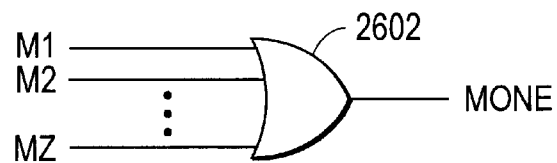
FIG. 28 is a logic diagram of one embodiment of the match one logic of FIG. 27.

FIG. 27 shows row match circuit 2500 that is one embodiment of row match circuit 2402(0) of FIG. 26. Row match circuit 2500 may be used for each row match circuit. Row match circuit 2500 includes match one logic 2502, group match logic circuits 2504(1)-2504(n−1), and match configuration logic 2506. Match one logic 2502 determines a match condition in row 1122(0) for the ZY×W mode. Match one logic 2502 receives each of the match line segments M1-MZ from row segments S1-SZ, respectively, and generates MONE indicative of whether any one row segment stores data that matches the comparand data. That is, match one logic 2502 determines when at least one of M1-MZ is enabled. When configuration signal SZ1 is enabled, match configuration logic 2506 outputs MONE as the row match signal MR0. For one embodiment, match one logic 2502 is an OR logic circuit 2602 that logically combines the logic states of M1-MZ to generate MONE as shown by OR gate 2602 in FIG. 28.

Figure 29A:
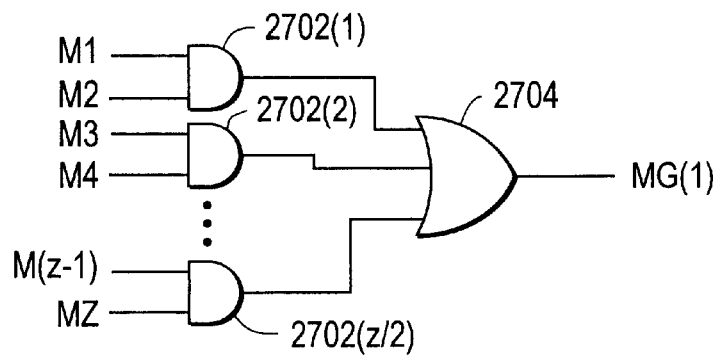
FIGS. 29A–29C are logic diagrams of embodiments of the group match circuits of FIG. 27.

Each group match logic circuit 2504(1)-2504(n−1) determines a match condition within row 1122(0) for a different configuration of the CAM system. Each group match logic circuit receives each of the match line segments M1-MZ from row segments S1-SZ, respectively, and logically combines unique groupings of the match line segments to generate group match signals MG(1)-MG(n−1). Each unique grouping corresponds to the number of row segments that are concatenated together to store data for a given configuration of array 1102. For one embodiment, there are n−1 groups of row segments, where n−1=2$^x$ and x is an integer from 1 to log$_2$Z, and where x is a unique number for each group match circuit. For example, in ZY/2×2W mode, the row segments in array 1102 are grouped by pairs. Group match logic circuit 2504(1) determines whether one or more pairs of match line segments M1 and M2, M3 and M4, etc. indicate a match condition. For this first grouping of match line segments, match configuration logic 2506 outputs MG(1) as MR0 when SZG(1) is enabled. One embodiment of group match logic 2504(1) is shown in FIG. 29A and includes Z/2 AND gates 2702(1)-2702(Z/2) each having two inputs coupled to a unique pair of match line segments. The outputs of AND gates 2702 are logically combined by OR gate 2704 to generate MG(1).

Figure 29B:
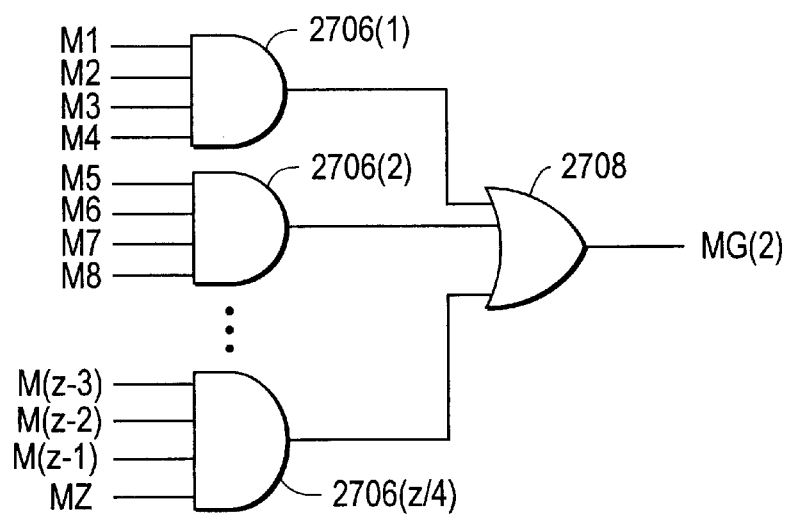
Figure 29C:
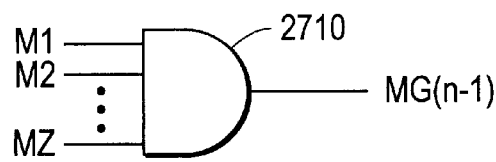

Similarly, in ZY/4×4W mode, the row segments in array 1102 are grouped four segments at a time. Group match logic circuit 2504(2) determines whether one or more quartets of match line segments M1-M4, M5-M7, etc. indicate a match condition. For this second grouping of match line segments, match configuration logic 2506 will output MG(2) as MR0 when SZG(2) is enabled. One embodiment of group match logic 2504(2) is shown in FIG. 29B and includes Z/4 AND gates 2706(1)-2706(Z/4) each having four inputs coupled to a unique, consecutive quartet of match line segments. The outputs of AND gates 2706 are logically combined by OR gate 2708 to generate MG(2).

This methodology continues until in Y×ZW mode, the row segments in array 1102 are grouped Z segments at a time. Group match logic circuit 2504(n−1) determines whether all of the match line segments M1-MZ for the row of CAM cells indicate a match condition. For this last grouping of match line segments, match configuration logic 2506 will output MG(n−1) as MR0 when SZG(n−1) is enabled. One embodiment of group match logic circuit is shows in FIG. 29C as an AND gate 2710 that combines M1-MZ and generates MG(n−1).

Figure 30:
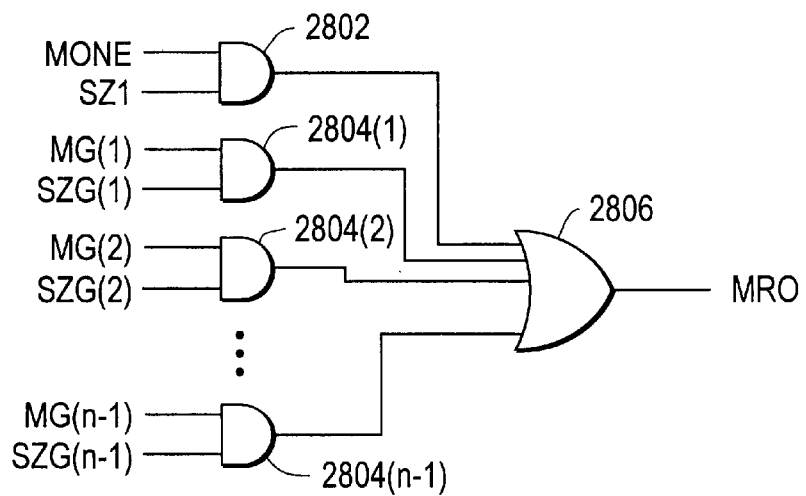
FIG. 30 is a logic diagram of one embodiment of the match configuration logic of FIG. 27.

FIG. 30 shows one embodiment of match configuration logic 2506 of FIG. 27. Other embodiments may be used. For this embodiment, AND gate 2802 determines whether both MONE and SZ1 are enabled, and provides the result to OR gate 2806. AND gates 2804(1)-2804(n−1) determine whether one of the group match signals MG(1)-MG(n−1) and a corresponding configuration signal SZG(1)-SZG(n−1) are enabled, and the results are provided to OR gate 2806. OR gate 2806 provides MR0. For another embodiment, match configuration logic 2506 may be a multiplexer with MONE and MG(1)-MG(n−1) as the inputs, the configuration signals as the select signals, and the row match signal as the output.

Figure 31:
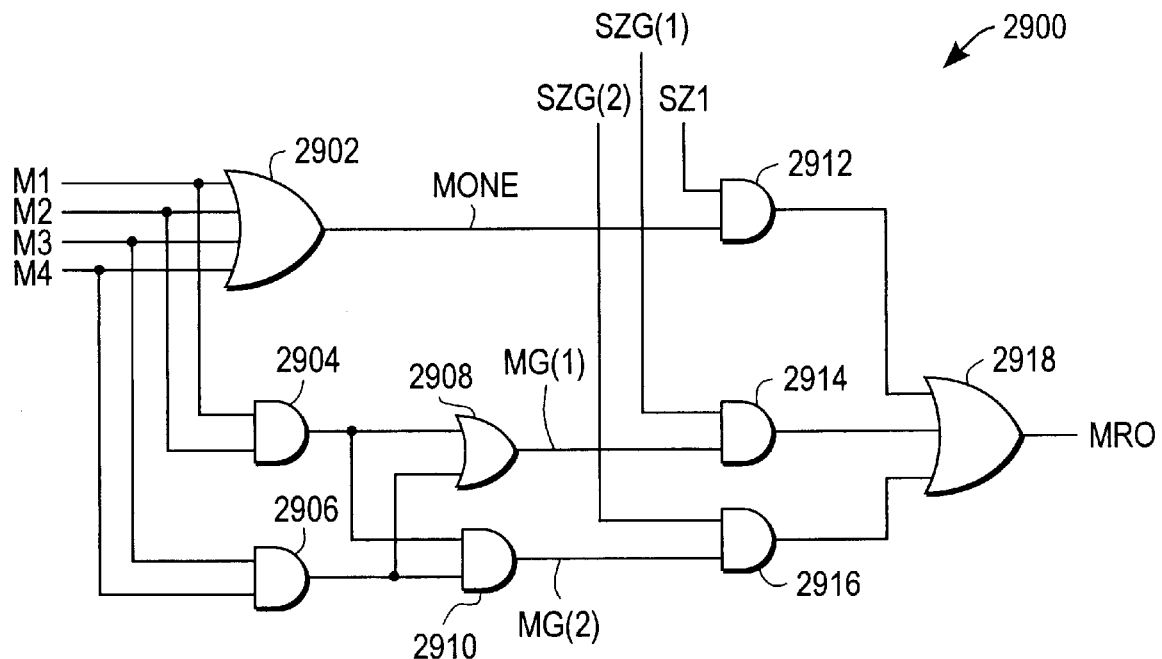
FIG. 31 is a logic diagram of one embodiment of the match flag logic of FIG. 13.

FIG. 31 shows row match circuit 2900 that is one embodiment of row match circuit 2500 of FIG. 27 for a CAM system having Z=4 row segments and four corresponding match line segments M1-M4. The match one logic is represented by OR gate 2902 that logically ORs each of the logic states of M1-M4 to generate MONE. This embodiment has two group match logic circuits. The first includes AND gates 2904 and 2906, and OR gate 2908. The second includes AND gates 2904, 2906, and 2910. AND gate 2904 is connected to M1 and M2, and AND gate 2906 is connected to M3 and M4. OR gate 2908 generates MG(1) by combining the outputs of AND gates 2904 and 2906, and AND gate 2910 generates MG(2) by combining the outputs of AND 2904 and 2906. The match configuration logic includes AND gates 2912, 2914, and 2916, and OR gate 2918. AND gates 2912, 2914, and 2916 logically combine SZ1 with MONE, SZG(1) with MG(1), and SZG(2) with MG(2), respectively, to provide inputs for OR gate 2918. OR gate 2918 provides MR0. Other embodiments may be used.

Figure 32:
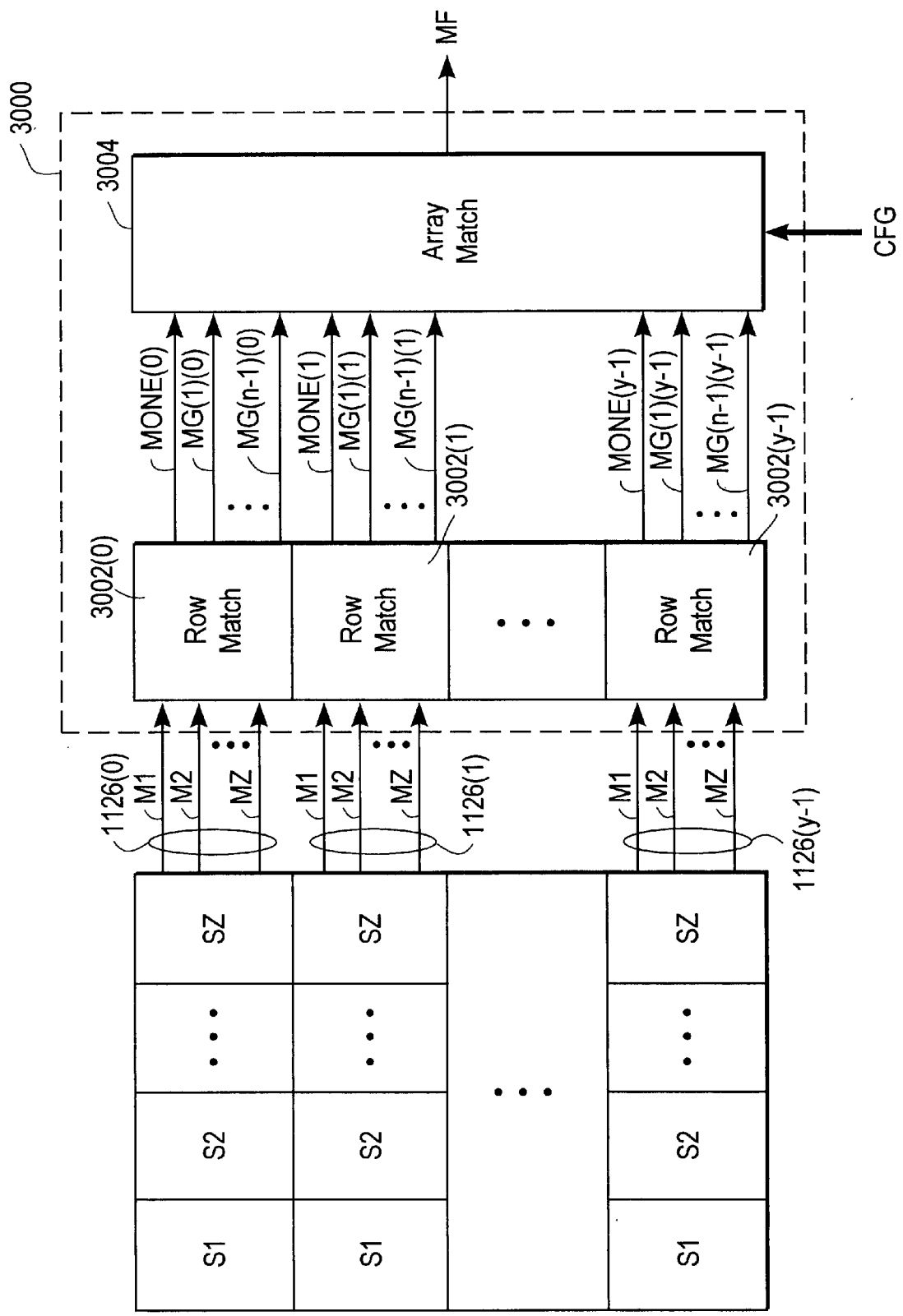
FIG. 32 is a block diagram of another embodiment of the match flag logic of FIG. 13 including row match circuits and an array match circuit.

FIG. 32 shows match flag logic 3000 that is another embodiment of match flag logic 1114 of FIG. 13. Match flag logic 3000 includes row match circuits 3002(0)-3002(Y−1) associated with corresponding rows of CAM cells 1122(0)-1122(Y−1), respectively. Each row match circuit 3002 includes the match one logic 2502 and group match logic circuits 2504(1)-2504(n−1) of FIG. 27, but excludes the match configuration logic 2506. Instead, MONE and the group match signals from each row match circuit are provided to array match circuit 3004. Array match circuit 3004 also receives the configuration information CFG and determines whether one or more row segments, or one or more groups of row segments, stores data that matches the comparand data for a particular configuration.

Figure 33:
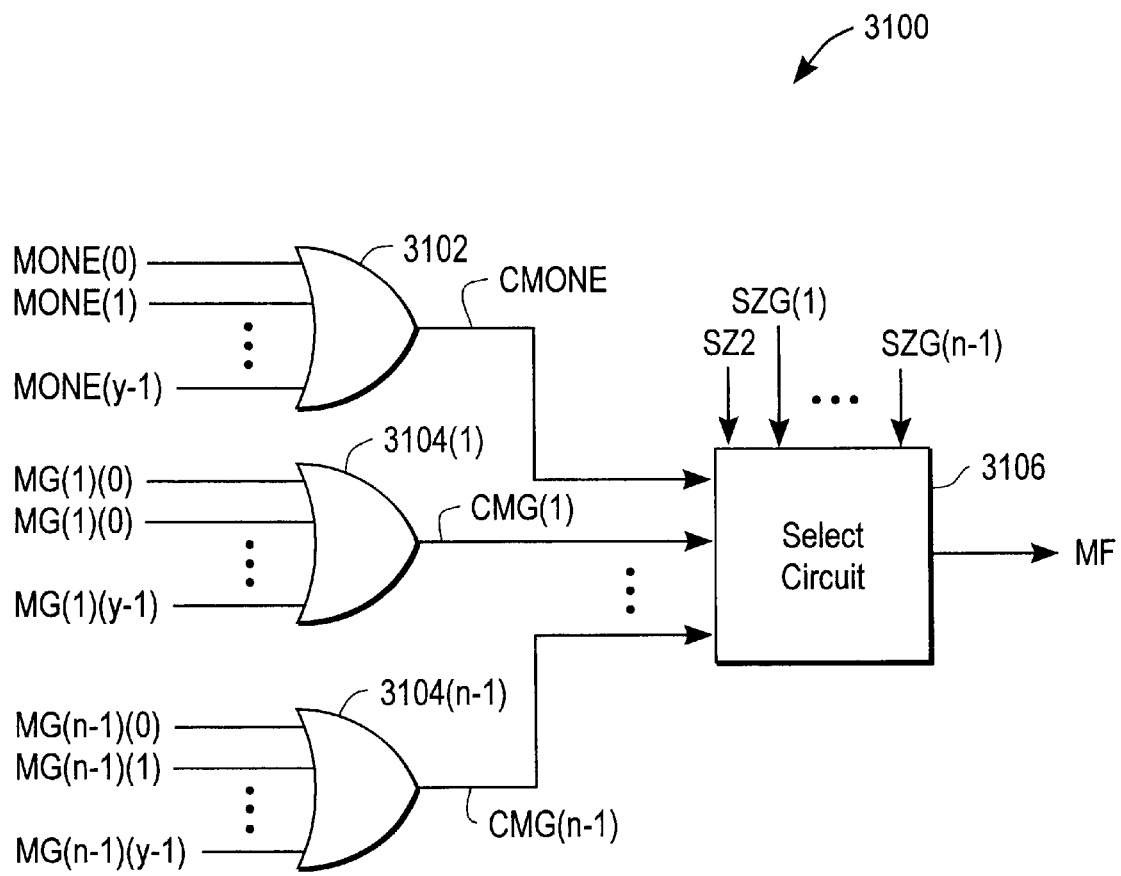
FIG. 33 is a block diagram of one embodiment of the array match circuit of FIG. 32 including OR logic and a select circuit.

FIG. 33 shows array match circuit 3100 that is one embodiment of array match circuit 3004 of FIG. 32. Array match circuit 3100 includes n OR logic circuits 3102 and 3104(1)-3104(n–1), and select circuit 3106. The n OR logic circuits generate n composite signals indicative of the match conditions for the possible configurations of array 1102. OR circuit 3102 logically combines the MONE signals MONE(0)-MONE(Y–1) from each row match circuit 3002(0)-3002(Y–1) to generate a composite signal CMONE. CMONE indicates a match condition for the ZY×W mode when any one row segment stores data that matches the comparand data. That is, OR circuit 3102 determines when at least one of M1-MZ from any of the CAM rows is enabled. Select logic 3106 outputs CMONE as MF when configuration signal SZ1 is enabled.

Each OR circuit 3104(1)-3104(n–1) determines a match condition for a different configuration of the CAM system. Each OR circuit 3104 logically combines the corresponding group match signals from each row match circuit 3002 to generate a composite group match signal CMG. For example, OR circuit 3104(1) combines MG(1)(0)-MG(1)(Y–1) to generate CMG(1) that indicates a match condition for a first grouping of row segments in ZY/2×2W mode, OR gate 3104(2) combines MG(2)(0)-MG(2)(Y–1) to generate CMG(2) that indicates a match condition for a second grouping of row segments in ZY/4×4W mode, and OR gate 3104(n–1) combines MG(n–1)(0)-MG(n–1)(Y–1) to generate CMG(n–1) that indicates a match condition for a grouping of Z row segments in Y×ZW mode. One of the composite group match signals is provided as MF by select logic 3106 in response to the corresponding configuration signal SZG(1)-SZG(n–1).

Figure 34:
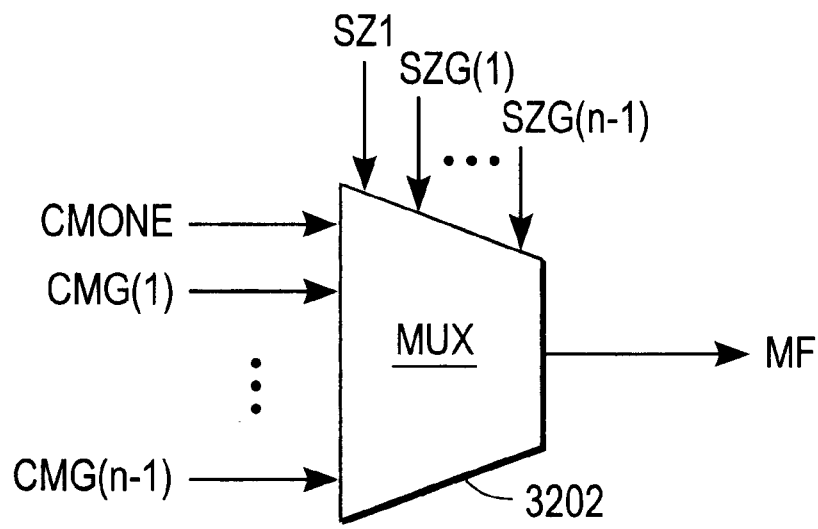
FIG. 34 is a logic diagram of one embodiment of the select logic of FIG. 33.

FIG. 34 shows one embodiment of select circuit 3106. For this embodiment, the select circuit is a multiplexer 3202 with CMONE and CMG(1)-CMG(n–1) connected to its input ports, the configuration signals used as the select signals, and MF connected to its output port.

Figure 35:
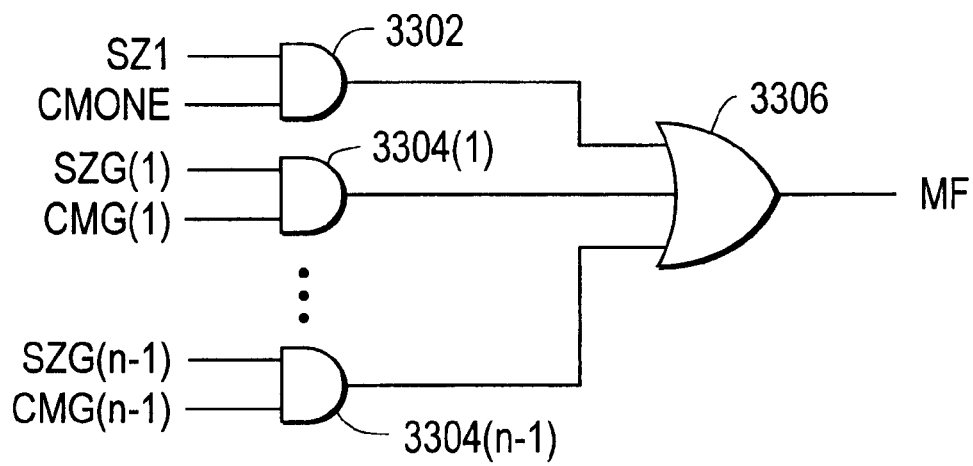
FIG. 35 is a logic diagram of another embodiment of the select logic of FIG. 33.

FIG. 35 shows another embodiment of select circuit 3106. For this embodiment, AND gate 3302 logically combines SZ1 and CMONE and provides the result to an input of OR Gate 3306. AND gates 3304(1)-3304(n–1) determine whether one of the composite group match signals CMG(1)-CMG(n–1) and a corresponding configuration signals SZG(1)-SZG(n–1) are enabled, and the results are provided to OR gate 3306. OR gate 3306 provides MF.

Figure 36:
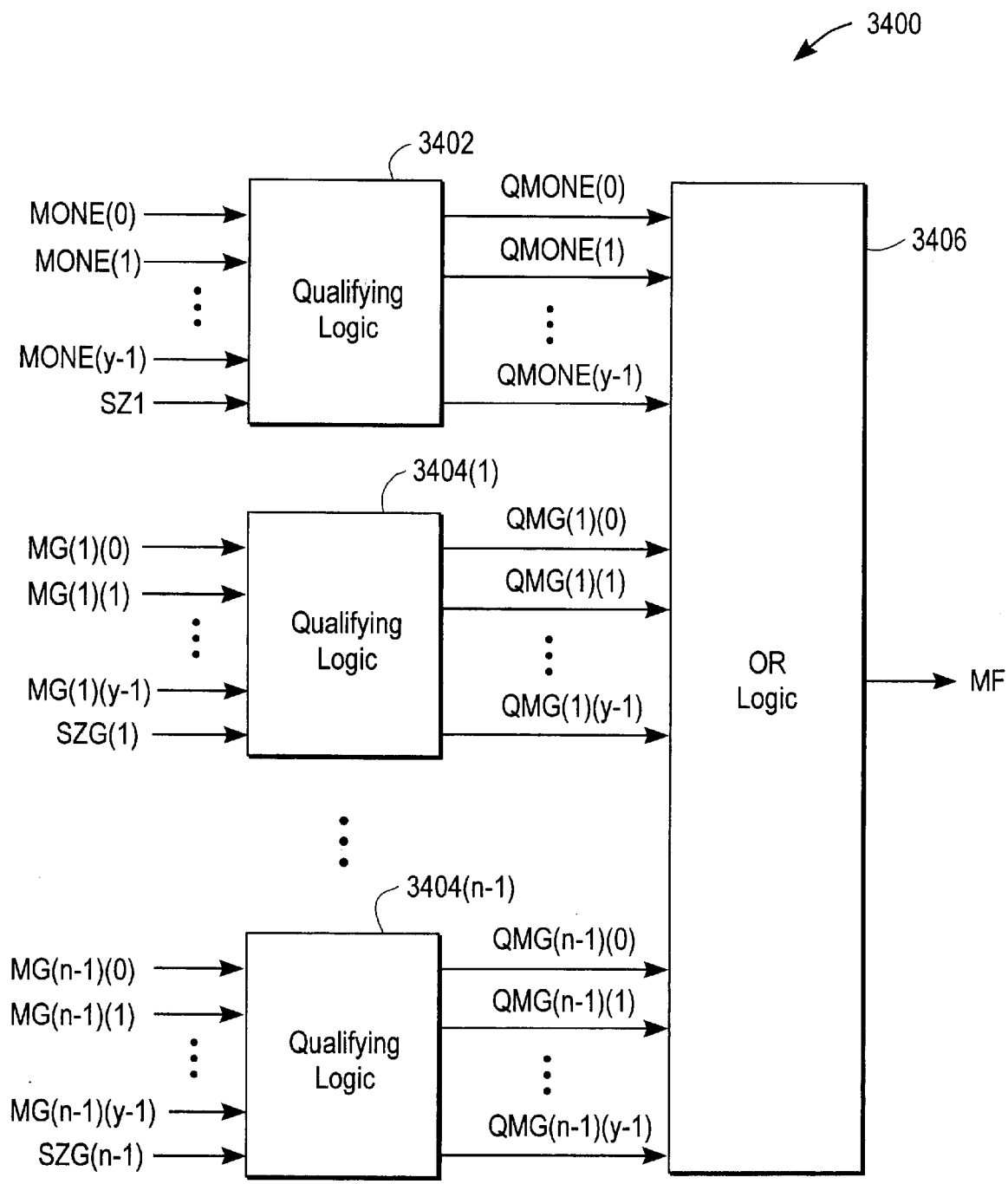
FIG. 36 is a block diagram of another embodiment of the array match circuit of FIG. 32 including qualifying logic circuits and OR logic.

FIG. 36 shows array match circuit 3400 that is another embodiment of array match circuit 3004 of FIG. 32. Array match circuit 3400 includes n qualifying logic circuits 3402 and 3404(1)-3404(n–1), and OR logic 3406. The n qualifying logic circuits generate n qualified signals that each indicate match conditions for within a row of CAM cells for the possible configurations of array 1102. Qualifying logic 3402 logically combines the MONE signals MONE(0)-MONE(Y–1) from each row match circuit 3002(0)-3002(Y–1), and qualifies the results with configuration signal SZ1 to generate qualified MONE signals QMONE(0)-QMONE(Y–1). One or more of the QMONE signals are enabled only when there is a match condition in a row segment for the ZY×W mode and SZ1 is enabled. If one of QMONE is enabled, select logic 3406 enables MF.

Each qualifying logic circuit 3404(1)-3404(n–1) determines a match condition for a different configuration of the CAM system. Each qualifying logic circuit 3404 logically combines the corresponding group match signals from each row match circuit 3402, and qualifies the results with corresponding group configuration signals to generate qualified group match signals QCMG. For example, qualifying logic 3404(1) combines MG(1)(0)-MG(1)(Y–1) with SZG(1) to generate QCMG(1)(0)-QCMG(1)(Y–1) that each indicate a match condition in a row of CAM cells for a first grouping of row segments only if SZG(1) is enabled (i.e., in the ZY/2×2W mode); qualifying logic 3404(2) combines MG(2)(0)-MG(2)(Y–1) with SZG(2)to generate QCMG(2)(0)-QCMG(2)(Y–1) that each indicate a match condition in a row of CAM cells for a second grouping of row segments only if SZG(2) is enabled (i.e., in the ZY/4×4W mode); and qualifying logic 3404(n–1) combines MG(n–1)(0)-MG(n–1)(Y–1) with SZG(n–1) to generate QCMG(n–1)(0)-QCMG(n–1)(Y–1) that each indicate a match condition for a grouping of Z row segments in the Y×ZW mode. If one of qualified group match signals is enabled, select logic 3406 enables MF.

Figure 37:
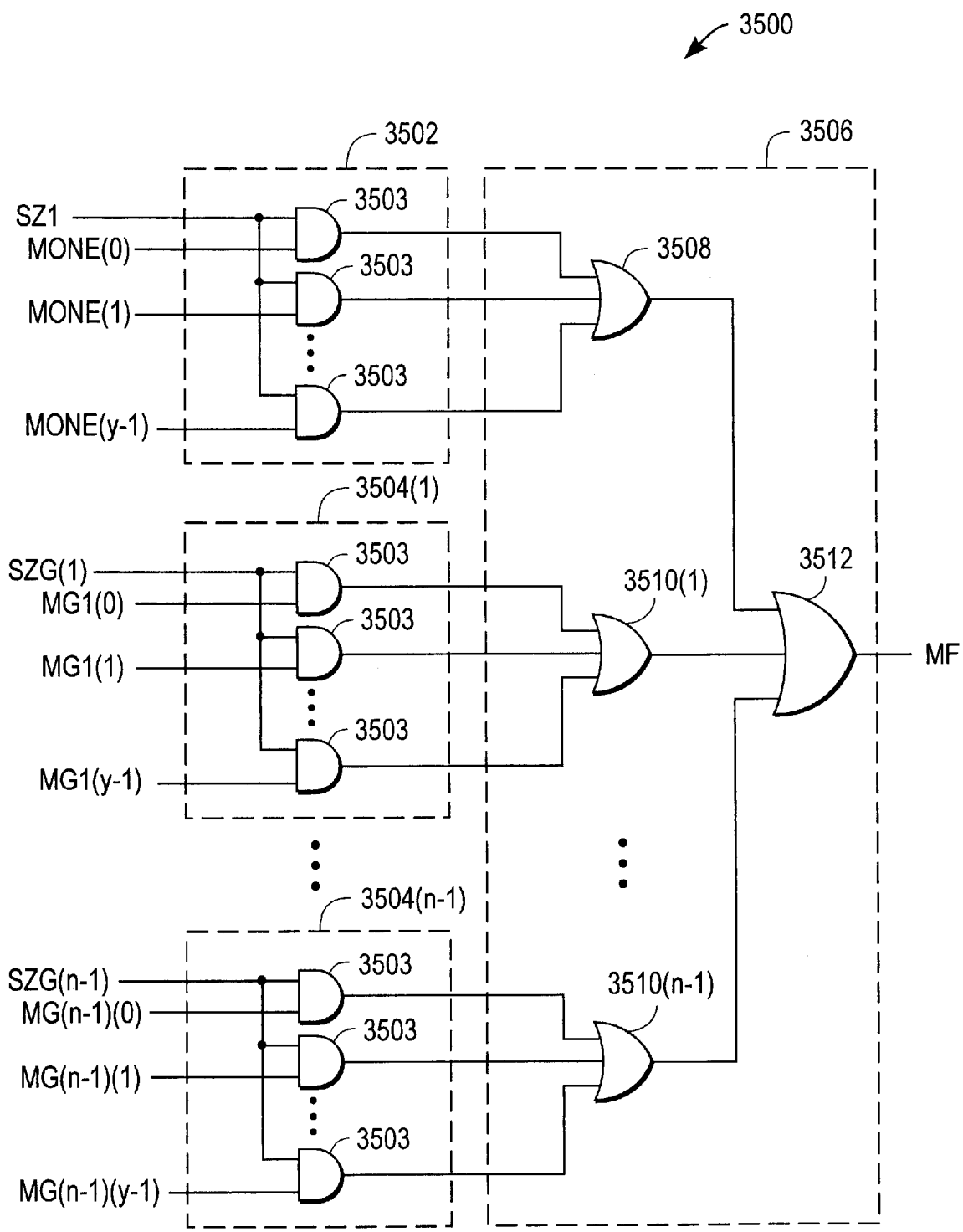
FIG. 37 is a logic diagram of one embodiment of the qualifying logic circuits and the OR logic of FIG. 36.

FIG. 37 shows match array logic 3500 that is one embodiment of match array logic 3400 of FIG. 36. Other embodiments may be used. Match array logic includes qualifying logic circuits 3502 and 3504(1)-3504(n–1) and OR logic 3506. Qualifying logic circuits 3502 and 3504(1)-3504(n–1) are embodiments of logic circuits 3402 and 3404(1)-3404(n–1), respectively. Each of the qualifying logic circuits includes Y two-input AND gates 3503 that each logically AND the corresponding configuration signal with each of the MONE or group match signals. The outputs of the Y AND gates for qualifying logic 3502 are provided to OR gate 3508, and the outputs of the Y AND gates for qualifying logic circuits 3504(1)-3504(n–1) are provided to OR gates 3510(1)-3510(n–1), respectively. The outputs of the OR gates are provided to OR gate 3512 to generate MF.

Multiple Match Flag

With reference again to FIG. 13, multiple match flag logic 1116 monitors the match results on the match line segments 1126(0)-1126(Y–1), and enables a multiple match flag MMF when comparand data matches data stored in more than one of the row segments in array 1102 in ZY×W mode (as indicated by the configuration information), or when comparand data matches data stored in more than one group of row segments in array 1102 in other configurations.

Figure 38:
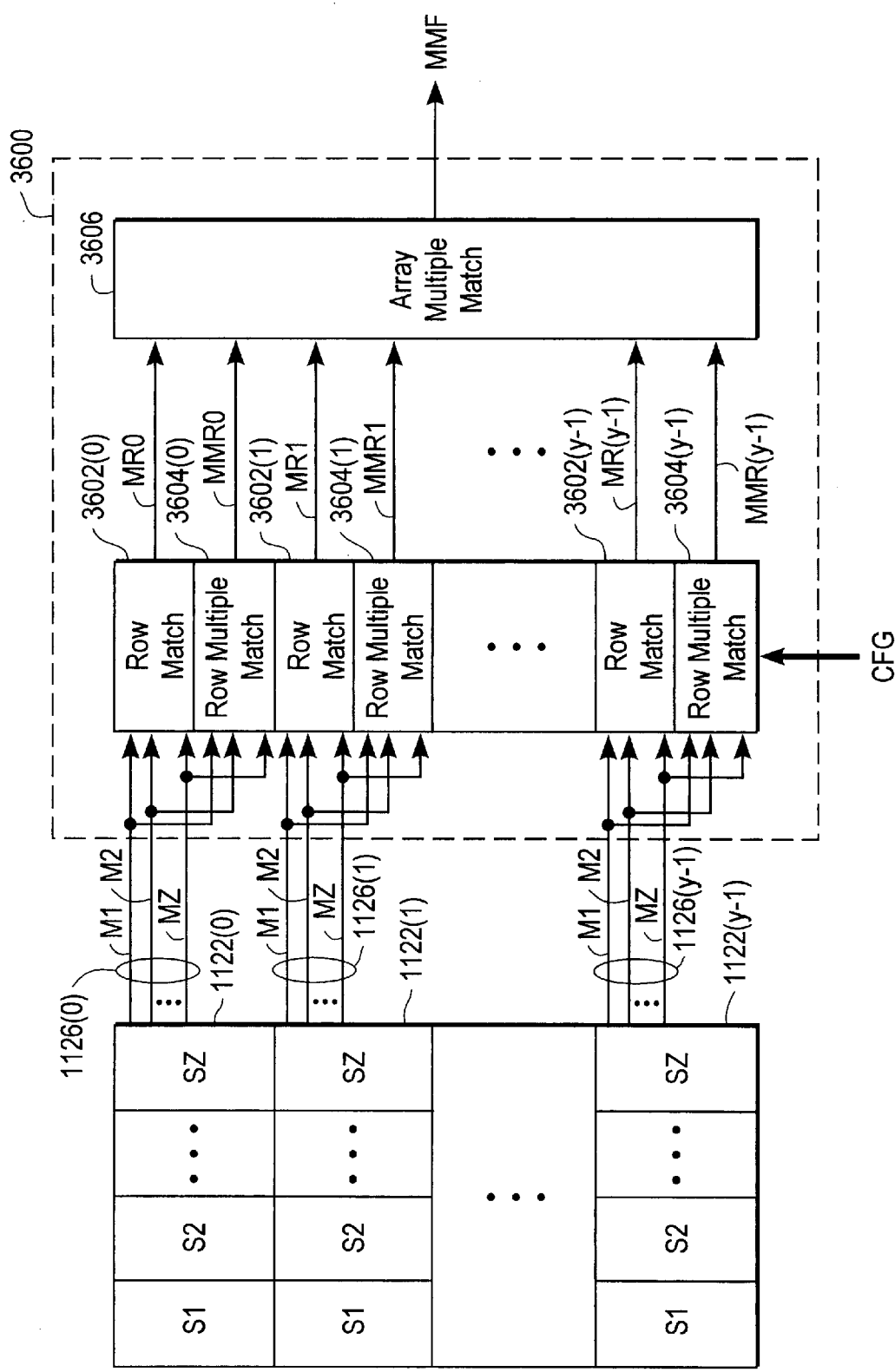
FIG. 38 is a block diagram of one embodiment of the multiple match flag logic of FIG. 13 including row match circuits, row multiple match circuits, and an array multiple match circuit.

FIG. 38 shows multiple match flag logic 3600 that is one embodiment of multiple match flag logic 116 of FIG. 13. Multiple match flag logic 3600 includes a row match circuit 3602 and a row multiple match circuit 3604 for each corresponding row of CAM cells 1122.

Each row mach circuit 3602 may be the same row match circuit 2402 of FIG. 26 that receives the match results from each of the match line segments M1-MZ of a corresponding row of CAM cells and, in response to the configuration information, generates a row match signal MR. Each row match signal is indicative of whether one or more row segments (i.e., for ZY×W mode), or one or more groups of row segments (i.e., for ZY/n×nW mode, where n is greater than 1), for a corresponding row stores data that matches the comparand data for a particular configuration. Array multiple match circuit 3606 monitors the match results of the row match signals, and enables MMF when there is a match in more than row segment, or more than one group of row segments, in different rows of CAM cells for a given configuration.

Each row multiple match circuit 3604 receives the match results from each of the match line segments M1-MZ of a corresponding row of CAM cells and, in response to the configuration information, generates a row multiple match signal MMR. Each row multiple match signal is indicative of whether more than one row segment (i.e., for ZY×W mode), or more than one groups of row segments (i.e., for ZY/n×nW mode, where 1<n<Z), of the corresponding row stores data that matches the comparand data for a particular configuration. Array multiple match circuit 3606 monitors the match results of the row multiple match signals and enables MMF when at least one of the row multiple match signals is enabled for a given configuration.

Figure 39:
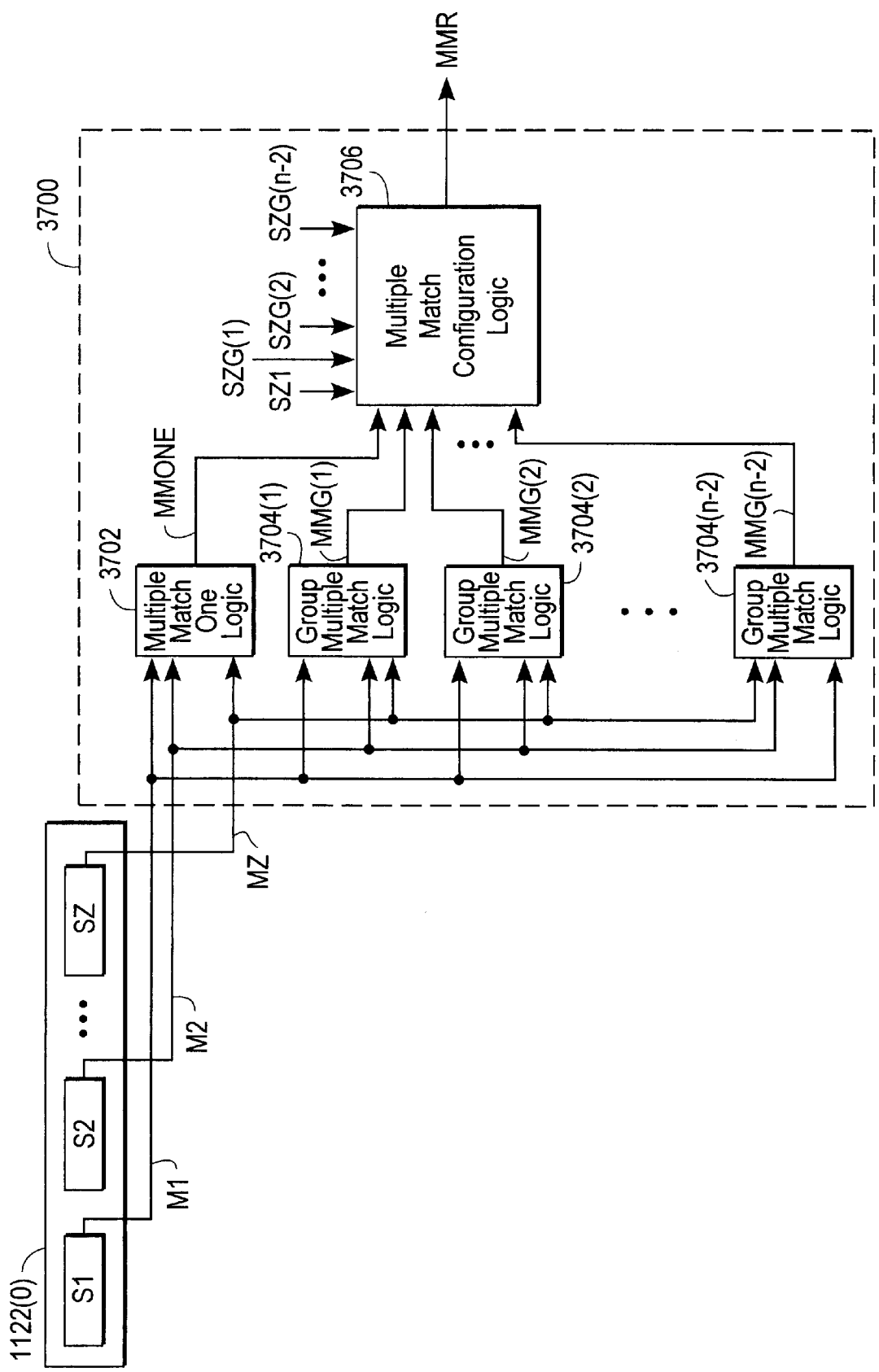
FIG. 39 is a block diagram of one embodiment of a row multiple match circuit of FIG. 38 including multiple match one logic, group multiple match logic circuits, and a multiple match configuration logic circuit.
Figure 40:
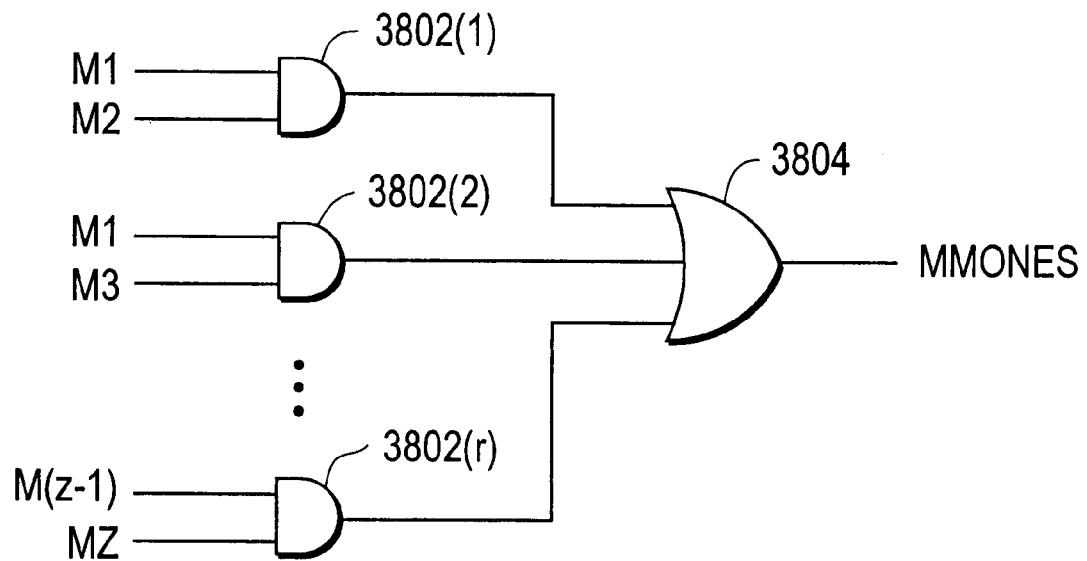
FIG. 40 is a logic diagram of one embodiment of the multiple match one logic of FIG. 39.
Figure 41:
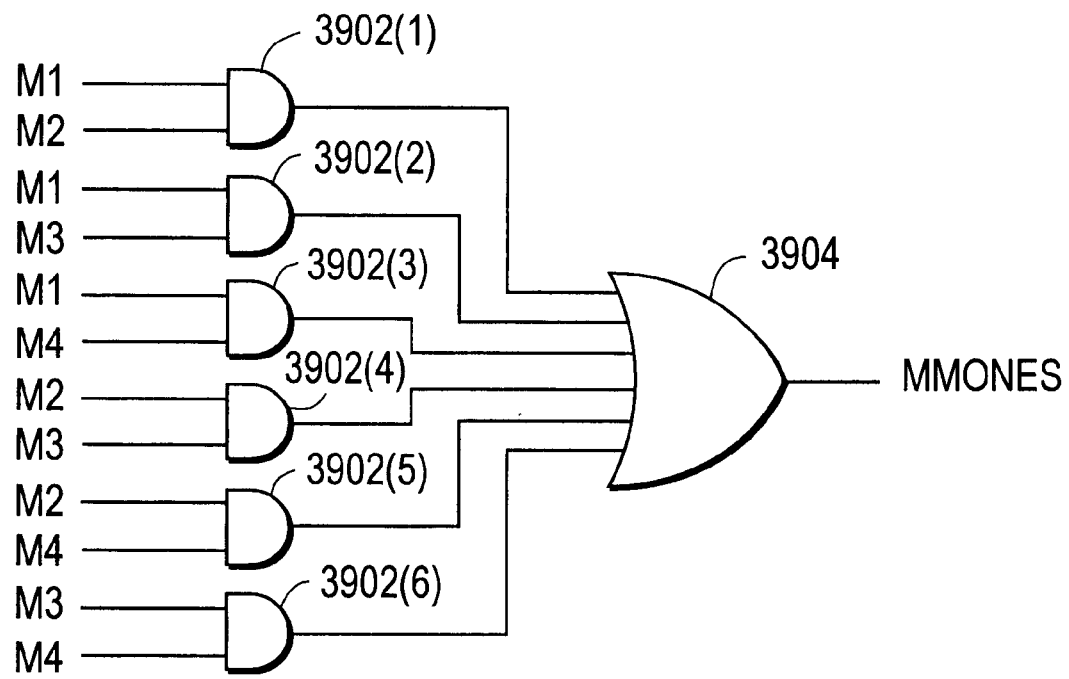
FIG. 41 is a logic diagram of one embodiment of the multiple match one logic of FIG. 40 for four row segments.

FIG. 39 shows row match circuit 3700 that is one embodiment of row multiple match circuit 3604(0) of FIG. 38. Row match circuit 3700 may be used for each row multiple match circuit. Row multiple match circuit 3700 includes multiple match one logic 3702, group multiple match logic circuits 3704(1)-3704(n−2), and multiple match configuration logic 3706. Multiple match one logic 3702 determines a multiple match condition in row 1122(0) for the ZY×W mode. Multiple match one logic 3702 receives each of the match line segments M1-MZ from row segments S1-SZ, respectively, and generates MMONE indicative of whether more than one row segment stores data that matches the comparand data. That is, multiple match one logic 3702 determines when two or more of M1-MZ are enabled. When configuration signal SZ1 is enabled, match configuration logic 3706 outputs MMONE as the row multiple match signal MMR0. Any multiple match logic circuitry can be used for logic 3702 to determine a multiple match condition. One embodiment of multiple match one logic is shown in FIG. 40. For this embodiment, two-input AND gates 3802(1)-3802(r) each receive a unique combination of two of the match line segments, where r is determined by the combinatorial formula $r=Z!/(2!(Z-2)!)$. The output of each AND gate is provided to OR gate 3804 to generate MMONES. One example of the approach of FIG. 40 for four row segments is shown in FIG. 41, where all of the combinations of the four match lines segments taken two at a time are provided to AND gates 3902(1)-3902(6), and the outputs of the AND gates are provided to OR gate 3904.

Figure 42A:
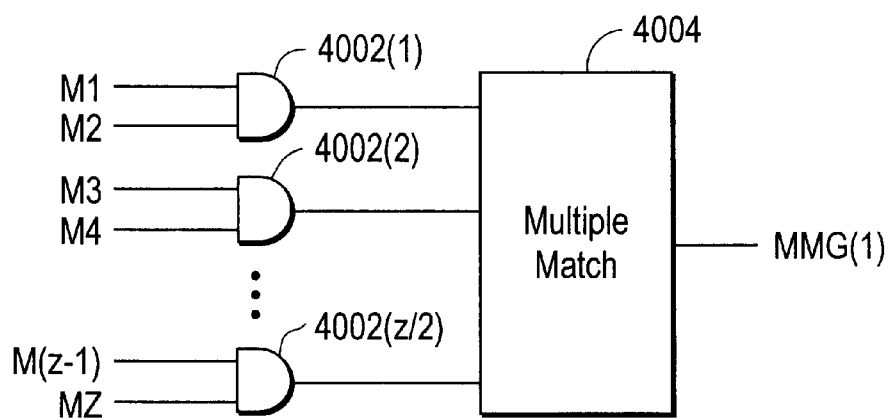
FIGS. 42A–42C are logic diagrams of embodiments of the group multiple match logic circuits of FIG. 39.

Each group multiple match logic circuit 3704(1)-3704(n−2) determines a multiple match condition within row 1122(0) for a different configuration of the CAM system. Each group multiple match logic circuit receives each of the match line segments M1-MZ from row segments S1-SZ, respectively, and logically combines unique groupings of the match line segments to generate group multiple match signals MMG(1)-MMG(n−2). Each unique grouping corresponds to the number of row segments that are concatenated together to store data for a given configuration of array 1102. For one embodiment, there are n−2 groups of row segments, where $n-2=2^x$ and x is an integer from 1 to $\log_2 Z$, and where x is a unique number for each group multiple match circuit. For example, in ZY/2×2W mode, the row segments in array 1102 are grouped by pairs. Group multiple match logic circuit 3704(1) determines whether more than one of the pairs of match line segments M1 and M2, M3 and M4, etc. indicate a match condition. For this first grouping of match line segments, multiple match configuration logic 3706 outputs MMG(1) as MMR0 when SZG(1) is enabled. One embodiment of multiple match logic 3704(1) is shown in FIG. 42A and includes Z/2 AND gates 4002(1)-4002(Z/2) each having two inputs coupled to a unique, consecutive pair of match line segments. The outputs of AND gates 4002 are provided to multiple match logic 4004 to generate MMG(1). Logic 4304 may be any multiple match logic circuit.

Figure 42B:
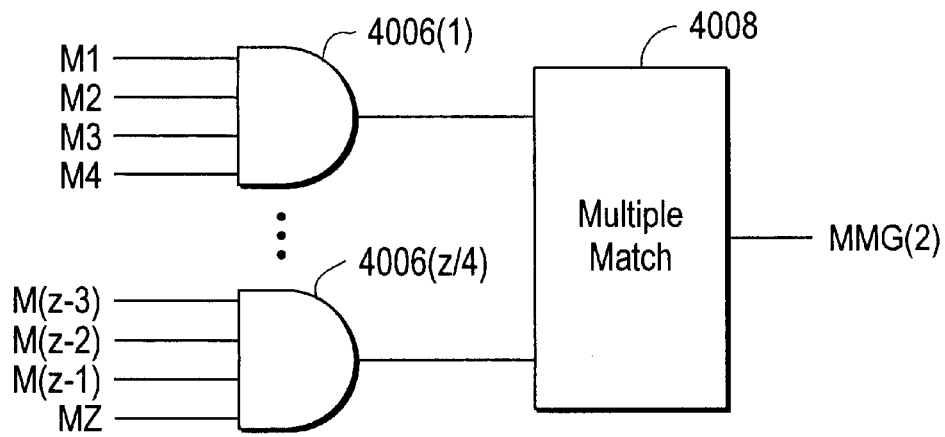

Similarly, in ZY/4×4W mode, the row segments in array 1102 are grouped in four segments at a time. Group multiple match logic circuit 3704(2) determines whether more than one quartet of match line segments M1-M4, M5-M7, etc. indicate a match condition. For this second grouping of match line segments, multiple match configuration logic 3706 outputs MMG(2) as MMR0 when SZG(2) is enabled. One embodiment of multiple match logic 3704(2) is shown in FIG. 42B and includes Z/4 AND gates 4006(1)-4006(Z/4) each having four inputs coupled to a unique, consecutive quartet of match line segments. The outputs of AND gates 4006 are provided to multiple match logic 4008 to generate MMG(2). Logic 4008 may be any multiple match logic circuit.

Figure 42C:
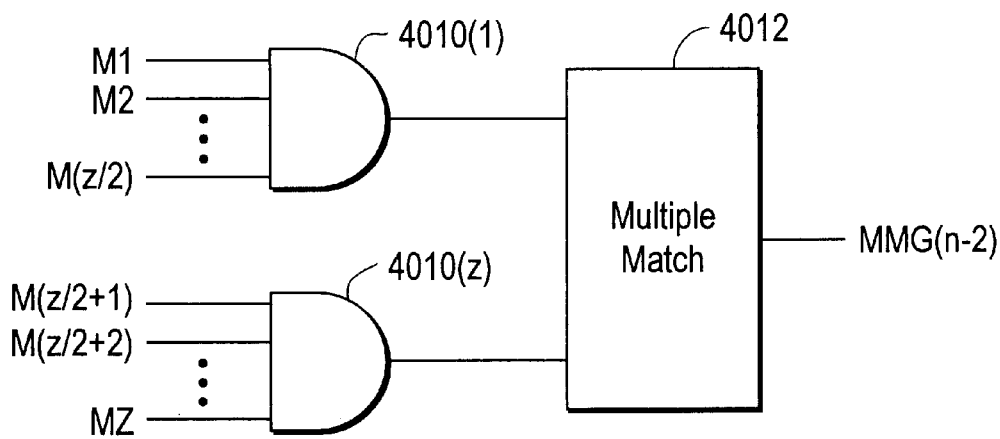

This methodology continues until in ZY/(Z−1)×(Z−1)W mode, the row segments in array 1102 are grouped Z/2 segments at a time. Group multiple match logic circuit 3704(n−2) determines whether both of the Z/2 groupings of match line segments M1-M(Z/2) and M(Z/2+1)-MZ indicate a match condition. For this grouping of match line segments, multiple match configuration logic 3706 will output MMG(n−2) as MMR0 when SZG(n−2) is enabled. One embodiment of multiple match logic 3704(n−2) is shown in FIG. 42C and includes two AND logic circuits 4010(1) and 4010(2) each having Z/2 inputs coupled to a unique, consecutive grouping of Z/2 match line segments. The outputs of AND gates 4010 are provided to multiple match logic 4012 to generate MMG(n−2). Logic 4012 may be any multiple match logic circuit. For one embodiment, multiple match logic 4012 may be AND logic that logically ANDs the outputs of AND gates 4010.

The final grouping of row segments in which all row segments are grouped for a given row (i.e., Y×ZW mode) is taken care of by the row match circuits (as will be described below), and does not require a separate group multiple match logic circuit.

Figure 43:
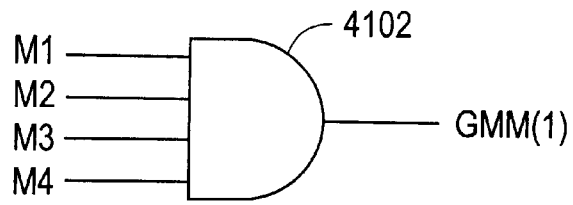
FIG. 43 is a logic diagram of one embodiment of one of the group multiple match circuits for four row segments.

FIG. 43 shows one embodiment of the group multiple match circuits for a row of CAM cells having Z=4 row segments. For this embodiment, only one group multiple match circuit may be used to determine when comparand data matches data stored in group S1-S2 (indicated on M1 and M2) and data stored in group S3-S4 (indicated on M3 and M4). Thus, a single AND logic circuit 4102 may be used to logically AND the logic states of M1-M4 to generate a single group multiple match signal GMM(1) for row 1122(0).

Figure 44:
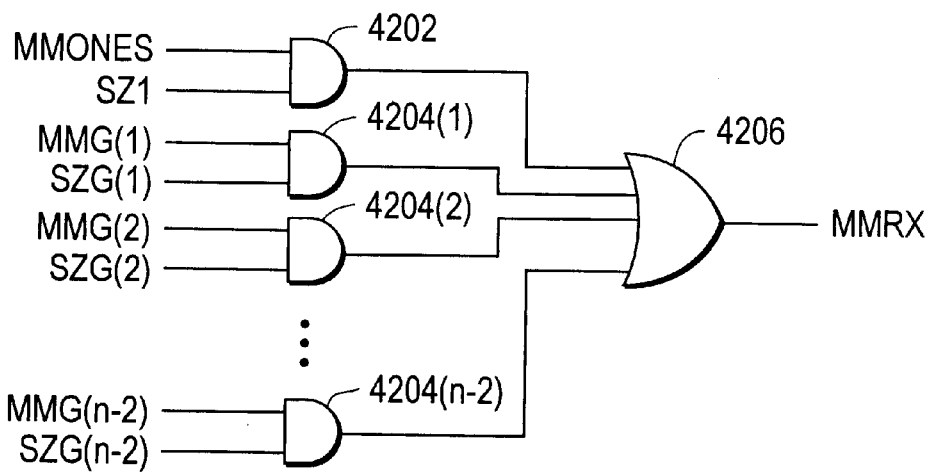
FIG. 44 is a logic diagram of one embodiment of the row multiple match configuration logic of FIG. 39.

FIG. 44 shows one embodiment of multiple match configuration logic 3706 of FIG. 39. Other embodiments may be used. For this embodiment, AND gate 4202 determines whether both MMONE and SZ1 are enabled and provides the result to OR gate 4206. AND gates 4204(1)-4204(n−2) determine whether one of the group multiple match signals MMG(1)(1)-MMG(n−2) and a corresponding configuration signal SZG(1)-SZG(n−2) are enabled, and the results are provided to OR gate 4206. OR gate 4206 provides MMR0. For another embodiment, multiple match configuration logic 3706 may be multiplexer with MMONE and MMG(1)-MMG(n−2) as the inputs, the configuration signals as the select signals, and the row match signal as the output.

Figure 45:
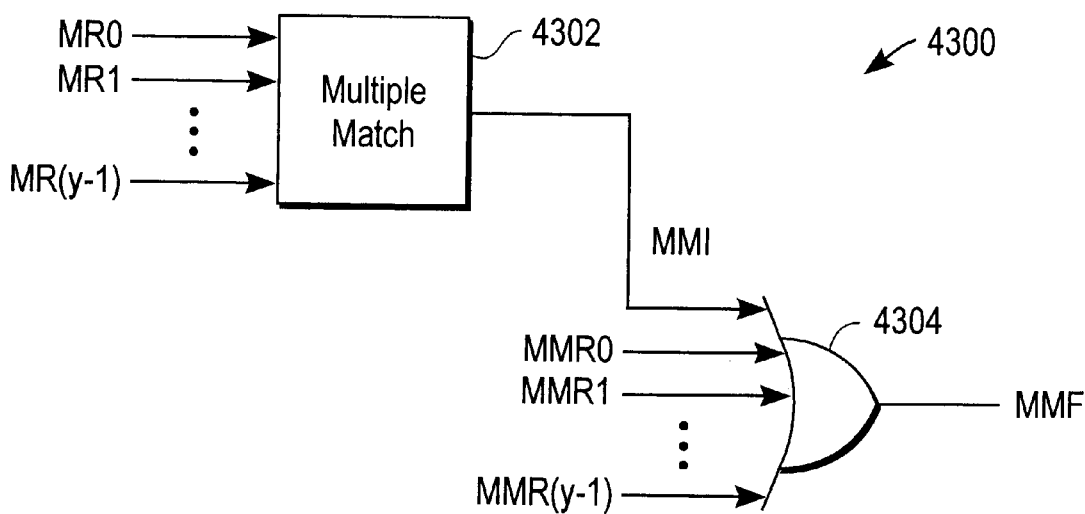
FIG. 45 is a block diagram of one embodiment of the array multiple match circuit of FIG. 38.

FIG. 45 shows array multiple match logic 4300 that is one embodiment of array multiple match logic 3606 of FIG. 38. Logic 4300 includes multiple match logic 4302 that receives the row match signals MR0-MR(Y−1), and generates an inter-row multiple match signal MMI when there is a match in more than one row segment, or more than one group of row segments, in different rows of CAM cells for a given configuration. MMI is provided to one input of OR logic 4304. OR logic 4304 also receives the row multiple match signals MMR0-MMR(Y−1) to enable MMF when there is a match in more than one row segment, or more than one group of row segments, within a row of CAM cells for a given configuration.

Match Address/Index

With reference again to FIG. 13, priority encoder logic 1112 monitors the match results on the match line segments 1126(0)-1126(Y–1) of each CAM row, and determines a match address or index MA that is the address of the highest priority row segment or group of row segments (depending on the configuration information) that stores data that matches the comparand data. The highest priority address may be the lowest numerical address, the highest numerical address, or any other predetermined priority.

Figure 46:
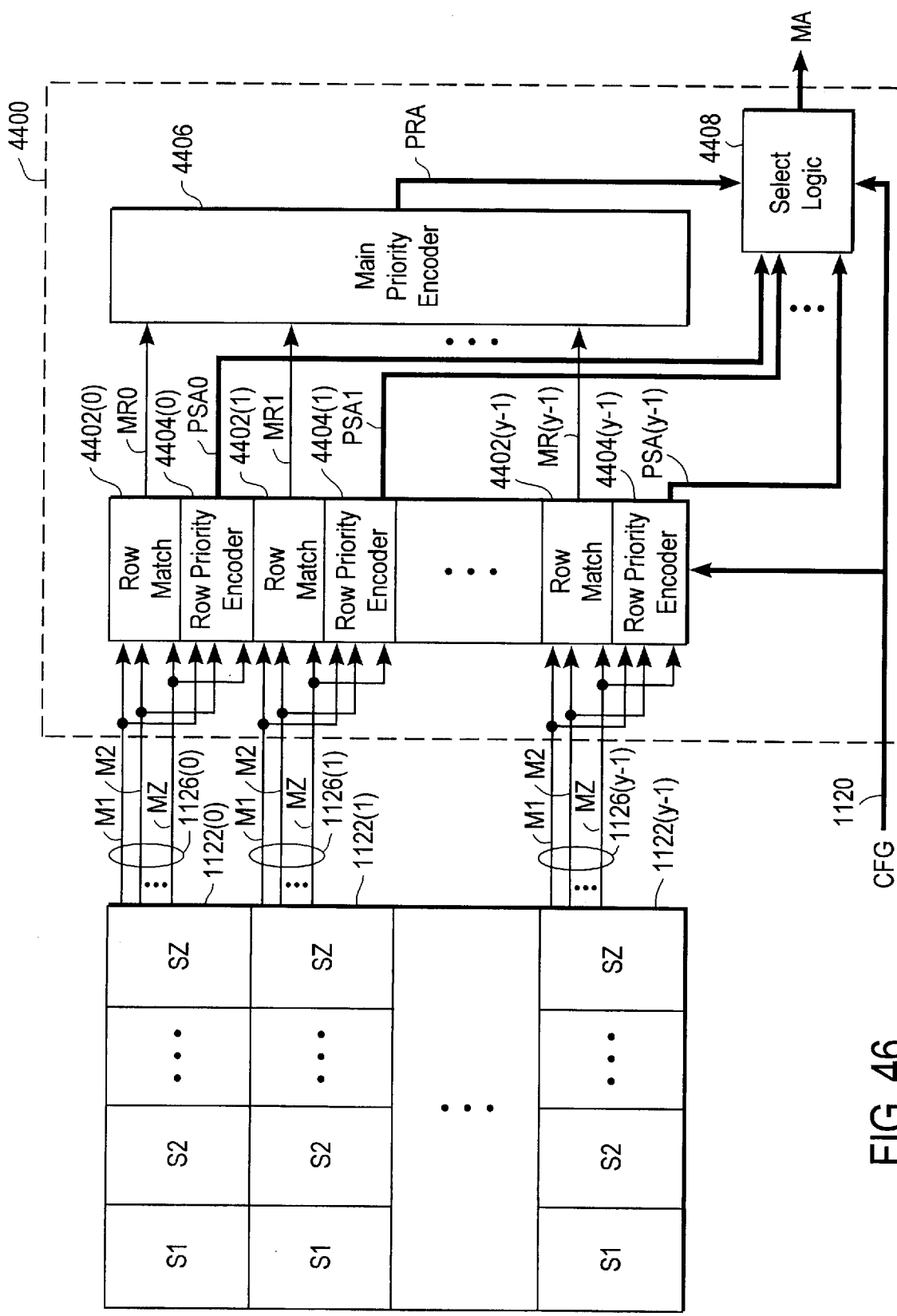
FIG. 46 is a block diagram of the configurable CAM system of FIG. 13 including one embodiment of the priority encoder logic having row match circuits, row priority encoder circuits, a main priority encoder, and select logic.

FIG. 46 shows priority encoder logic 4400 that is one embodiment of priority encoder logic 1112 of FIG. 13. Priority encoder logic 4400 includes a row match circuit 4402 and a row priority encoder 4404 for each corresponding row of CAM cells 1122. Each row mach circuit may be the same row match circuit 2402 of FIG. 26 that receives the match results from each of the match line segments M1-MZ of a corresponding row of CAM cells and, in response to the configuration information, generates a row match signal MR. Main priority encoder 4406 monitors the match results reflected on the Y row match signals MR(0)-MR(Y–1)and generates a row match address PRA that has log$_2$Y address bits. The row address corresponds to the address of the highest priority row of CAM cells 1122 that has a row segment or a group of row segments that stores data that matches the comparand data for a given configuration.

Each row priority encoder receives the match results from each of the match line segments M1-MZ of a corresponding row of CAM cells and, in response to the configuration information, generates a segment address PSA that that corresponds to the address of the row segment or a group of row segments within a particular row of CAM cells that stores data that matches the comparand data for a given configuration. The row address PRA and the segment addresses PSA(0)-PSA(Y–1) are provided to select logic 4408 to generate the match address in response to the configuration information.

Figures 47, 48:
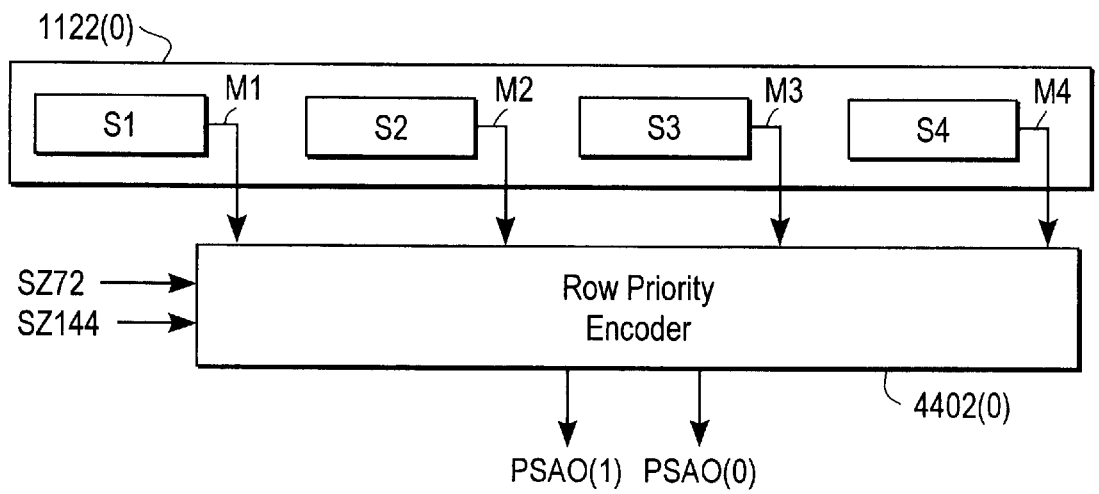
FIG. 47 is a block diagram of one of the row priority encoder circuits for particular configurations of the CAM system.
FIG. 48 is one embodiment of a truth table for one operating configuration for the row priority encoder circuit of FIG. 47.

For one embodiment, each segment address has log$_2$Z address bits that may reflect different values depending on the configuration of the corresponding row (and array 1102). For example, FIG. 47 shows row priority encoder 4402(0) for an embodiment where W=72 and Z=4. For this example, row priority encoder 4402(2) outputs segment address bits PSA0(1) and PSA0(0) in response to the match results on match line segments M1-M4 and configuration signals SZ72 and SZ144 indicative of two configurations for row 1122(0); namely, a ×72 bit mode and a ×144 bits mode. A ×288 bit mode which utilizes all of the row segments as one entire group does not need a separate configuration signal as the segment address outputs will be ignored and the row address PRA will reflect the match address MA. In the ×72 mode, SZ72 is enabled and each row segment S1-SZ is uniquely addressable such that S1 has address 0, S2 has address 1, S3 has address 2, and S4 has address 3. FIG. 48 shows one embodiment of the truth table implemented by row priority encoder 4402(0) for the ×72 mode. In the ×144 mode, SZ144 is enabled and each group of two segments S1-S2 and S3-S4 is uniquely addressable such that S1-S2 has address 0 and S3-S4 has address 1. FIG. 49 shows one embodiment of the truth table implemented by row priority encoder 4402(0) for the ×144 mode in which PSA0(1) is used to reflect the address of each group of row segments, and PSA0(0) is ignored. For other embodiments, PSA0(0) may be used to reflect the address of each group of row segments. Other truth tables may be used for FIGS. 48 and 37 (and corresponding logic generated accordingly) including those that logically complement one of more of the signals indicated in the truth tables.

Any logic or circuitry may be used to implement the truth tables of FIGS. 48 and 49. FIG. 50 shows logic 4800 that is one embodiment of generating PSA0(0) for a logic zero state. Other embodiments may be used to generate PSA0(1) for a logic one state. Logic 4800 includes NAND gates 4806 and 4808 and inverters 4802 and 4804. NAND gate 4808 has one input coupled M3 and the other input coupled to the logical complement of M2 via inverter 4804. NAND gate 4806 has one input coupled to the output of NAND gate 4808, and the other input coupled to the logical complement of M1 via inverter 4802. The output of NAND gate 4806 provides SA0(0).

FIG. 51 shows logic 4900 that is one embodiment of generating PSA0(1). Other embodiments may be used. Logic 4900 includes NAND gates 4902, 4904, 4906, and 4910, and NOR gate 4908. NAND gate 4902 has one input coupled to M1 and another input coupled to M2. NAND gate 4904 has one input coupled to the output of NAND gate 4904 and another input coupled to SZ144. NAND gate 4906 has one input coupled to the output of NAND gate 4906 and the other input coupled to the output of NAND gate 4910. NAND gate 4910 has one input coupled to SZ72 and the other input coupled to the output of NOR gate 4908. NOR gate 4908 has one input coupled to M1 and the other input coupled to M2.

As indicated above, the row address and the segment addresses PSA(0)-PSA(Y–1) are provided to select logic 4408. In response to the row address PRA and the configuration information on bus 1120, select logic 4408 selects one of the segment addresses associated with the row of CAM cells at row address PRA to generate the highest priority match address MA for the entire array 1102. In Y×ZW mode, the row address alone indicates the highest priority address with a matching entry, and select logic 4408 provides PRA as MA. In other configurations, select logic 4408 outputs the row address as the most significant bits of MA, and the corresponding segment address as the least significant bit(s) of MA.

Figure 52:
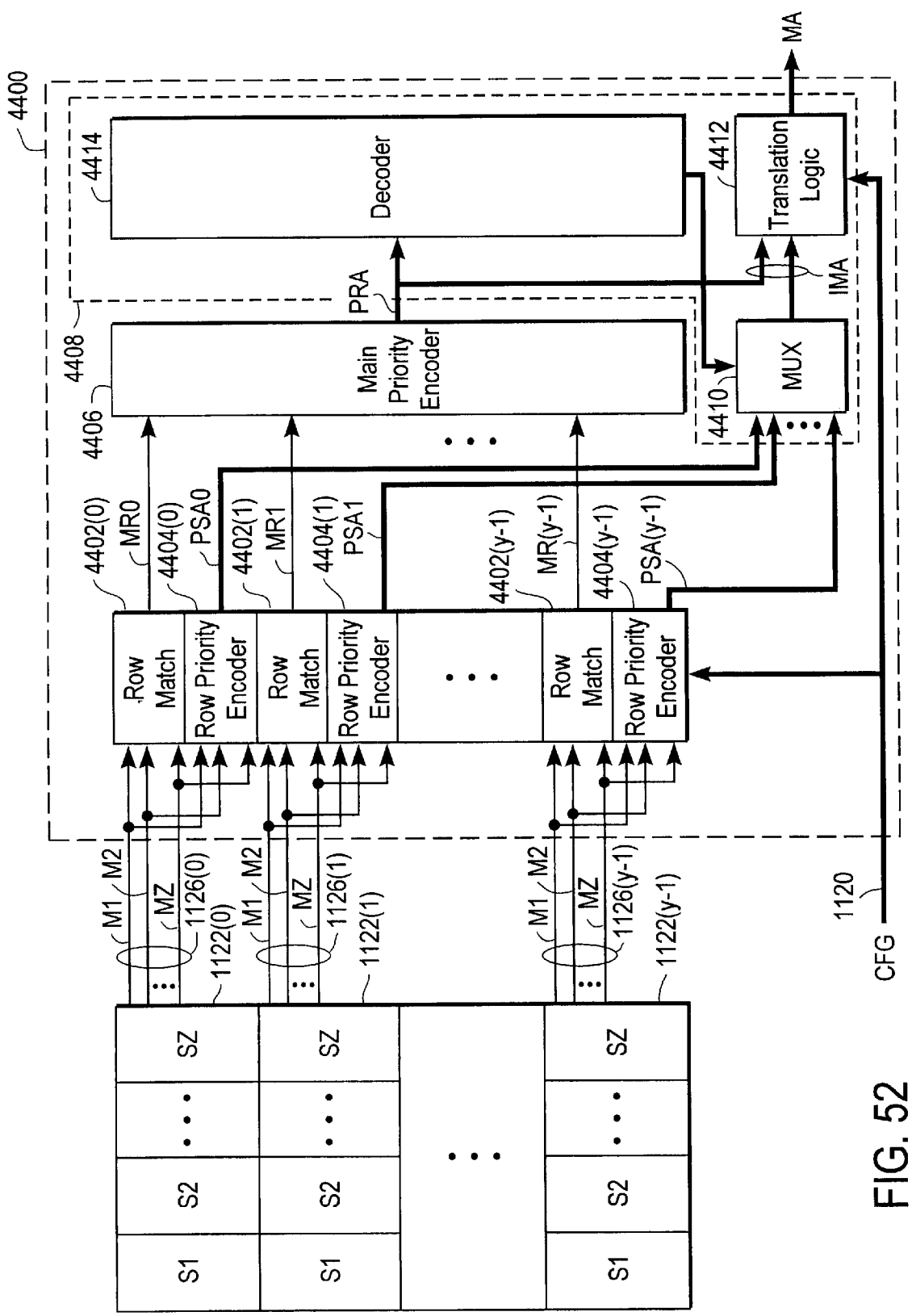
FIG. 52 is a block diagram of the configurable CAM system of FIG. 13 including one embodiment of the select circuitry having a decoder, a multiplexer, and translation logic.

FIG. 52 shows one embodiment of select logic 4408. Other embodiments may be used. For this embodiment, select logic 4408 includes decoder 4414, multiplexer 4410, and translation logic 4412. Decoder 4414 decodes row address PRA and provides the decoded row address as select signals to multiplexer 4410. In response to the decoded row address, multiplexer 4410 selects and outputs one of the segment addresses PSA(0)-PSA(Y–1) associated with the row of CAM cells at row address PRA. The row address and the selected segment address together make up an internal match address IMA. In Y×ZW mode, translation logic 4412 provides IMA as MA. For other configurations, however, not all of the segment address bits are used (e.g., least significant bit SA0(0) in the ×144 bit mode for the example of FIGS. 47-51), or none of the segment address bits are used (e.g., in ZY×W mode where only PRA is used to generate MA) as part of the match address MA. For these configurations, translation logic 4412 translates or shifts the bits of IMA such that the match address starts at its least significant bit. For alternative embodiments, the unused least significant bits of MA may simply be ignored and translation logic 4412 omitted.

Figure 53:
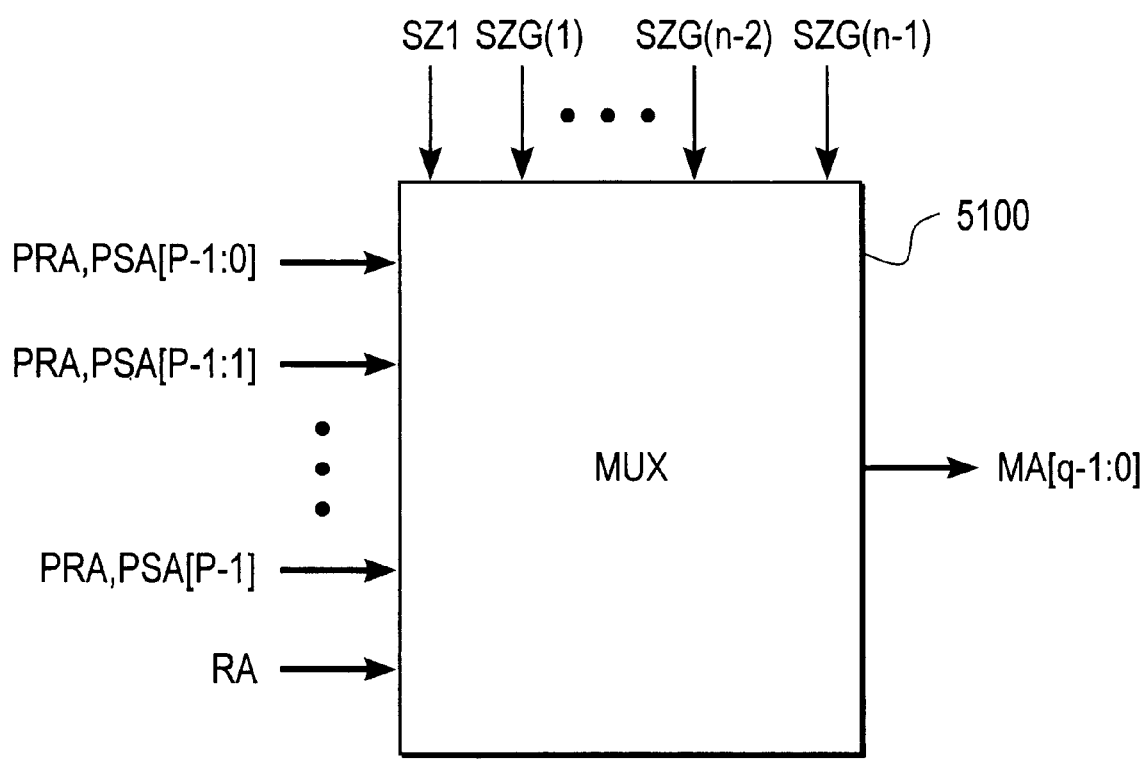
FIG. 53 is a logic diagram of embodiment of the translation logic of FIG. 52.

FIG. 53 shows multiplexer 5100 that is one embodiment of translation logic 4412 of FIG. 52. Multiplexer 5100 receives the configuration signals SZ1 and SZG(1)-SZG(n–1) to select and output one of the PRA/PSA concatenations as the match address. In this embodiment, the match address has q=log$_2$ZY address bits and multiplexer 5100 outputs one of the PRA/PSA concatenations such that the segment address bits start at the least significant bit of the match address. Any un-used address bits of the match address may be set, for example, to a logic zero state. In the Y×ZW mode, SZ1 is enabled and multiplexer 5100 selects PRA, PSA[p−1:0] to provide as MA[q−1:0], where p=log$_2$Z. In the ZY/2×2W mode, SZG(1) is enabled and multiplexer 5100 selects PRA, PSA[p−1:1] to provide as MA[q−2:0]. In the ZY/(Z−1)×(Z−1)W mode, SZG(n−1) is enabled and multiplexer 5100 selects PRA, PSA[p−1] to provide as MA[log$_2$Y:0]. Finally, in the ZY×W mode, multiplexer 5100 provides PRA as MA[log$_2$Y−1:0]. For another embodiment, multiplexer 5100 may be implemented in AND and OR logic gates such that each configuration signals is logically ANDed with its corresponding PRA/PSA combination, and the outputs of the AND gates provided to OR logic to generate MA.

For another embodiment, translation logic 4412 may be a shift register that receives IMA and then uses the configuration information to indicate the number of times to shift out least significant bits (e.g., divide by 2) from the shift register. For one embodiment, each configuration is associated with a predetermined count value, and the count is decremented for each shift until the count reaches zero. Other embodiments may be used.

Figure 54:
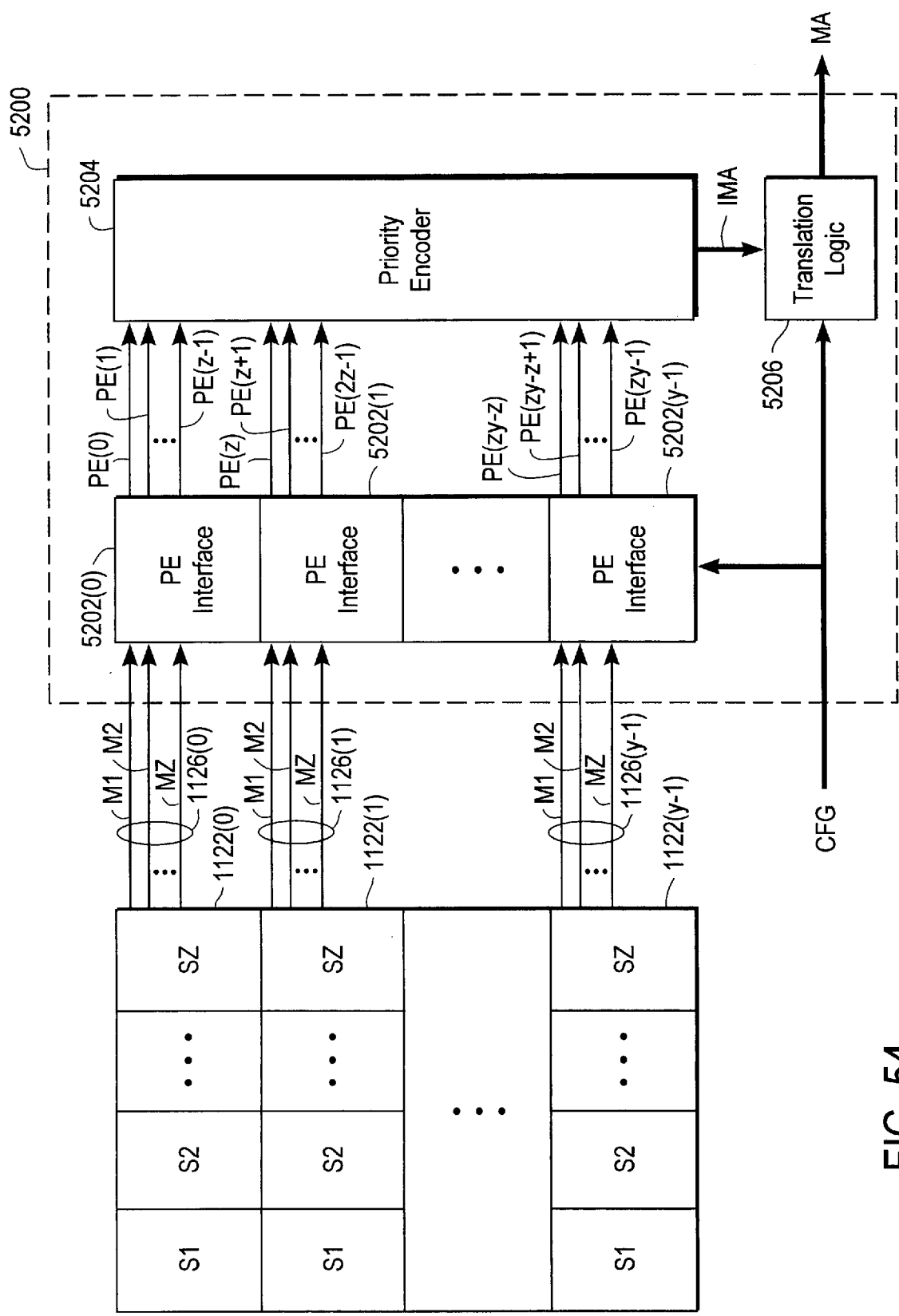
FIG. 54 is a block diagram of the configurable CAM system of FIG. 13 including another embodiment of the priority encoder having priority encoder interface circuits, a priority encoder, and translation logic.

FIG. 54 shows priority encoder logic 5200 that is another embodiment of priority encoder logic 1112 of FIG. 13. Priority encoder logic 5200 includes priority encoder (PE) interface circuits 5202(0)-5202(Y−1), priority encoder 5204, and translation logic 5206. Each interface circuit 5202(0)-5202(Y−1) receives the match results from each of the match line segments M1-MZ of a corresponding row of CAM cells and, in response to the configuration information, generates Z priority encoder input signals for priority encoder 5204. The Y interface circuits generate a total of ZY input signals PE(0)-PE(ZY−1). Priority encoder 5204 encodes the ZY priority encoder inputs signals and generates the internal or intermediate match address IMA that has log$_2$ZY address bits. IMA corresponds to the address of the highest priority row of CAM cells 1122 that has a row segment or a group of row segments that stores data that matches the comparand data for a given configuration. In response to the configuration information, translation logic 5206 outputs IMA or a bit translated version of IMA as the match address MA. For alternative embodiments, IMA may be provided as MA and any unused least significant bits of MA may simply be ignored and translation logic 4212 omitted.

Figure 55:
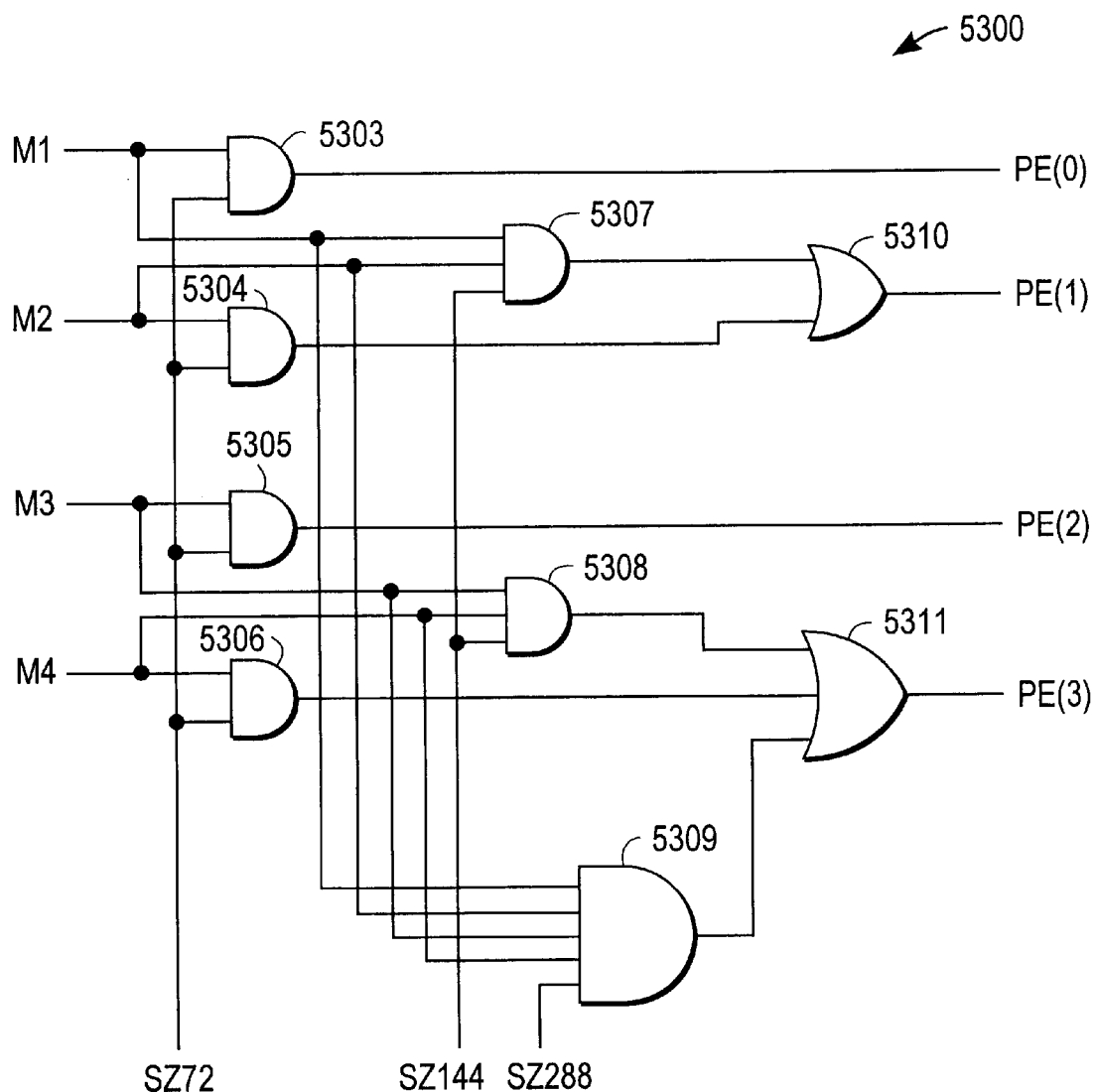
FIG. 55 is a logic diagram of one embodiment of a priority encoder interface circuit of FIG. 54 for particular configurations of the CAM system.

The operation of the priority encoder interface circuits is further illustrated by interface circuit 5300 of FIG. 55. Interface circuit 5300 is one embodiment of interface circuit 5202(0) of FIG. 54 in which array 1102 has Y=1024 rows of CAM cells each having Z=4 segments of W=72 CAM cells. Interface circuit 5300 may also be used for all interface circuits. Interface circuit 5300 includes AND gates 5306-5309 and OR gates 5310-5311. AND gates 5303-5306 each receive configuration signal SZ72 and one of M1-M4. AND gate 5303 provides PE(0), and AND gate 5305 provides PE(2). AND gate 5307 receives M1, M2, and configuration signal SZ144. OR gate 5310 provides PE(1) in response to the outputs of AND gates 5307 and 5303. AND gate 5308 receives M3, M4, and configuration signal SZ144. AND gate 5309 receives M1-M4 and configuration signal SZ288. OR gate 5311 provides PE(3) in response to the outputs of AND gates 5306, 5308, and 5309.

In the 4k×72 mode, configuration signal SZ72 is enabled to allow AND gates 5303-5306 and OR gate 5310 and 5311 to provide the logic states on M1-M4 to PE(0)-PE(3), respectively. In this mode all of the 4k individual row segments have unique addresses of zero to 4k−1.

In the 2k×144 mode, configuration signal SZ144 is enabled and the row segments are grouped into addressable pairs S1-S2 and S3-S4. In this mode, configuration signal SZ72 is disabled such that PE(0) and PE(2) are disabled. If the first pair S1-S2 stores data that matches comparand data, then M1 and M2 are enabled and AND gate 5307 and OR gate 5310 enable PE(1). Since S1-S2 is the first addressable group of row segments, it has the address zero in this configuration. However, when PE(1) is enabled, priority encoder 5204 outputs an address of 1 as IMA. Translation logic 5206 translates or shifts the bit positions in IMA by one such that the least significant bit of IMA is dropped and MA reflects an address of 0 rather than 1. Similarly, if the second pair S3-S4 stores data that matches comparand data, then M3 and M are enabled and AND gate 5308 and OR gate 5311 enable PE(3). Since S3-S4 is the second addressable group of row segments, it has the address 1 in this configuration. However, when PE(3) is enabled (and PE(1) is not enabled), priority encoder 5204 outputs an address of 2 as IMA. Translation logic 5206 translates or shifts the bit positions in IMA by one such that the least significant bit of IMA is dropped and MA reflects an address of 1 rather than 2.

Lastly, in the 1k×288 mode, configuration signal SZ288 is enabled and the row segments are all grouped together to form a single addressable row. In this mode, configuration signals SZ72 and SZ144 are disabled such that PE(0)-PE(2) are disabled. If all row segments S1-S4 store data that match 288-bit comparand data, then M1-M4 are enabled and AND gate 5309 and OR gate 5311 enable PE(3). Since group S1-S4 is the first (and only) addressable group of row segments, it has the address 0 in this configuration. However, when PE(3) is enabled, priority encoder 5204 outputs an address of 3 as IMA. Translation logic 5206 translates or shifts the bit positions in IMA by two such that the least significant bit of IMA is dropped and MA reflects an address of 0 rather than 3.

FIG. 56 summarizes the general function of each of the priority encoder interface circuits 5202(0)-5204(Y−1). In configuration ZY×W, SZ1 is enabled and the PE inputs are set the logic states of their corresponding match line segment. In this mode, translation logic 5206 provides IMA as MA. In configuration ZY/2×2W (i.e., n=2), SZG(1) is enabled and every second (nth) PE input is set to the corresponding first group match results. All other PE inputs are set to a mismatch state, and translation logic 5206 translates or shifts the bit positions in IMA by one place such that the least significant bit of IMA is dropped to generate MA. In configuration ZY/4×4 (i.e., n=4), SZG(1) is enabled and every fourth (nth) PE input is set to the corresponding second group match results. All other PE inputs are set to a mismatch state, and translation logic 5206 translates or shifts the bit positions in IMA by two places such that the two least significant bits of IMA are dropped to generate MA This process continues until in configuration Y×ZW (i.e., n=Z), SZG(n−1) is enabled and every Zth (nth) PE input is set to the corresponding row group match results. All other PE inputs are set to a mismatch state, and translation logic 5206 translates or shifts the bit positions in IMA by (Z−1) places such that the (Z−1) least significant bits of IMA are dropped to generate MA. The logic shown in FIG. 55 may be extended to accommodate any number of row segments and any number of configurations. Alternatively, each priority interface circuit may be a multiplexer that uses the configuration signals as select signals to select the match results from the match line segments as shown in FIG. 56.

Figure 57:
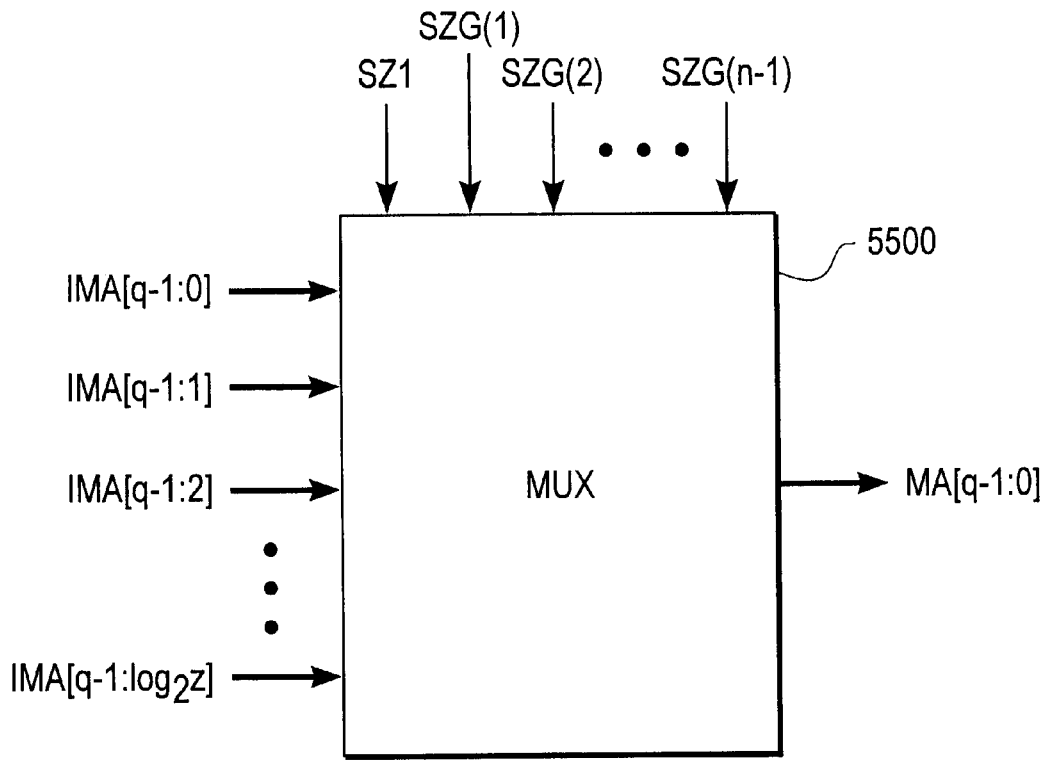
FIG. 57 is a logic diagram of one embodiment of the translation logic of FIG. 54.

FIG. 57 shows multiplexer 5500 that is one embodiment of translation logic 5206 of FIG. 54. Multiplexer 5500 receives the configuration signals SZ1 and SZG(1)-SZG(n−1) to select and output one of the IMA address bit strings as the match address. In this embodiment, the match address has q=$\log_2$ZY address bits and multiplexer 5500 outputs one of the IMA bit strings starting at the least significant bit of the match address. Any un-used address bits of the match address may be set to a logic zero state. In the Y×ZW mode, SZ1 is enabled and multiplexer 5500 selects IMA[q−1:0] to provide as MA[q−1:0]. In the ZY/2×2W mode, SZG(1) is enabled and multiplexer 5500 selects IMA[q−1:1] to provide as MA[q−2:0]. In the ZY/4×4W mode, SZG(2) is enabled and multiplexer 5500 selects IMA[q−1:2] to provide as MA[q−3:0]. Finally, in the ZY×W mode, multiplexer 5500 is enabled and multiplexer 5500 selects IMA[q−1:$\log_2$Y] to provide as MA[$\log_2$Y−1:0]. For another embodiment, multiplexer 5100 may be implemented in AND and OR logic gates such that each configuration signals is logically ANDed with its corresponding IMA bit string, and the outputs of the AND gates provided to OR logic.

For another embodiment, translation logic 5206 may be a shift register that receives IMA and then uses the configuration information to indicate the number of times to shift out least significant bits (e.g., divide by 2) from the shift register. For one embodiment, each configuration is associated with a predetermined count value, and the count is decremented for each shift until the count reaches zero. Other embodiments may be used.

Figure 58:
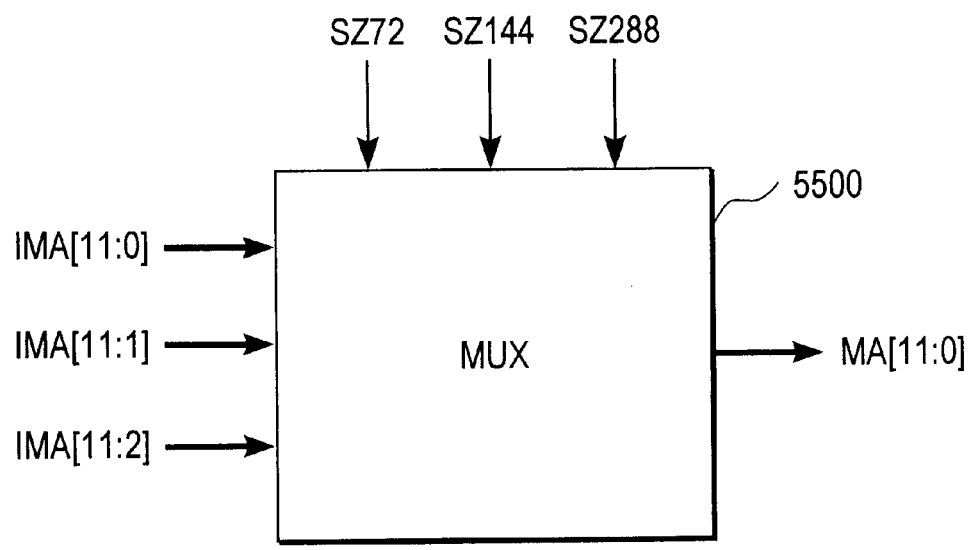
FIG. 58 is a logic diagram of the translation logic of FIG. 57 for a particular configuration of the CAM system.

FIG. 58 shows one embodiment of the multiplexer 5500 configured for the example of FIG. 55. In this embodiment, SZ72 selects IMA[11:0] to be provided as MA[11:0]; SZ144 selects IMA[11:1] to be provided as MA[10:0]; and SZ288 selects IMA[11:2] to provided as MA[9:0]. This embodiment may also be used for translation logic 5100 of FIG. 53.

Partitionable CAM Device With Intra-Row Configurability

Figure 59:
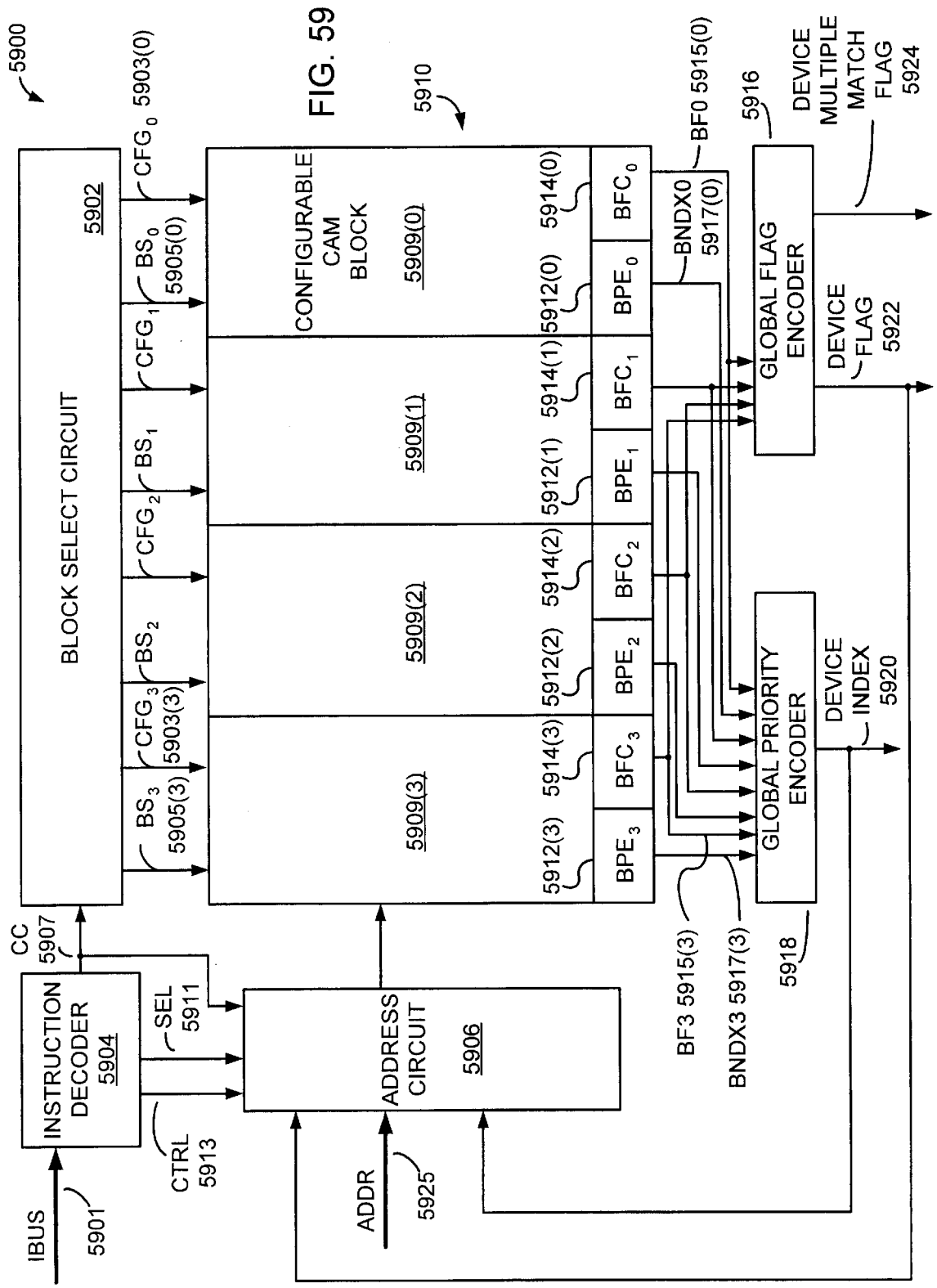
FIG. 59 illustrates an embodiment of a CAM device that includes a CAM array formed by independently selectable CAM blocks and that has intra-row configurability.

FIG. 59 illustrates an embodiment of a CAM device 5900 that includes a CAM array 5910 formed by independently selectable CAM blocks as described in reference to FIGS. 1–12 and that has intra-row configurability as described in reference to FIGS. 13–58. The CAM device 5900 includes a CAM array 5910 formed by four independently selectable, configurable CAM blocks 5909(0)-5909(3) (more or fewer blocks may be provided in alternative embodiments), four block flag circuits 5914(0)-5914(3) and four block priority encoders 5912(0)-5912(3) that correspond to the four configurable CAM blocks, a global priority encoder 5918, a global flag circuit 5916, an instruction decoder 5904, a block select circuit 5902 and an address circuit 5906. Instructions such as read, write and compare instructions are issued to the CAM device 5900 by a host processor (not shown) via an instruction bus 5901. In the case of read and write instructions, the host processor may additionally issue address values to the CAM device via address bus 5925 to specify locations in the CAM array 5910 to be accessed. Other circuit paths not shown in FIG. 59 may also be coupled to the CAM device 5900, including without limitation a comparand bus to provide host-supplied comparand values to the CAM device 5900, and a status bus to permit status information to be output from the CAM device 5900. Also, the CAM device 5900 may include numerous additional circuit blocks not shown in FIG. 59 including, without limitation, a comparand register, global mask register, configuration register, status register, read/write circuit, and error checking circuit.

The instruction decoder 5904 responds to instructions received via the instruction bus 5901 by outputting timing and control signals to other circuit blocks within the CAM device 5900 to perform the specified operation. In one embodiment, incoming instructions may include a class code to specify a storage partition within the CAM array (i.e., one or more blocks and/or portions of blocks within the CAM array) to which the instruction is directed. The class code may be part of an operation code of the instruction (e.g., encoded in the operation code), part of an operand associated with the instruction or a distinct operand associated with the instruction. Further, the different portions of a given instruction (e.g., operation code, class code, other operands, etc.) may be received at different times, for example, in distinct transmissions or in packet-based transmissions. Also, class-based instructions may be executed according to a previously received class code. For example, a class code specifying a first storage partition of the CAM array may be sent to the CAM device. Thereafter, class-based compare, read and write instructions, though themselves not specifying a particular class, cause corresponding compare, read and write operations to be performed on the first storage partition of the CAM array until a different class code is issued to the CAM device 5900.

In one embodiment, each class code corresponds to a width/depth configuration of a CAM block so that the number of different class codes is determined by the number of permitted width/depth configurations. In an alternative embodiments, different class codes may be assigned according to other criteria including, without limitation, the type of data stored within the corresponding storage partition (e.g., ATM, IPv4, IPv4 multicast, Ethernet, URL, MPLS, etc.); the type or purpose of the operation to be performed on the data stored within the corresponding storage partition (e.g., one class of storage partition may be used to determine forwarding addresses, while another class of storage partition may be used for classification purposes), or by any combination of data type, storage configuration, or operation type/purpose. Referring to CAM device 5900, for example, IPv4 values may be stored in CAM block 5909(0) and MPLS values in CAM block 5909(1). By assigning different class codes to the IPv4 and MPLS values, it becomes possible to perform operations (e.g., compare, write, read) on the specific CAM blocks containing those values, regardless of whether those CAM blocks have the same or different width/depth configurations. In general, any criterion for distinguishing between storage partitions may be used without departing from the spirit or scope of the present invention.

In the embodiment of FIG. 59, the instruction decoder outputs the class code 5907 to the block select circuit 5902 which, in response, outputs block select signals 5905(0)-5905(3) and block configuration signals 5903(0)-5903(3) to the CAM array 5910. The block select signals 5905 are used in the manner described in reference to FIGS. 1–12 to either select or not select the corresponding CAM block 5909 to participate in a compare operation. In one embodiment, the block configuration signals 5903 correspond to the configuration signals described in reference to FIGS. 13–58 and are supplied to the block priority encoders 5912 and the block flag circuits 5914 to specify the width and depth of the array for block flag and block index generation purposes. Each of the block flag circuits 5914(0)-5914(3) outputs one or more respective block flag signals 5915(0)-5915(3) to the global flag circuit 5916 and the global priority encoder 5918. Each of the block priority encoding circuits 5912(0)-5912(3) outputs a respective block index 5917(0)-5917(3) to the global priority encoder 5918. The global flag circuit 5916 generates one or more device flag signals 5922 and the global priority encoder generates a device index 5920. As discussed below, each of the block flag circuits 5914(0)-5914(3) may also output a block multiple match flag signal (not shown) to the global flag circuit 5916, which in turn outputs a device multiple match flag signal 5924.

Still referring to FIG. 59, the class code 5907 is also supplied to the address circuit 5906 along with a control signal 5913 and a select signal 5911. As discussed below, the address circuit 5906 may include register banks for maintaining class-based addresses which are used to access the CAM array 5910 in response to certain read and write instructions. In alternative embodiments, the class code 5907 may be supplied directly to the block select circuit 5902 and/or the address circuit 5906 directly from the instruction bus 5901. The address circuit 5906 may also include the address logic 701 of FIG. 7 and/or the address logic 1104 of FIG. 13. Further, the block select circuit 5902 may include a number of separate select circuits such as select circuits 106(1)-106(n) of FIG. 1, wherein each select circuit is configured to store a class code for its corresponding CAM block.

Figure 60:
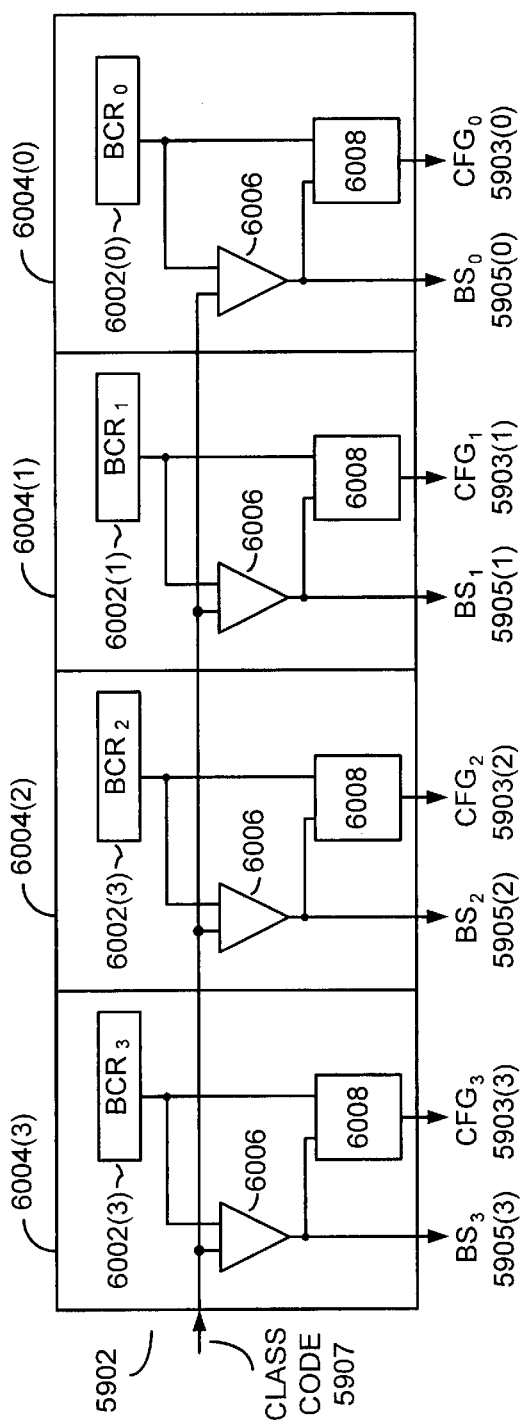
FIG. 60 illustrates a block select circuit according to one embodiment.

FIG. 60 illustrates the block select circuit 5902, according to one embodiment, in which the block select circuit 5902 includes a separate subcircuit 6004(0)-6004(3) for each block of the CAM array. Each of the subcircuits 6004(0)-6004(3) (corresponding, for example, to select circuits 106(1)-106(4) of FIG. 1) includes a block configuration register 6002(0)-6002(3) (e.g. such as memory 302 of FIG. 3), a comparator circuit 6006 (e.g., such as compare circuit 304 of FIG. 3), and a gating circuit 6008. The block configuration registers 6002(0)-6002(3) may be distinct registers or respective portions of a single register, such as configuration register 1118 of FIG. 13. Each comparator circuit 6006 is coupled to receive a block configuration signal from the corresponding block configuration register 6002 and the class code 5907 from the instruction decoder (or, alternatively, directly from the instruction bus). The comparator circuits 6006 each include circuitry to compare the incoming class code 5907 with the content of the corresponding block configuration register 6002 to generate a block select signal 5905(0)-5905(3) (e.g., such as the select signals SEL_1 to SEL_n of FIG. 1). If the class code 5907 matches the content of the corresponding block configuration register 6002, the comparator circuit 6006 asserts the block select signal 5905. Conversely, if the class code 5907 does not match the content of the corresponding block configuration register 6002, the comparator circuit 6006 deasserts the block select signal 5905.

Each of the gating circuits 6008 is coupled to receive a respective block select signal 5905 from the corresponding comparator circuit 6006 and a respective block configuration signal from the corresponding block configuration register 6002. Each gating circuit 6008 includes logic to output a respective one of the block configuration signals 5903(0)-5903(3) if the corresponding block select signal 5905 is asserted. If the corresponding block select signal 5909 is not asserted, the block configuration signal 5903 is masked, for example, by forcing all component signals (not shown in FIG. 60) of the block configuration signal 5903 to a reset state. In alternative embodiments, the gating circuits 6008 are omitted so that the block configuration signals 5903(0)-5903(3) are output to the block priority encoders and block flag circuits regardless of the state of the corresponding block select signals 5905(0)-5905(3).

Figure 61:
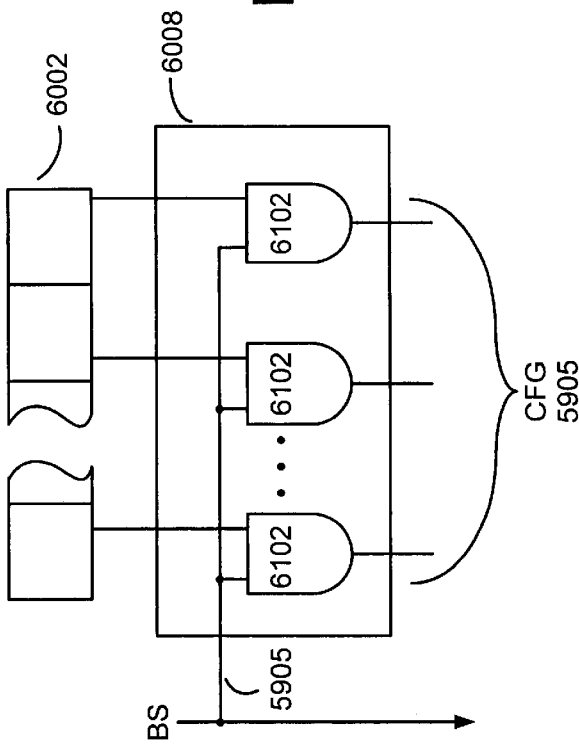
FIG. 61 illustrates a gating circuit according to one embodiment.

FIG. 61 illustrates a gating circuit 6008 according to one embodiment. As shown, each component bit of a block configuration value stored within the block configuration register 6002 is input to a respective AND logic gate 6102 where it is logically ANDed with a block select signal 5905. Accordingly, if the block select signal 5905 is asserted (indicating that the corresponding CAM block is selected to participate in the instructed operation), each of the component signals of the block configuration signal 5903 is output by the gating logic 6008. Conversely, if the block select signal 5905 is deasserted, the component signals of the block configuration signal 5903 are forced to a reset state.

Figure 62:
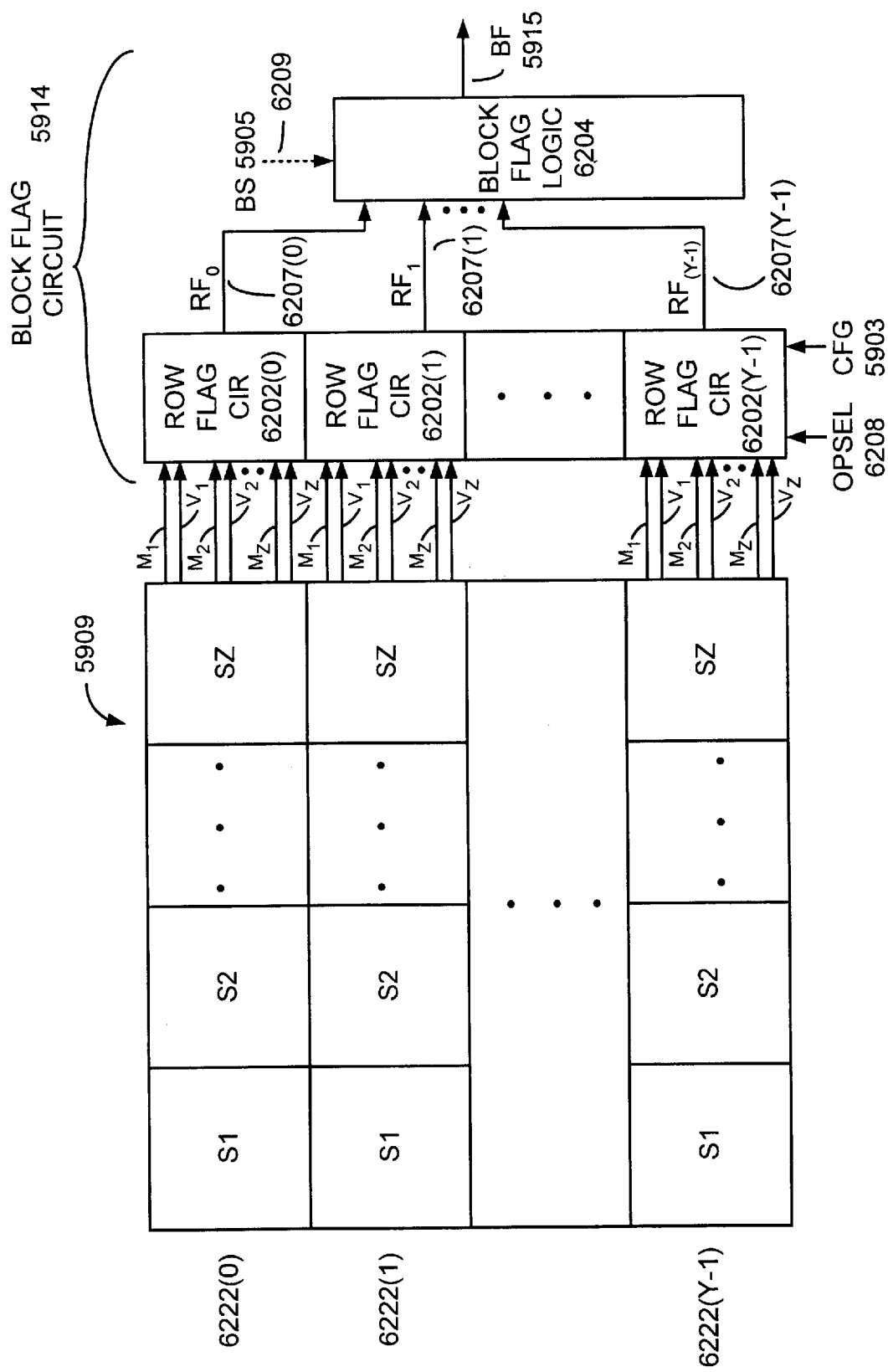
FIG. 62 illustrates a block flag circuit according to one embodiment.

FIG. 62 illustrates a block flag circuit 5914 according to one embodiment. The block flag circuit 5914 includes a number of row flag circuits 6202(0)-6202(Y−1) each coupled to receive match signals $M_1$-$M_z$ and validity signals $V_1$-$V_z$ from a respective row 6222(0)-6222(Y−1) of a CAM block 5909. The validity signals represent the state of validity values stored within the CAM block 5909. Each validity value, which may include one or more bits, corresponds to one of the row segments within rows 6222(0)-6222(Y−1) of the CAM block 5909 and indicates whether the row segment contains a valid CAM word. Alternatively, groups of row segments may share one or more validity signals.

An operation select signal 6208, preferably generated by the instruction decoder, and the block configuration signal 5903 are input to each row flag circuit 6202. As discussed below, the operation select signal 6208 is used to select which set of input signals (i.e., match signals $M_1$-$M_Z$ or validity signals $V_1$-$V_Z$) are to be operated upon by logic circuits within the row flag circuit 6202. In one embodiment, the block configuration signal 5903 is used to select one or more of the logic circuits to output a row flag signal 6207 from the row flag circuit according to width/depth configuration of the CAM block.

The row flag signals 6207(0)-6207(Y−1) output by the row flag circuits 6202(0)-6202(Y−1) are input to block flag logic 6204 which, in turn, generates a block flag signal 5915. In one embodiment, the block flag logic 6204 is an OR logic gate that asserts the block flag signal 5915 if any of the row flag signals 6207(0)-6207(Y−1) are asserted. Thus, in the case of a compare operation, assertion of a row flag signal 6207 by any of the row flag circuits 6202(0)-6202(Y−1), thereby indicating a match between the content stored within the corresponding CAM row and the comparand, will result in assertion of a match signal (i.e., block flag signal 5915) for the CAM block 5909. Similarly, in the case of a write operation, assertion of a row flag signal 6207 by any of the row flag circuits 6202(0)-6202(Y−1), thereby indicating a not-full row, will result in assertion of a not-full signal (i.e., block flag signal 5915) for the CAM block 5909. When deasserted, the not-full signal indicates that the block is full and may therefore be viewed as a full flag. As discussed below, in an embodiment in which the block configuration signal 5903 is gated by the block select signal 5915, logic within the row flag circuits 6202 prevents assertion of row flag signals in the event the corresponding CAM block is not selected to participate in the instructed operation (e.g., a write operation or compare operation). Consequently, if the CAM block 5905 is not selected to participate in an operation, none of the row flag signals 6207(0)-6207(Y−1) will be asserted regardless of whether the content of a given row 6222(0)-6222(Y−1) (or portion thereof) matches the comparand and regardless of whether one or more of the rows 6222(0)-6222(Y−1) are not full. By contrast, in an embodiment in which the block configuration signal 5903 is not gated by the block select signal 5905, the row flag circuits 6202(0)-6202(Y−1) may assert one or more of row flag signals 6207(0)-6207(Y−1) despite the fact that the corresponding CAM block 5909 is not selected. Accordingly, in such an embodiment, it may be desirable to input the block select signal 5905 to the block flag circuit 6204 to prevent assertion of the block flag signal 5915 if the block is not selected to participate in a given operation. This is illustrated by dashed line 6209 in FIG. 62. Alternatively, the block select signal may be supplied to each of the row flag circuits 6202(0)-6202(Y−1) to gate the individual row flag signals 6207(0)-6207(Y−1).

Figure 63:
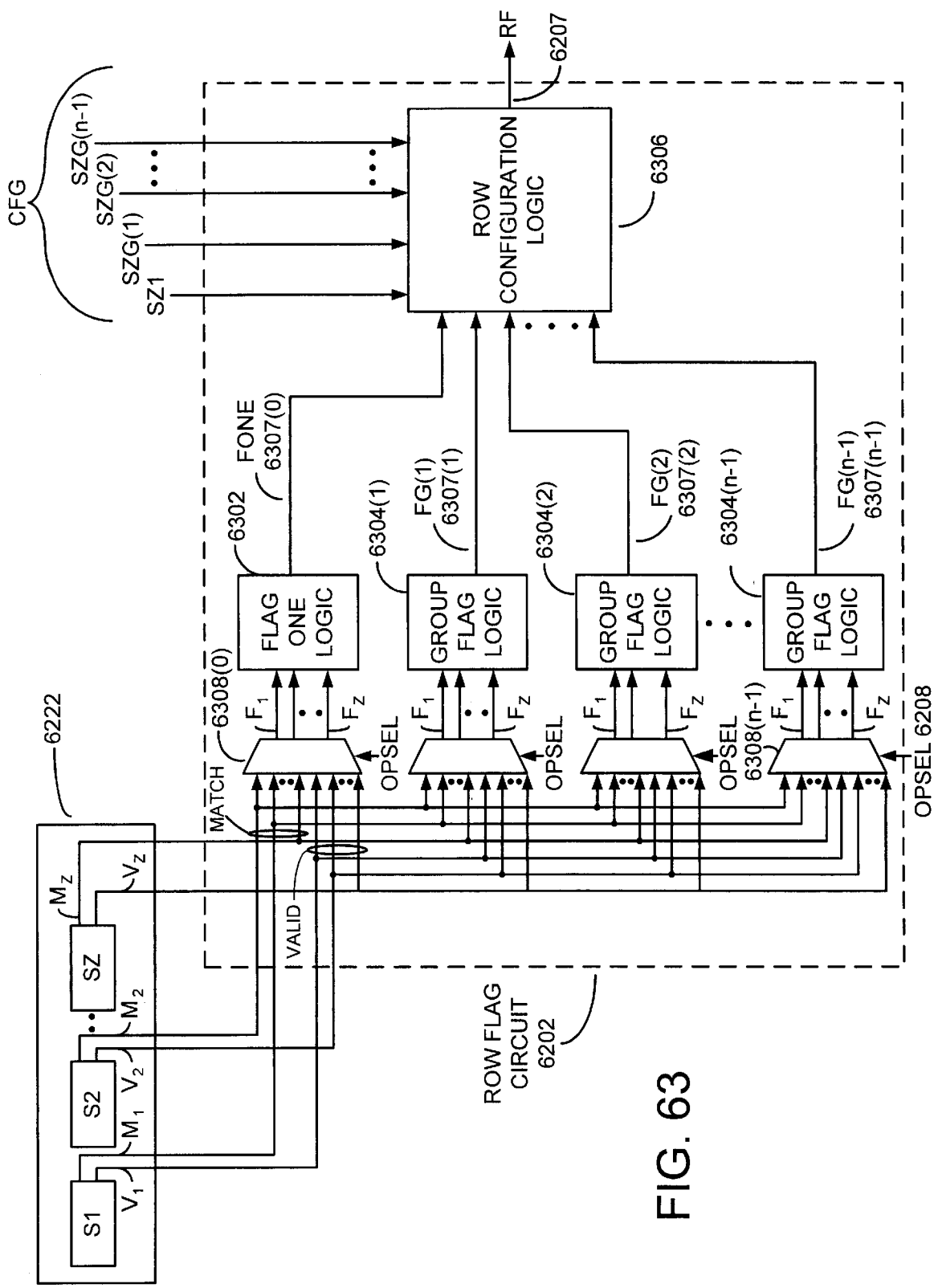
FIG. 63 illustrates a row flag circuit from FIG. 62 in greater detail.

FIG. 63 illustrates a row flag circuit 6202 from FIG. 62 in greater detail. The row flag circuit 6202 receives the match flag signals $M_1$-$M_Z$ and validity signals $V_1$-$V_Z$ from segments $S_1$-$S_Z$, respectively, of a row 6222 within a CAM block. In one embodiment, the match signals are active high such that a logic '1' indicates that the corresponding segment of the row 6222 matches the comparand (or portion thereof), and the validity signals are active low such that a logic '1' indicates that the corresponding segment of the row 6222 is not loaded with a valid CAM word. From one perspective, the validity signals may be considered to be 'not full' signals and may be used to determine whether the row 6222 itself is full or not.

Still referring to FIG. 63, the operation select signal 6208 is applied to the select input of each of multiplexers 6308(0)-6308(n−1) to select either the validity signals or the match signals to be output as a set of flag signals $F_1$-$F_Z$ to a corresponding one of n flag logic circuits, including a flag one logic circuit 6302 and group flag logic circuits 6304(1)-6304(n−1). In an alternative embodiment, a single multiplexer could be used to select between the match signals and the validity signals, with the output flag signals F1-FZ fanning out to each of the logic circuits 6302 and 6304(1)-6304(n−1). By viewing the multiplexers 6308(0)-6308(N−1) as separate from the remaining circuits within the row flag circuit 6202, it will be appreciated that the row flag circuit 6202 may be implemented in same manner as either the match flag logic 2400 of FIG. 26 or the match flag logic 3000 of FIG. 32. Referring more specifically to the match flag logic 2400 of FIG. 26, the flag one logic circuit 6202 may be implemented in the same manner as the match one logic circuit 2502 of FIG. 27 (i.e., as described in reference to FIG. 28) and each of the group flag logic circuits 6304(1)-6304(n−1) may be implemented in the same manner as group match logic circuits 2504(1)-2504(n−1), respectively (i.e., as described in reference to FIGS. 29A, 29B, 29C). Also, the output of each of the flag logic circuits, signals 6307(0)-6307(n−1), are input to a row configuration logic 6306 that may be implemented in the same manner as the match configuration logic 2506 of FIG. 27. That is, row configuration logic 6306 may include circuitry responsive to the component signals of the block configuration signal CFG (i.e., component signals SZ1 and SZG(1)-SZG(n−1)) and the flag signals 6307(0)-6307(n−1) to generate a row flag signal 6207 that corresponds to the row match signal MR0 output by the match configuration logic 2506. More specifically, row configuration logic 6306 may be implemented, for example, as shown in FIGS. 30 and 31, substituting signal 6307(0) (i.e., FONE) for MONE and signals 6307(1)-6307(n−1) (i.e., FG(1)-FG(n−1)) for MG(1)-MG(n−1), respectively. In an alternative embodiment, the row configuration logic may be omitted and the flag signals 6307(0)-6307(N−1) provided to a block flag circuit that is implemented in the same manner as the array match circuit 2404 of FIG. 32. That is, the flag signals 6307(0)-6307(n−1) may be provided to a block match circuit that is implemented in the same manner as array match circuit 3004 (i.e., as described in various embodiments in reference to FIGS. 33–37), the block match circuit outputting a block flag signal (e.g., signal 5915 of FIG. 59) rather than the array match flag.

Referring to FIGS. 59, 62 and 63, when the operation select signal 6208 signal is in a first logic state, the flag signals F1-FZ correspond to the match signals M1-MZ from each row 6222. The flag signals can be used in this mode to signal match or multiple match conditions for a given CAM block and class code. For example, when the match signals indicate that any of the row segments (or groups thereof) match a comparand value, the row flag signal 6207 for the row will indicate a match condition. If any of the row flag signals 6207(0)-6207(Y−1) indicate a match condition, the corresponding block flag circuit 6204 will indicate a block match condition for the CAM block and class code by asserting the block flag signal 5915. If a block match condition is indicated for any of the blocks with the same class code, then the global flag circuit 5916 will indicate a match condition by asserting the device flag signal 5922. By this arrangement, compare operations may be performed, and match (and multiple match) conditions signaled, on a class-by-class basis according to the incoming class code.

When the operation select signal 6208 is in a second logic state, the flag signals F1-FZ correspond to the validity signals V1-VZ from each row 6222. The flag signals can be used in this mode to signal a not-full (or full) condition for a given block and class code. For example, when all the validity signals indicate that all the row segments (or groups thereof) have valid, stored entries, the row flag signal 6207 for the row will indicate a full condition. If all the row flag signals 6207(0)-6207(Y−1) indicate full conditions for a given CAM block and class code, the corresponding block flag circuit 6204 will indicate a block full condition by deasserting the block flag signal 5915. If all the blocks with the same class code are indicated to be full, then the global flag circuit 5916 will indicate a full condition by deasserting the device flag signal 5922. Accordingly, a full/not-full condition may be signaled on a class-by class basis according to the incoming class code. Note that any or all of the signals used to indicate a row, block or device full condition or match condition may have different logic states in alternative embodiments.

Figure 64:
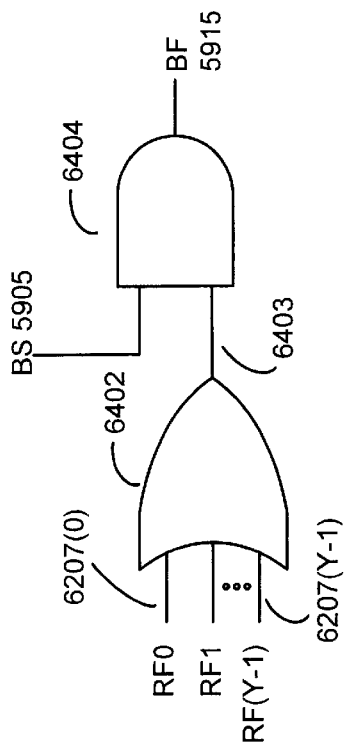
FIG. 64 illustrates an embodiment of a block flag logic in which a block select signal is used to gate assertion of the block flag signal.
Figure 65:
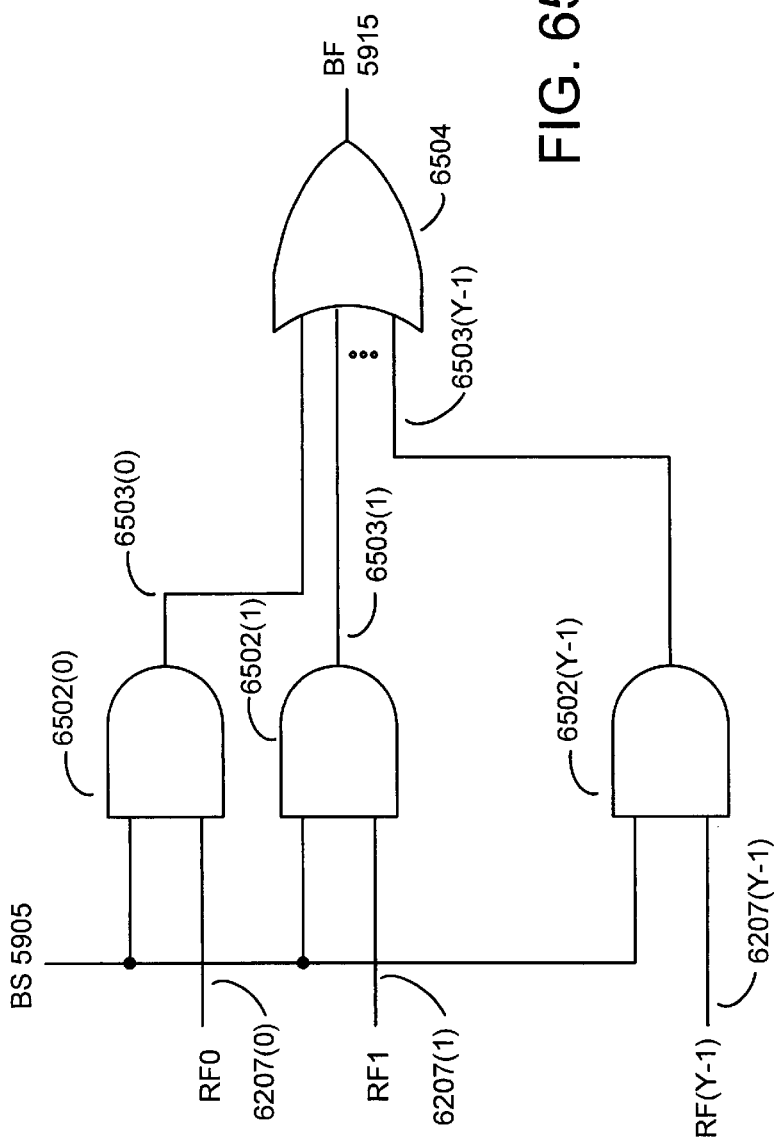
FIG. 65 illustrates an alternate embodiment of a block flag logic in which a block select signal is used to gate assertion of the block flag signal.

FIGS. 64 and 65 illustrate alternative embodiments of block flag logic in which the block select signal 5905 is used to gate assertion of the block flag signal 5915. In the embodiment of FIG. 64, each of the row flag signals 6207(0)-6207(Y−1) is logically ORed in OR gate 6402 to produce signal 6403. Signal 6403 is then logically ANDed with the block select signal 5905 in AND gate 6404 to produce the block flag signal 5915. In the embodiment of FIG. 65, each of the row flag signals 6207(0)-6207(Y−1) is logically ANDed with the block select signal 5905 in a respective AND gate 6502(0)-6502(Y−1) to produce signals 6503(0)-6503(Y−1). Signals 6503(0)-6503(Y−1) are then logically ORed in OR gate 6504 to produce the block flag signal. Regardless of whether the embodiment of FIG. 64 or the embodiment of 65 is used to implement the block flag logic 6204, deassertion of the block select signal 5905 prevents assertion of the block flag signal 5915. Also, in alternative embodiments, no validity values may be stored in the CAM blocks and the logic within the block flag and global flag circuits for generating the not-full signal (i.e., complement of full flag) may be omitted. Note that while the block flag circuit has been described in terms of circuitry that may generate either a not-full signal (full flag complement) or a match flag signal, separate circuitry may be provided to generate the not-full signal and match flag signal in alternative embodiments. Similarly, the global flag circuit may include separate circuits for generating separate device-level match flag and not-full signals.

Figure 66:
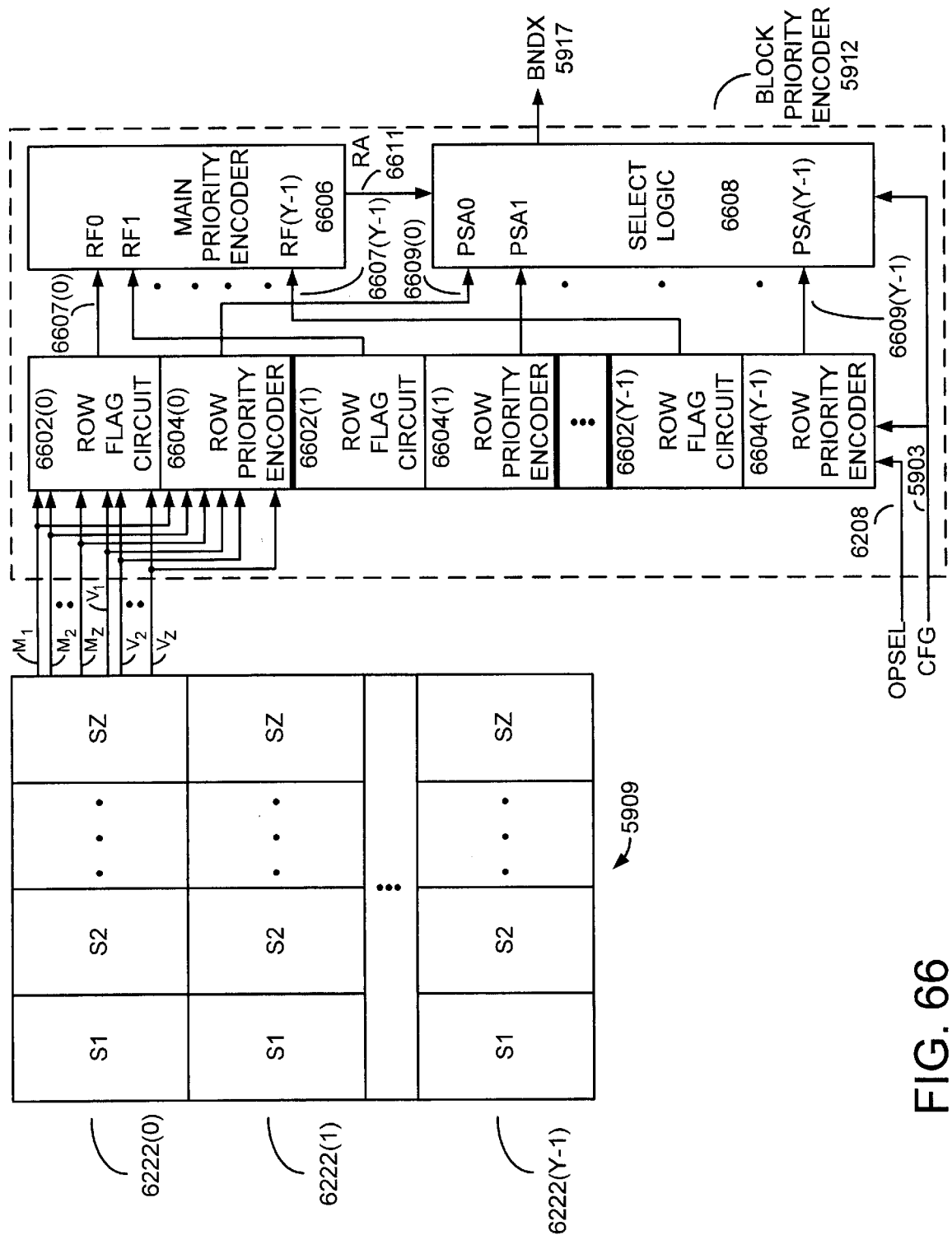
FIG. 66 illustrates a block priority encoder according to one embodiment.

FIG. 66 illustrates a block priority encoder 5912 according to one embodiment. The block priority encoder 5912 includes row flag circuits 6602(0)-6602(Y-1) and row priority encoders 6604(0)-6604(Y-1) that are each coupled to receive match signals $M_1$-$M_Z$ and validity signals $V_1$-$V_Z$ from a respective row 6222(0)-6222(Y-1) of a CAM block 5909. In one embodiment, a multiplexer within each row flag circuit and each row priority encoder is used to select between the match signals and validity signals according to the operation select signal 6208. In an alternative embodiment, a single multiplexer may be used to select between the match signals and validity signals for a given row of the CAM block 5909, with the output of the multiplexer being supplied to both the row flag circuit 6602 and the row priority encoder 6604. The block configuration signal 5903 is supplied to each row flag circuit 6602 and each row priority encoder 6604 for use in generating row flag signals 6607(0)-6607(Y-1) and segment addresses 6609(0)-6609(Y-1), respectively. The row flags signals are input to a main priority encoder 6606 which, in turn, generates a row address 6611. The row address 6611 and segment addresses 6609(0)-6609(Y-1) are input to select logic 6608 which generates the block index signal 5917.

In one embodiment, each of the row flag circuits 6602 (0)-6602(Y-1) is the same circuit described in reference to FIG. 62. That is, the row flag circuit 6202 of FIG. 62 outputs the row flag signal 6207 to the block flag logic (element 6204 of FIG. 62) and also to the main priority encoder 6606. Moreover, the flag signals $F_1$-$F_Z$ output by the multiplexers 6308(0)-6308(Y-1) (or a single multiplexer) within the row flag circuit 6202 may be supplied to the row priority encoder 6604 for the corresponding row so that no separate multiplexer is needed to select the signals input to the row priority encoder 6604.

In one embodiment, each row priority encoder 6604(0)-6604(Y-1) includes circuitry to operate on the input flag signals (i.e., either the match signals or the validity signals according to the state of the operation select signal 6208) to generate the segment address signals PSA0-PSA(Y-1) in the manner described above in reference to FIGS. 46–51. Main priority encoder 6606 preferably operates in the same manner as main priority encoder 4406 described above in reference to FIG. 46. More specifically, main priority encoder 6606 monitors the row flag signals 6607(0)-6607 (Y-1) to generate a row address signal 6611 having $\log_2 Y$ address bits that, in the case of a compare operation, correspond to the address of the highest priority row of the CAM block 5909 having a row segment (or group of row segments) that matches a comparand (e.g., in response to the match signals M1-MZ from each row). In the case of a write operation, the row address signal 6611 corresponds to the address of the highest priority row of the CAM block 5909 that has a row segment (or group of row segments) that is not full (e.g., in response to the validity signals V1-VZ from each row).

In one embodiment, the select logic 6608 is designed to operate in the same manner as the select logic 4408 of FIGS. 46 and 52, described above. That is, in response to the row address 6611 and block configuration signal 5903, the select logic 6608 selects one of the segment addresses 6609(0)-6609(Y-1) associated with the row of CAM cells specified by the row address 6611 to generate the block index signal 5917.

Still referring to FIG. 66, the block priority encoder 5912 is an embodiment that corresponds to the priority encoder logic 4400 of FIGS. 46–53. The block priority encoder 5912 may alternatively be implemented in a manner corresponding to the priority encoder logic 5200 of FIG. 54.

Figure 67:
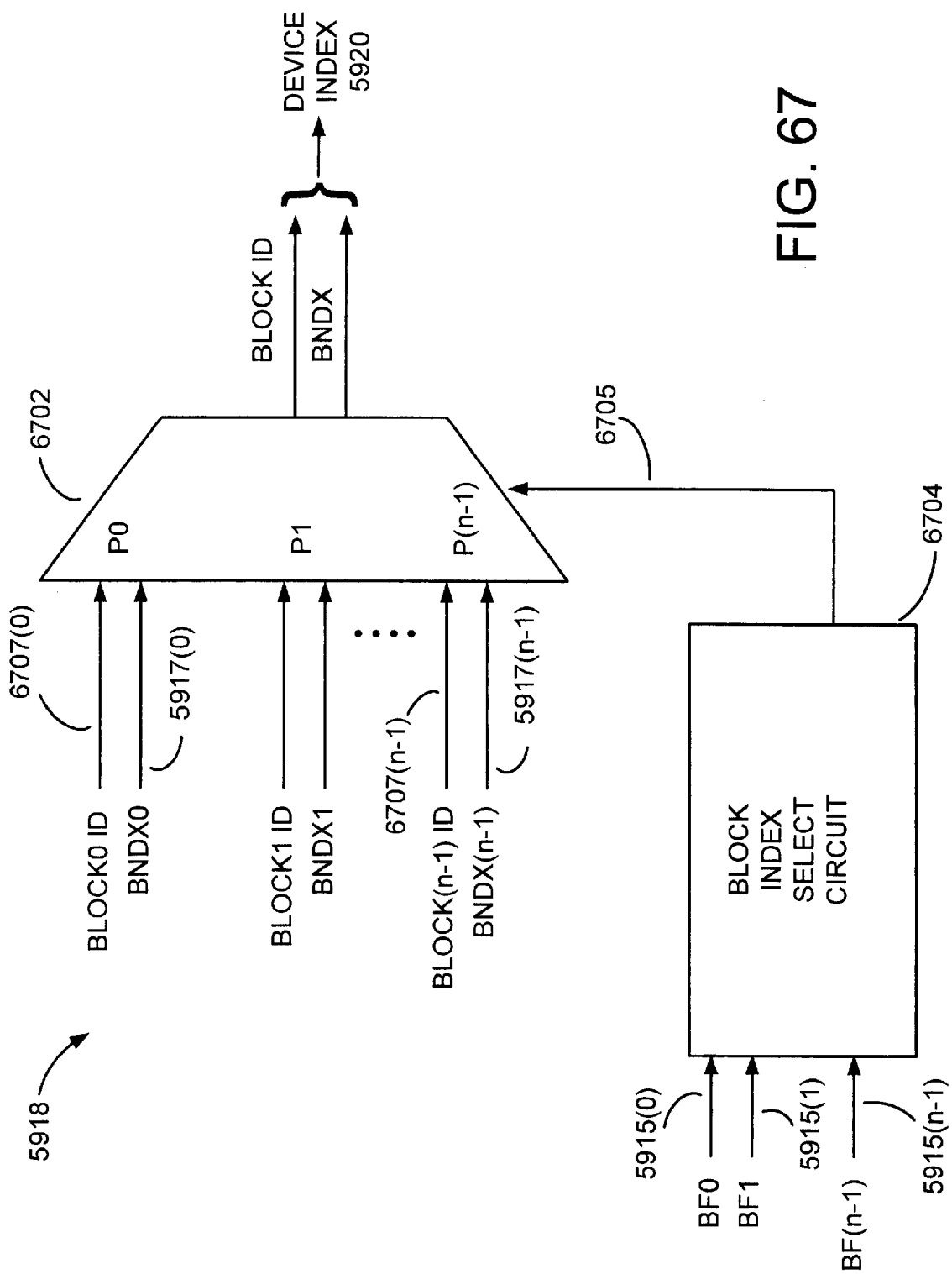
FIG. 67 illustrates an embodiment of the global priority encoder of FIG. 59.

FIG. 67 illustrates an embodiment of the global priority encoder 5918 of FIG. 59. A multiplexer 6702 having ports P0-P(n-1) receives a select signal 6705 from a block index select circuit 6704 that selects one of the block indexes 5917(0)-5917(n-1) and a corresponding block identifier 6707(0)-6707(n-1) to be output as the device index 5920. As discussed above, the block index is alternatively indicative of a match address or a not-full address (also called a free address) according to whether a compare or write operation is being performed. Accordingly, the device index indicates a highest priority match address during a compare operation and indicates a highest priority not-full address (i.e., a "next free address") during a write operation.

In one embodiment, the block identifiers 6707(0)-6707 (n-1) are hardwired to a binary code. For example, for the four block CAM array of FIG. 59, the block identifiers may be hard wired as follows:

BLOCK 0 ID: 00
BLOCK 1 ID: 01
BLOCK 2 ID: 10
BLOCK 3 ID: 11

Other block identifier codes may be used in alternative embodiments, including programmable codes to allow block IDs to be programmed at device power up or as part of factory testing (e.g., fuses may be blown to set block IDs to bypass a defective block).

Still referring to FIG. 67, the block flag signals 5915(0)-5915(n-1) are input to the block index select circuit to generate the select signal 6705. In one embodiment, the block index select circuit includes logic circuitry to identify a highest priority block flag signal from among the asserted block flag signals, and to output a binary code that corresponds to the identified block flag signal. In one implementation, block priorities are hard wired such that the block flag signal corresponding to the lowest numbered block of the CAM array is identified as the highest priority block flag signal. For example, if block flag signals 5915(1) and 5915(n-1) are asserted during a given operation, but no others, then block flag signal 5915(1) would be selected as the highest priority block flag signal and a binary code 01 output as select signal 6705 to select port P1 of the multiplexer 6702 to drive the device index 5920.

In an alternative embodiment of the global priority encoder, the block identifier values may be omitted and the select signal 6705 may instead be used to supply the block identifier portion of the device index 5920.

As discussed above in reference to FIG. 59, each of the block flag circuits 5914 may also include circuitry to generate a block multiple match flag signal. In one embodiment, each of the block flag circuits 5914 includes the array multiple match circuit 3606 of FIG. 38 and the row multiple match circuits 3604(0)-3604(Y-1) of FIG. 38. Each row multiple match circuit preferably includes logic circuits to generate, for a corresponding row of the CAM block, a MMONES signal indicative of matches between a comparand and two or more individual segments of the row, and group match signals MMG(1)-MMG(n-2) indicative of matches between a comparand and two or more groups of segments within the row. Such logic circuits are described, for example, in reference to FIGS. 40–42C. As described in reference to FIG. 44, the MMONES signal and group match signals MMG(1)-MMG(n-2) may be logically ANDed with respective configuration signals SZ1 and SZG(1)-SZG(n-2) to produce a row multiple match signal MMRX. In an embodiment in which the block select signal is used to gate the block configuration signal, the row multiple match configuration logic of FIG. 44 may be used within each of the block flag circuits 5914 of FIG. 59 to generate a row multiple match signal. If the block select signal is not asserted for a given operation, none of the component signals of the block configuration signal will be asserted (i.e., SZ1 and SZG(1)-SZG(n-2) will all be reset) so that no row multiple match signal will be generated.

FIG. 68 shows an alternative implementation of the row multiple match configuration logic (i.e., element 3706 of FIG. 39) that may be used within the block flag circuits 5914 of FIG. 59 in embodiments in which the block select signal 5905 is not used to gate the corresponding block configuration signal 5903. The row multiple match configuration logic of FIG. 68 is similar to the row multiple match configuration logic of FIG. 44 in that AND logic gates 6802 and 6804(1)-6804(n-2) are used, respectively, to determine whether the MMONES signal or one of the group multiple match signals MMG(1)-MMG(n-2) is enabled by a corresponding component of the block configuration signal (i.e., SZ1 and SZG(1)-SZG(n-1)) to assert a signal to an OR logic gate 6806. Instead of driving the row multiple match signal 6809 directly with the output of the OR logic gate 6806, however, the output of OR logic gate 6806 is input to an AND logic gate 6808 where it is gated by the block select signal 5905. Accordingly, when the block select signal 5905 is asserted, the output of the OR logic gate 6806 is used to drive the row multiple match signal 6809. When the block select signal 5905 is deasserted, the AND logic gate 6808 forces the row multiple match signal 6809 to a deasserted state, regardless of the output state of the OR logic gate 6806. In alternative embodiments, the block select signal 5905 may be applied elsewhere in within the row multiple match configuration logic to prevent assertion of the row multiple match signal 6809. For example, the block select signal 5905 may be input to each of the AND logic gates 6802 along with the component signals of the block configuration signal (i.e., SZ1 and SZG(1)-SZG(n-2)).

FIG. 69 illustrates an embodiment of a block multiple match circuit 6900 that may be used within each of the block flag circuits 5914 to generate a block multiple match flag 6909. In one embodiment, the block multiple match circuit 6900 is implemented in the same manner as the array multiple match logic 4300 of FIG. 45. That is, the row flag signals 6207(0)-6207(Y-1) are input to multiple match circuit 6902 which asserts an inter-row multiple match signal 6903 when a match is signaled in more than one row segment (or more than one group of row segments) in different rows of a CAM block. The inter-row multiple match signal 6903 is input to a logic OR circuit 6904 along with the row multiple match signals 6809(0)-6809(Y-1). Accordingly, the block multiple match flag 6909 will be asserted if the inter-row multiple match signal 6903 or any of the row multiple match signals 6809(0)-6809(Y-1) is asserted.

FIG. 70 illustrates an embodiment of a global flag circuit 5916 of FIG. 59. The global flag circuit 5916 includes a global multiple match circuit formed by multiple match circuit 7002 and OR logic gate 7004, as well as a device flag generator formed by OR logic gate 7006. Each of the block flag signals 5915(0)-5915(n-1) is input to the OR logic gate 7006 which, accordingly, asserts the device flag signal 5922 whenever one or more of the block flag signals 5915(0)-5915(n-1) is asserted.

The global multiple match circuit 5916 formed by multiple match circuit 7002 and OR logic gate 7004 operates on the block flag signals 5915(0)-5915(n-1) and the block multiple match flag signals 6909(0)-6909(n-1) in the same manner as the block multiple match circuit 6900 of FIG. 69 operates on the row flag signals and the row multiple match signals. That is, the individual block flag signals 5915(0)-5915(Y-1) are input to multiple match circuit 7002 which asserts an inter-block multiple match signal 7003 when there is a match in more than one block of the CAM array. The inter-block multiple match signal 7003 is input to the logic OR circuit 7004 along with the block multiple match signals 6909(0)-6909(n-1). Accordingly, the device multiple match flag 5924 is asserted if the inter-block multiple match signal 7003 or any of the block multiple match signals 6909(0)-6909(n-1) is asserted.

As discussed above in reference to FIGS. 59, 62 and 63, when the operation select signal 6208 signal is in a first logic state, the flag signals F1-FZ correspond to the match signals M1-MZ from each row 6222 and can be used to signal match and multiple match conditions for a given CAM block and class code. Referring to FIGS. 59, 62, 63 and 68–70, for example, when the match signals indicate that any two or more of the row segments (or groups thereof) match a comparand value, the row multiple match signal 6809 for the row will indicate a multiple match condition. If any two or more of the row flag signals 6207(0)-6207(Y-1) indicate a match condition or if any of the row multiple match signals 6809 indicate a multiple match condition, the corresponding block multiple match circuit 6900 will indicate a block multiple match condition for the CAM block and class code by asserting the block multiple match signal 6909. If a block multiple match condition is indicated for any of the CAM blocks with the same class code or if any two or more of the CAM blocks with the same class code indicate a match condition, then the global multiple match circuit 5916 will indicate a multiple match condition by asserting the device flag signal 5922. By this arrangement multiple match conditions may be signaled on a class-by-class basis according to the incoming class code.

In an alternative embodiment, no device multiple match flag is generated and the circuitry to generate the row, block and device level multiple match signals may be omitted. Also, dedicated multiple match circuitry, separate from the row, block and global flag circuits, may be used in alternative embodiments.

As mentioned above in reference to FIG. 59, the address circuit 5906 may include register banks for maintaining class-based addresses to access the CAM array in response to certain read and write instructions. For example, in one embodiment, the address circuit 5906 maintains a bank of highest-priority-match (HPM) registers to store the device indexes that result from class-based compare operations. For example, if the blocks of the CAM array are partitioned into three classes of storage, A, B and C, then the device index that results from a compare operation in the class A storage (i.e., a class A compare) may be stored in a register of the HPM register bank that corresponds to class A. Similarly, the device index that results from a class B compare may be stored in a register of the HPM register bank that corresponds to class B and a device index that results from a class C compare may be stored in a register of the HPM register bank that corresponds to class C. By this arrangement, read operations which reference the highest priority match addresses on a class basis may be supported. For example, if a host processor performs a sequence of compare operations at classes A, B and C, then desires to read the contents of the highest priority match address for a given class, the host processor may issue a read instruction referencing the HPM register for the class (referred to as a READ@HPM@CLASS instruction). The appropriate HPM register within the HPM register bank will then be selected to provide the address for the read operation.

Still referring to FIG. 59, the address circuit 5906 may also maintain a class-based register bank called a next-free-address (NFA) register bank to store the highest priority free (i.e., not-full) address within the CAM array on a class basis. To further the example of a CAM array partitioned into storage classes A, B and C, if the host processor performs a write operation to class A, the device index will represent the highest priority address within class A that is not already filled with a valid CAM word; that is, the next free address for class A. Accordingly, separate registers within the NFA register bank may be used to store the next free address for classes A, B, C and so forth. Later, when the processor issues an instruction to write a value into the CAM array at the next free address for a given class (i.e., a WRITE@NFA@CLASS instruction), the NFA register for that class within the NFA register bank may be selected to provide the address for the write operation.

Figure 71:
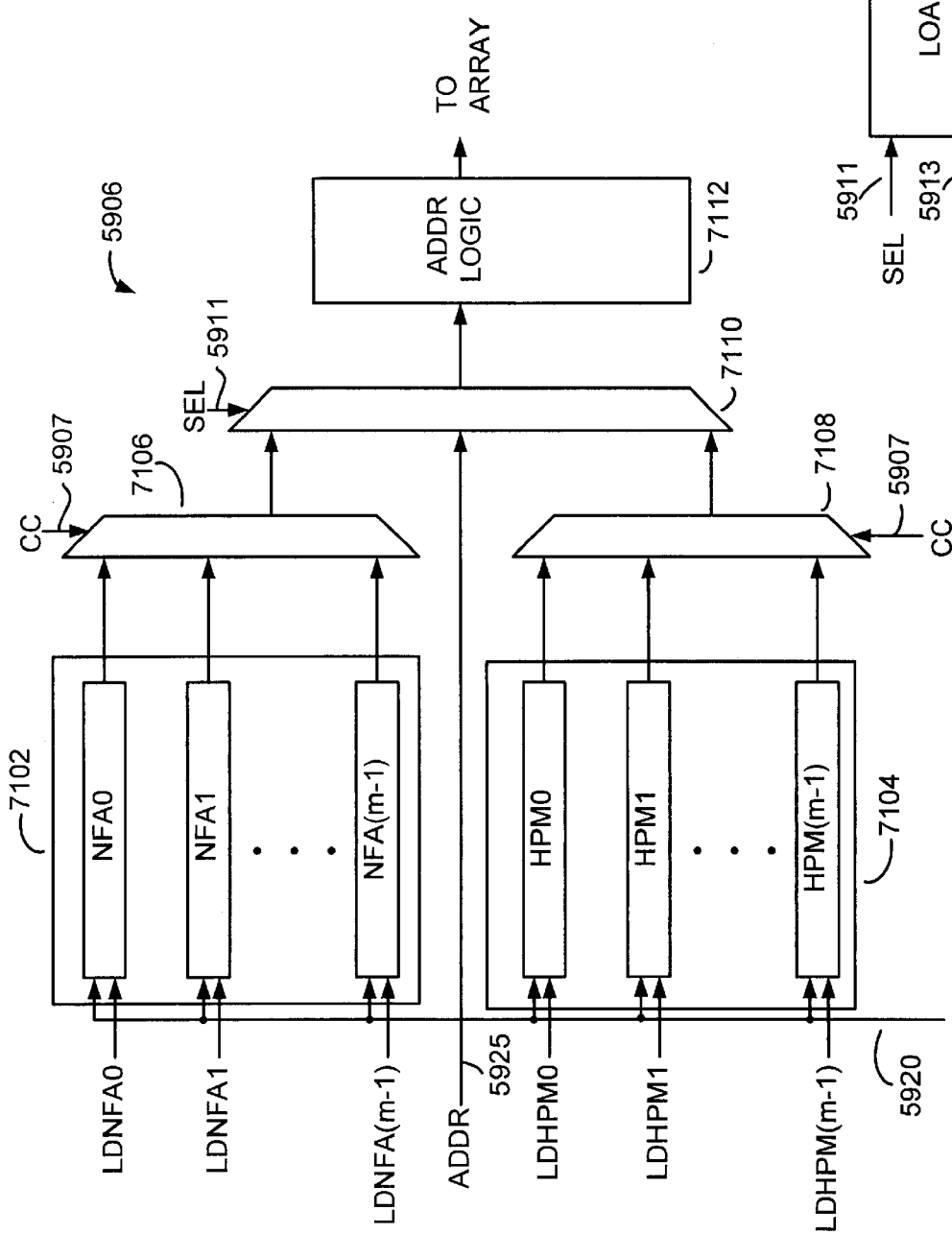
FIG. 71 illustrates the address circuit of FIG. 59 according to one embodiment.

FIG. 71 illustrates the address circuit 5906 of FIG. 59 according to one embodiment. A NFA register bank 7102 contains a plurality of NFA registers, NFA0-NFA(m−1), and a HPM register bank 7104 contains a plurality of HPM registers, MPM0-HPM(m−1). Each NFA register is coupled to the global priority encoder to receive the device index 5920 and also to a load control circuit (not shown) to receive a respective one of register load signals LDNFA0-LDNFA(m−1). Each HPM register is similarly coupled to receive the device index from the global priority encoder and to receive a respective one of the register load signals LDHPM0-LDHPM(m−1). Although not shown in FIG. 71, the load control circuit is preferably implemented within the address circuit 5906 and generates the register load signals LDNFA0-LDNFA(m−1) and LDHPM0-LDHMP(m−1) in response to signals from the instruction decoder and the device flag. The operation of the load control circuit is discussed in greater detail below.

Each of the NFA registers within the NFA register bank 7102 is coupled to a respective input port of a NFA multiplexer 7106. The NFA multiplexer 7106 is responsive to the class code to select the content of one of the NFA registers to be input to an address selector 7110. Similarly, each of the HPM registers within the HPM register bank 7104 is coupled to a respective input port of a HPM multiplexer 7108 which selects, in response to the class code, the content of one of the HPM registers to be input to the address selector 7110. The address bus 5925 is also coupled to an input port of the address selector 7110 to allow selection of host-supplied addresses in certain read and write operations. In alternative embodiments, additional address sources may be input to the address selector 7110.

When an instruction is received indicating write access to a next free location of a class, the class code portion of the instruction 5907, if any, is used to select one of the NFA registers and one of the HPM registers to supply a next free address and a highest priority match address, respectively, to the address selector 7110. The select signal 5911 indicates the nature of the operation to be performed and, in the case of a read or write access to the CAM array, is used within the address selector 7110 to select the appropriate address source. For example, in the case of a WRITE@NFA@CLASS instruction, the class code 5907 selects the content of one of the NFA registers within the NFA register bank 7102 to be input to the address selector 7110 and the select signal 5911 selects the NFA register to supply the next free address for the selected class to the address logic 7112. The address logic 7112 decodes the input address to activate a corresponding word line within a block of the CAM array. Similarly, in the case of a READ@HPM@CLASS instruction, the class code 5907 selects the content of one of the HPM registers within the HPM register bank 7104 to be input to the address selector 7110, and the select signal 5911 selects the HPM register to supply the highest priority match address for the selected class to the address logic 7112.

Figure 72:
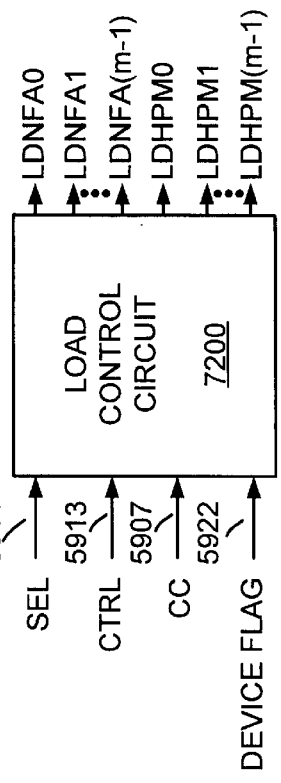
FIG. 72 illustrates a load control circuit that may be provided within the address circuit of FIG. 71.

FIG. 72 illustrates a load control circuit 7200 that may be provided within the address circuit 5906 to generate the HPM register load signals LDHPM0-LDHPM(m−1) and NFA register load signals LDNFA0-LDNFA(m−1). In the embodiment of FIG. 72, the load control circuit 7200 receives the select signal 5911, control signal 5913 and class code 5907 from the instruction decoder, and the device flag 5922 from the global flag circuit. As mentioned above, in alternative embodiments any or all of the select signal 5911, control signal 5913, and class code 5907 may be received directly from the instruction bus instead of from the instruction decoder. In one embodiment, the select signal 5911 contains a separate component signals, SEL_NFA and SEL_HPM, to select a register within either the NFA register bank or the HPM register bank, respectively, to be loaded with a new address. Also, in an exemplary embodiment, the CAM device has four CAM blocks each assigned to one of three different classes according to their intra-row configuration. For example, a CAM block is assigned to a first, second or third class according to whether it is configured to have a 72-bit wide, 144-bit wide or 288-bit wide CAM word, respectively. These class assignments may be specified by component signals SZ72, SZ144 and SZ288 of the block configuration signal stored for each CAM block. In such an embodiment, the load control circuit 7200 may generate NFA and HPM register load signals according to the following table:

| SEL | CC | CTRL | DEVICE FLAG | Assert Load Signal: |
|---|---|---|---|---|
| X | X | X | 0 | NONE |
| X | X | 0 | X | NONE |
| SEL_NFA | SZ72 | 1 | 1 | LDNFA0 |
| SEL_NFA | SZ144 | 1 | 1 | LDNFA1 |
| SEL_NFA | SZ288 | 1 | 1 | LDNFA2 |
| SEL_HPM | SZ72 | 1 | 1 | LDHPM0 |
| SEL_HPM | SZ144 | 1 | 1 | LDHPM1 |
| SEL_HPM | SZ288 | 1 | 1 | LDHPM2 |

As shown, when the control signal is deasserted, no register load signal is asserted. Thus, when an incoming instruction specifies an operation (e.g., a read operation) that does not produce a device index, the instruction decoder may deassert the control signal to prevent the HPM and NFA register banks from being loaded. Also, no register load signal is asserted when the device flag signal is deasserted. Recalling that the device flag signal is asserted when a match is detected during a compare operation or when a storage partition includes at least one unfilled storage location after a write operation, a non-asserted device flag conversely indicates that no match was found in the compare operation or that the storage partition is full after the write operation. In either event, the device index does not represent a valid address within the CAM array (i.e., neither a match address nor a not-full address) when the device flag is deasserted. Accordingly, no register load signal is asserted when the device flag is not asserted.

In alternative embodiments, a register load operation to register bank 7102 or 7104 may be performed regardless of the state of the device flag. Also, the number of registers within each of the register banks 7102 and 7104 of FIG. 72 is shown to be 'm,' where m is an integer number representative of the maximum number of storage classes. In one embodiment, each storage class corresponds to a width/depth configuration of a CAM block so that the number of storage classes is determined by the number of permitted width/depth configurations. In an alternative embodiments, storage classes may be defined by other criteria including, without limitation, the type of data stored within the corresponding storage partition (e.g., ATM, IPv4, IPv4 multicast, Ethernet, URL, MPLS, etc.); the type or purpose of the operation to be performed on the data stored within the corresponding storage partition (e.g., one class of storage partition may store data to be used in compare operations to determine forwarding addresses, while another class of storage partition may store data to be used in compare operations for classification purposes), or by any combination of data type, storage configuration, or operation type/purpose. More generally, any criterion for distinguishing between storage partitions may be used without departing from the spirit or scope of the present invention.

Figure 73:
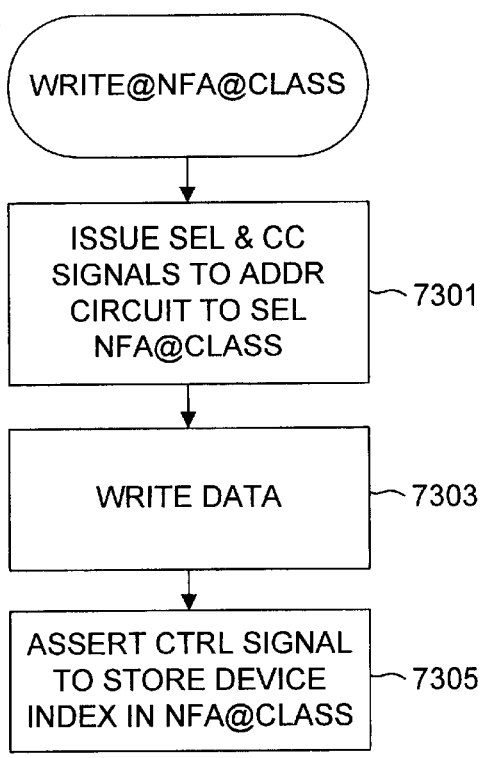
FIG. 73 illustrates an exemplary operation of the instruction decoder of FIG. 59 in response to an instruction to write to the next free address of a class-based partition of the CAM array.

FIG. 73 illustrates an exemplary operation of the instruction decoder 5904 of FIG. 59 in response to an instruction to write to the next free address of a class-based partition of the CAM array (i.e., a WRITE@NFA@CLASS instruction). In block 7301, the instruction decoder issues the appropriate select and class code signals to the address circuit (e.g., element 5906 of FIG. 59) to select the NFA register for the specified class code to source the address for a write access to the CAM array. A first predetermined time later, in block 7303, the instruction decoder signals a write circuit within the CAM device (not shown in FIG. 59) to write data into the CAM array location selected by the address circuit. After a second predetermined time, the instruction decoder asserts the control signal (the class code remaining asserted and select signals remaining asserted) to enable the device index to be stored in the NFA register specified by the class code. As discussed in reference to FIG. 72, if the device flag indicates that the device index represents a valid not-full address, the device index is stored in the NFA register.

Figure 74:
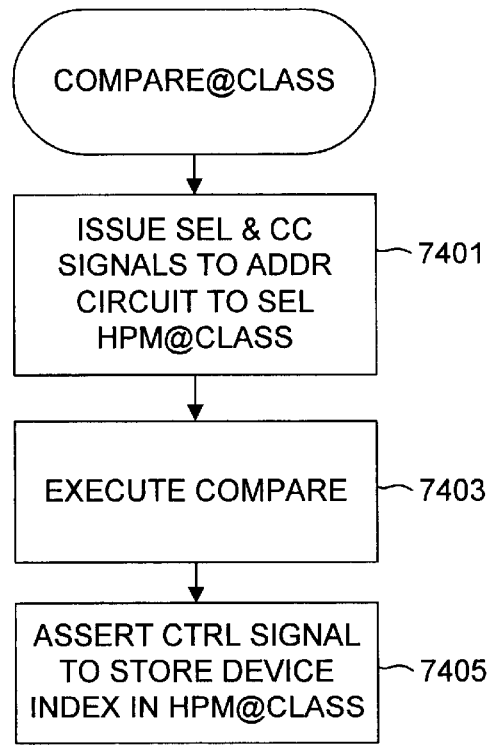
FIG. 74 illustrates an exemplary operation of the instruction decoder of FIG. 59 in response to an instruction to compare a comparand with the contents of a class-based partition of the CAM array.

FIG. 74 illustrates an exemplary operation of the instruction decoder 5904 of FIG. 59 in response to an instruction to compare a comparand with the contents of a class-based partition of the CAM array (i.e., a COMPARE@CLASS instruction). In block 7401, the instruction decoder initiates execution of the compare operation. At block 7403, the instruction decoder issues the select and class code signals to the address circuit (e.g., element 5906 of FIG. 59) to select the HPM register for the specified class in preparation for a load operation. Note that the select and class code signals may be issued to the address circuit in parallel with execution of the compare operation in block 7401 or at a later time. In either case, a predetermined time after initiation of the compare operation, the instruction decoder asserts the control signal to enable the device index to be stored in the HPM register specified by the class code. As discussed in reference to FIG. 72, if the device flag indicates that the device index represents a valid match address, the device index is stored in the HPM register.

Figure 75:
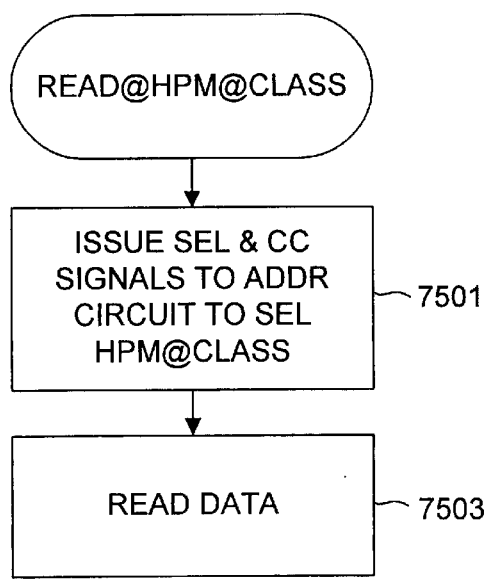
FIG. 75 illustrates an exemplary operation of the instruction decoder of FIG. 59 in response to an instruction to read a CAM word from the highest priority match address of a class-based partition of the CAM array.

FIG. 75 illustrates an exemplary operation of the instruction decoder 5904 of FIG. 59 in response to an instruction to read a CAM word from the highest priority match address of a class-based partition of the CAM array (i.e., a READ@HPM@CLASS instruction). In block 7501, the instruction decoder issues the appropriate select and class code signals to the address circuit (e.g., element 5906 of FIG. 59) to select the HPM register for the specified class code to source the address for a read access to the CAM array. A first predetermined time later, in block 7503, the instruction decoder signals a read circuit within the CAM device (not shown in FIG. 59) to sense data output from the CAM array location selected by the address circuit.

Figure 76:
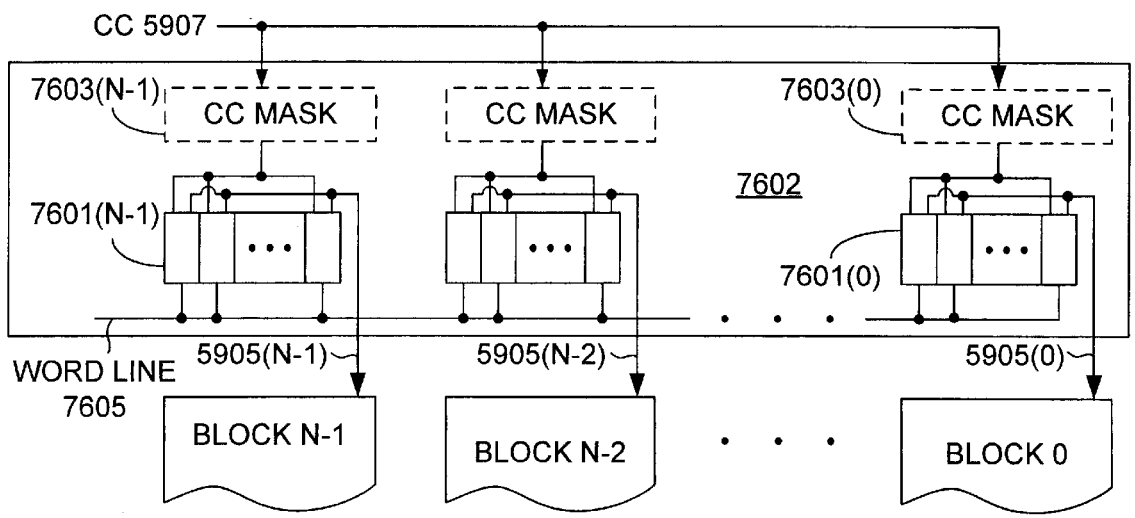
FIG. 76 illustrates an alternative block select circuit which may be used in the CAM device of FIG. 59.

FIG. 76 depicts an alternative block select circuit 7602 which may be used in the CAM device of FIG. 59. The block select circuit includes a plurality of sets of CAM cells 7601(0)-7601(N−1) that are used to store block class values and to compare the block class values with an incoming class code 5907. In one embodiment, each set of CAM cells 7601(0)-7601(N−1) is coupled to a word line 7605 and also to respective sets of bit lines (not shown). Accordingly, when the word line 7605 is asserted, respective block class values are stored in the sets of CAM cells. In an alternative embodiment, each set of CAM cells 7601(0)-7601(N) may be coupled to a respective, dedicated word line and therefore may be individually addressed to store a block class value for the corresponding CAM block.

Still referring to FIG. 76, each set of CAM cells 7601(0)-7601(N−1) is coupled to a respective match line which is used to provide the block select signal 5905(N−1)-5905(0) to the corresponding CAM block. Thus, when an incoming class code 5907 is determined to match the contents of a given set of CAM cells 7601(0)-7601(N−1), a block select signal 5905(0)-5905(N−1) will be asserted on the corresponding match line. By this arrangement, the store and compare function of the CAM cells fulfills the functions of the block configuration registers 6002 and the comparator circuits 6006 of the block select circuit depicted in FIG. 60.

Figure 77:
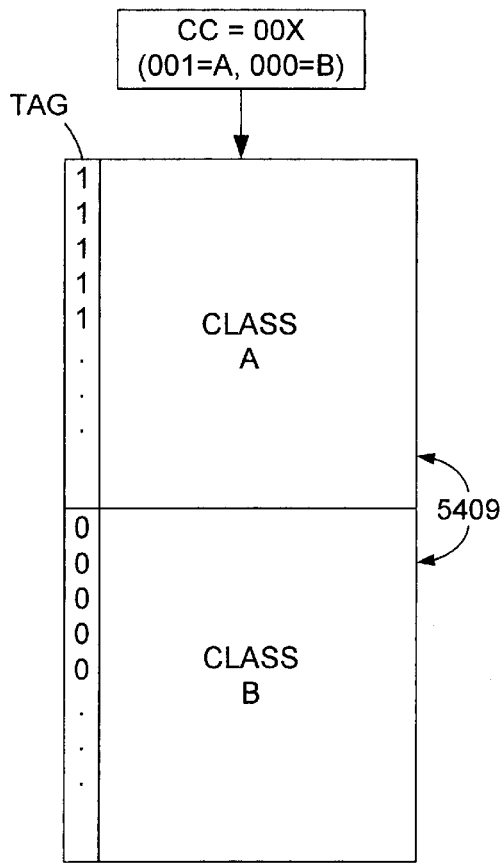
FIG. 77 depicts a CAM block with two classes of data stored therein.

In one embodiment each CAM cell in the sets of CAM cells 7601(0)-7601(N−1) is a ternary CAM cell capable of storing either a logical '1,' a logical '0,' or a mask state (i.e., don't care state). Accordingly, by setting a selected bit (or bits) of a block class value to the masked state, the block class value may be determined to match more than one class code. Referring to FIG. 77, for example, if two classes of data, class A and class B, are stored in a CAM block 5409, then the bit (or bits) used to distinguish between the two class codes may be masked so that the block 5409 is selected to participate in a compare operation directed to either class. In the example shown, the class code for class A is '001' and the class code for class B is '000.' Accordingly, by setting the least significant bit in the set of CAM cells 7601 that corresponds to block 5409 to the mask state, the stored block class value will be determined to match both the class A and class B class codes. One or more tag bits may be set within each CAM word stored in the block 5409 to designate the CAM word as belonging to either the class A or class B storage partition (note that while the class A and class B storage areas are depicted as distinct in FIG. 77, the CAM words within each storage class may be interspersed with one another). For example, if the most significant bit of each CAM word is used as a tag bit and set to '1' for class A and set to '0' for class B, then the corresponding most significant bit of an incoming comparand value will effectively select the storage class to be searched. That is, if the most significant bit of the incoming comparand is a '1,' then none of the class B entries will match the comparand, effectively excluding class B from the search. Conversely, if the most significant bit of the incoming comparand is a '0,' then none of the class A entries will match the comparand, effectively excluding class A from the search. Although shown in the leftmost bit position in FIG. 77, the tag bit(s) may be located in any bit position within a row or row segment.

Note that, instead of (or in addition to) using ternary CAM cells within the block select circuit 7602, a set of class code mask values 7603(N-1)-7603(0) may be applied to allow each (or any one) of the stored block class value to match multiple class codes. The class code mask values may be provided together with the class code 5907 or in a separate transmission. Also, instead of multiple class code mask values 7603(N-1)-7603(0), a single class code mask value may alternatively be applied to mask the class code 5907 before the class code is compared with the block class code values stored in the sets of CAM cells 7601(N-1)-7601(0).

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
   a plurality of CAM blocks each having an array of CAM cells to store data words having a width determined according to a configuration value; and
   a block select circuit having an input to receive a class code and a circuit to output a plurality of select signals to the plurality of CAM blocks, each select signal to selectively disable a respective one of the plurality of CAM blocks from participating in a compare operation according to the class code.

2. The CAM device of claim 1 wherein the circuit to output a plurality of select signals to the plurality of CAM blocks includes a plurality of compare circuits, each compare circuit being adapted to compare the class code to a respective stored code that corresponds to one of the plurality of CAM blocks and to output a respective one of the plurality of select signals in either a first state or a second state according to whether the class code matches the stored code.

3. The CAM device of claim 2 wherein each of the plurality of CAM blocks for which the corresponding select signal is in a first state is disabled from participating in the compare operation.

4. The CAM device of claim 2 wherein the stored code is indicative of the configuration value.

5. The CAM device of claim 2 wherein each respective stored code is indicative of a class of data.

6. The CAM device of claim 2 wherein the stored code is stored in a memory within the block select circuit.

7. The CAM device of claim 6 wherein the memory is a block configuration register.

8. The CAM device of claim 2 further comprising a device configuration register to store the stored code.

9. The CAM device of claim 1 wherein the plurality of CAM blocks comprise binary CAM cells.

10. The CAM device of claim 1 wherein the plurality of CAM blocks comprise ternary CAM cells.

11. The CAM device of claim 1 further comprising a plurality of block match circuits, each block match circuit being coupled to a respective CAM block of the plurality of CAM blocks via a plurality of match signal lines and being adapted to generate a block match signal if the CAM block is not disabled from participating in the compare operation and if a match signal is asserted on at least one of the match signal lines during the compare operation.

12. The CAM device of claim 1 further comprising a plurality of block multiple match circuits, each block multiple match circuit being coupled to a respective CAM block of the plurality of CAM blocks via a plurality of match signal lines and being adapted to generate a block match signal if the CAM block is not disabled from participating in the compare operation and if a match signal is asserted on at least two of the match signal lines during the compare operation.

13. The CAM device of claim 1 wherein the block select circuit is adapted to selectively disable the one of the plurality of CAM blocks from participating in the compare operation by preventing a comparand value from being input to the one of the plurality of CAM blocks.

14. The CAM device of claim 13 wherein the block select circuit includes a circuit to prevent the comparand value from being input to the one of the plurality of CAM blocks by setting a plurality of bits within the comparand value to a reset state.

15. The CAM device of claim 1 further comprising a plurality of block flag circuits, each block flag circuit being coupled to a corresponding one of the plurality of CAM blocks and being adapted to assert a match flag signal if any of a plurality of data words stored within the corresponding CAM block matches a comparand value, and wherein the block select circuit is adapted to selectively disable the one of the plurality of CAM blocks from participating in the compare operation by preventing the corresponding block flag circuit from asserting the match flag signal.

16. The CAM device of claim 1 wherein the circuit to output a plurality of select signals to the plurality of CAM blocks comprises a plurality of sets of CAM cells, each set of CAM cells including memory elements to store a class value that corresponds to one of the plurality of CAM blocks and compare circuitry to compare the stored class value to the class code and to output a respective one of the plurality of select signals in either a first state or a second state according to whether the class code matches the stored class value.

17. The CAM device of claim 16 wherein each CAM cell in the plurality of sets of CAM cells is a ternary CAM cell capable of storing a mask state to enable the stored class value to match more than one class code.

18. The CAM device of claim 1 further comprising a priority encoder circuit to generate an index indicative of a storage location within one of the plurality of CAM blocks not disabled from participating in the compare operation.

19. A method of operation within a content addressable memory (CAM) device, the method comprising:
   receiving a class code;
   comparing the class code to each of a plurality of block configuration values, each block configuration value indicating a width and depth configuration of a corresponding one of a plurality of storage blocks within the CAM device; and
   disabling each of the plurality of storage blocks for which the corresponding configuration value does not match the class code from participating in a compare operation.

20. The method of claim 19 further comprising storing the plurality of block configuration values within the CAM device.

21. The method of claim 20 further comprising storing the plurality of block configuration values within a configuration register of the CAM device.

22. The method of claim 20 further comprising storing the same block configuration value within the CAM device for more than one of the plurality of storage blocks.

23. The method of claim 19 wherein disabling each of the plurality of storage blocks for which the corresponding configuration value does not match the class code from participating in a compare operation comprises generating a plurality of select signals, each select signal being coupled to a respective one of the plurality of storage blocks, and each select signal being set to a first state to disable the respective one of the plurality of storage blocks from participating in the compare operation if the corresponding configuration value does not match the class code.

24. A method of controlling a content addressable memory (CAM) device, the method comprising:
   assigning respective classification values to a plurality of storage blocks within the CAM device; and
   outputting a compare instruction to the CAM device, the compare instruction including a class code to be compared with the classification values to select a subset of the plurality of storage blocks to participate in a compare operation.

25. The method of claim 24 wherein assigning respective classification values to the plurality of storage blocks comprises outputting an instruction to the CAM device to store the classification values within at least one storage register within the CAM device.

26. The method of claim 24 wherein assigning respective classification values to the plurality of storage blocks comprises storing, for each of the storage blocks, a value indicative of the size of a data word to be stored in the storage block.

27. The method of claim 24 wherein assigning respective classification values to the plurality of storage blocks comprises storing, for each of the storage blocks, a value indicative of a width and depth configuration of the storage block.

28. The method of claim 27 wherein the class code included with the compare instruction specifies a particular width and depth configuration.

29. The method of claim 24 wherein the class code is included within an operation code of the compare instruction.

30. The method of claim 24 wherein the class code forms at least a portion of an operand associated with the compare instruction.

31. A method of controlling a content addressable memory (CAM) device, the method comprising:
   assigning respective classification values to a plurality of storage blocks within the CAM device;
   outputting a class code to the CAM device; and
   outputting a compare instruction to the CAM device, the compare instruction indicating that a comparand is to be compared with data words stored within each of the plurality of storage blocks for which the assigned classification value matches the class code.

32. The method of claim 31 wherein assigning respective classification values to the plurality of storage blocks comprises storing, for each of the storage blocks, a value indicative of a width and depth configuration of the storage block.

33. The method of claim 32 wherein outputting a class code comprises outputting a class code that specifies a particular width and depth configuration.

34. A content addressable memory (CAM) device comprising:
   a plurality of CAM blocks each having an array of CAM cells; and
   an address circuit coupled to the plurality of CAM blocks and including a plurality of storage elements to store respective addresses, each of the plurality of storage elements corresponding to a respective one of a plurality of class-based storage partitions within the CAM device, each class-based storage partition including at least one of the plurality of CAM blocks, the address circuit including selection circuitry to select, according to a class code value, one of the plurality of storage elements to supply an address to access the corresponding class-based storage partition.

35. The CAM device of claim 34 wherein the CAM device includes a circuit to store a plurality of configuration values, each configuration value corresponding to a respective CAM block of the plurality of CAM blocks and indicating one of the class-based storage partitions that includes the CAM block.

36. The CAM device of claim 35 wherein each configuration value is indicative of a width and depth configuration of the corresponding CAM block, and wherein each set of one or more CAM blocks that have the same width and depth configuration form a respective one of the class-based storage partitions.

37. The CAM device of claim 34 wherein each of the plurality of storage elements is adapted to indicate a storage location within the corresponding class-based storage partition that contains a data word which, at least in part, matched a comparand in a compare operation.

38. The CAM device of claim 34 further comprising:
   a select circuit to select, according to a class code, one of the class-based storage partitions to participate in a compare operation;
   a priority encoder to generate an index indicative of a storage location within the selected one of the class-based storage partitions that contains a data word which is determined, in the compare operation, to match a comparand; and
   a load control circuit to load the index into one storage element of the plurality of storage elements that corresponds to the selected one of the class-based storage partitions.

39. The CAM device of claim 38 further comprising a flag circuit to assert a flag signal if the comparand is determined to match a data word stored within the selected one of the class-based storage partitions, the load control circuit being adapted to load the index into the one storage element if the flag signal is asserted by the flag circuit.

40. The CAM device of claim 34 wherein each of the plurality of storage elements is adapted to store an address of a storage location within the corresponding class-based storage partition that is available to be loaded with a data word in a write access to the class-based storage partition.

41. The CAM device of claim 40 further comprising an instruction decoder to select one of the plurality of storage elements within the address circuit to output the address stored therein to access the corresponding class-based storage partition in a write operation.

42. The CAM device of claim 41 wherein the instruction decoder is adapted to select the one of the plurality of storage elements within the address circuit according to a class code received from a host device.

43. The CAM device of claim 41 further comprising:
   a priority encoder to generate an index indicative of a storage location within the class-based storage partition that is determined not contain a valid data word; and a load control circuit to load the index into the selected one of the plurality of storage elements.

44. The CAM device of claim 43 further comprising a flag circuit to assert a flag signal if a storage location within the class-based storage partition is determined not to contain a valid data word, the load control circuit being adapted to load the index into the selected one of the plurality of storage elements if the flag signal is asserted by the flag circuit.

45. A method of operation within a content addressable memory (CAM) device, the method comprising:
  receiving an instruction to store a data word in the CAM device, the instruction including a class code that identifies one of a plurality of storage partitions within the CAM device;
  selecting, according to the class code, one of a plurality of address storage elements to output an address; and
  storing the data word within the CAM device at the address output by the one of the plurality of address storage elements.

46. The method of claim 45 wherein receiving the instruction to store a data word comprises receiving an operation code that includes the class code.

47. The method of claim 45 wherein receiving the instruction to store a data word comprises receiving an operand that includes the class code.

48. The method of claim 45 wherein storing the data word within the CAM device at the address output by the one of the plurality of address storage elements comprises storing the data word within the one of the plurality of storage partitions.

49. The method of claim 48 further comprising:
  identifying a storage location within the one of the plurality of storage partitions that does not contain a valid data value; and
  loading an address of the storage location into the one of the plurality of address storage elements.

50. The method of claim 45 further comprising loading a new address into the one of the plurality of address storage elements.

51. The method of claim 50 wherein loading a new address into the one of the plurality of address storage elements comprises loading the one of the plurality of address storage elements with a next free address indicative of a storage location within the one of the plurality of storage partitions.

52. A method of operation within a content addressable memory (CAM) device, the method comprising:
  receiving an instruction to perform a comparison operation within the CAM device, the instruction including a class code that identifies one of a plurality of storage partitions within the CAM device;
  performing the comparison operation, including generating an address of a storage location within the one of the plurality of storage partitions that contains a data word that matches a comparand;
  selecting one of a plurality of match address storage elements according to the class code; and
  loading the address into the one of a plurality of match address storage elements.

53. The method of claim 52 wherein receiving the instruction to perform a comparison operation comprises receiving an operation code that includes the class code.

54. The method of claim 52 wherein receiving the instruction to perform a comparison operation comprises receiving an operand that includes the class code.

55. The method of claim 52 wherein receiving an instruction to perform a comparison operation comprises receiving an operation code at a first time and receiving the class code at a second time, the operation code indicating a comparison operation.

56. The method of claim 52 wherein generating an address of a storage location comprises generating a highest priority match address.

57. The method of claim 52 further comprising:
  receiving an instruction to read a data word stored within the CAM device, the instruction including a class code that identifies the one of a plurality of storage partitions; and
  selecting, according to the class code, the one of a plurality of match address storage elements to output an address;
  reading the data word from a storage location within the one of the plurality of storage partitions at the address output by the one of the plurality of match address storage elements.

58. A method of operation within a CAM device, the method comprising:
  receiving an instruction to read a data word stored within the CAM device, the instruction including a class code that uniquely identifies one of a plurality of storage partitions;
  selecting, according to the class code, one of a plurality of address storage elements to output an address; and
  reading the data word from a storage location within the one of the plurality of storage partitions at the address output by the one of the plurality of address storage elements.

59. The method of claim 58 wherein receiving the instruction to read a data word comprises receiving an operation code that includes the class code.

60. The method of claim 58 wherein receiving the instruction to read a data word comprises receiving an operand that includes the class code.

61. The method of claim 58 wherein receiving an instruction to read a data word comprises receiving an operation code at a first time and receiving the class code at a second time, the operation code indicating a data read operation.

62. A method of operation within a CAM device, the method comprising:
  selecting a first storage partition within the CAM device according to a first class code; and
  identifying a free storage location within the first storage partition.

63. The method of claim 62 further comprising:
  selecting a second storage partition within the CAM device according to a second class code; and
  identifying a free storage location within the second storage partition.

64. The method of claim 63 wherein identifying a free storage location within the first storage partition comprises identifying the free storage location according to a plurality of validity signals, each validity signal indicating whether a corresponding storage location within the first storage partition has a valid data value stored therein.

65. The method of claim 62 further comprising generating an index indicative of an address of the free storage location.

66. The method of claim 62 wherein identifying a free storage location comprises identifying the free storage location within the first storage partition if the first storage partition is not full, the method further comprising asserting a full flag signal to indicate that the first storage partition is full if the first storage partition is full.

67. A method of operation within a CAM device, the method comprising:
  selecting a first storage partition within the CAM device according to a class code; and
  identifying, within the first storage partition, a storage location having a data value stored therein that, at least in part, matches a first comparand value.

68. The method of claim 67 further comprising:
  selecting a second storage partition within the CAM device according to a second class code; and
  identifying, within the second storage partition, a second storage location having a data value stored therein that, at least in part, matches a second comparand value.

69. The method of claim 67 wherein identifying the first storage location comprises identifying the first storage location according to a plurality of match signals, each match signal indicating whether a corresponding storage location within the first storage partition contains a data value that, at least in part, matches the first comparand value.

70. The method of claim 67 further comprising generating an index indicative of an address of the first storage location.

71. The method of claim 67 wherein identifying a first storage location within the first storage partition comprises asserting a match flag signal to indicate that a storage location containing a data value that, at least in part, matches the first comparand value has been identified within the first storage partition.

72. The method of claim 67 further comprising:
  identifying, within the first storage partition, a second storage location having a data value stored therein that, at least in part, matches the first comparand value; and
  asserting a multiple match flag signal to indicate that more than one storage location containing a data value that, at least in part, matches the first comparand value has been identified within the first storage partition.

73. A content addressable memory (CAM) device comprising:
  a first CAM block configurable into a first width and depth configuration; and
  a second CAM block configurable into a second width and depth configuration.

74. The CAM device of claim 73 further comprising a block select circuit having an input to receive a class code and circuitry to output first and second select signals, each of the first and second select signals to selectively disable the first and second CAM blocks from participating in a compare operation according to the width and depth configurations of the first and second CAM blocks.

75. The CAM device of claim 74 wherein each of the first and second select signals is adapted to disable the one of the first and second CAM blocks from participating in the compare operation by preventing a comparand value from being input to the one of the first and second CAM blocks if the class code does not match a stored configuration value.

76. The CAM device of claim 74 wherein each of the first and second select signals is adapted to disable the one of the first and second CAM blocks from participating in the compare operation by preventing assertion of a match signal that corresponds to the one of the first and second CAM blocks if the class code does not match a stored configuration value.

77. The CAM device of claim 73 wherein the plurality of CAM blocks comprise ternary CAM cells.

78. A content addressable memory (CAM) device comprising:
  a plurality of storage means for storing data words, each storage means having a storage width determined according to a configuration value; and
  select means for enabling, according to a class code, selected ones of the plurality of the storage means to participate in a compare operation.

79. The CAM device of claim 78 wherein the select means comprises:
  compare means for comparing the class code to a plurality of stored class values that correspond, respectively, to the plurality of storage means; and
  enable means for enabling each storage means for which the corresponding stored class value matches the class code to participate in the compare operation.

80. The CAM device of claim 79 wherein the enable means comprises comparand disable means for setting a comparand value to a predetermined state to prevent a storage means for which the corresponding stored class value does not match the class code from participating in the compare operation.

81. The CAM device of claim 79 wherein the enable means comprises match disable means to prevent assertion of a match signal that corresponds to a storage means for which the corresponding stored class value does not match the class code.

82. The CAM device of claim 78 wherein each of the plurality of storage means comprises a plurality of ternary CAM cells.

* * * * *